(12) United States Patent
Kijima et al.

(10) Patent No.: US 7,485,182 B2
(45) Date of Patent: Feb. 3, 2009

(54) PRECURSOR COMPOSITION, METHOD FOR MANUFACTURING PRECURSOR COMPOSITION, METHOD FOR MANUFACTURING FERROELECTRIC FILM, PIEZOELECTRIC ELEMENT, SEMICONDUCTOR DEVICE, PIEZOELECTRIC ACTUATOR, INK JET RECORDING HEAD, AND INK JET PRINTER

(75) Inventors: Takeshi Kijima, Matsumoto (JP); Yasuaki Hamada, Suwa (JP); Mayumi Ueno, Chino (JP)

(73) Assignee: Seiko Epson Corporation, Tokyo (JP)

( * ) Notice: Subject to any disclaimer, the term of this patent is extended or adjusted under 35 U.S.C. 154(b) by 684 days.

(21) Appl. No.: 11/129,475

(22) Filed: May 16, 2005

(65) Prior Publication Data

US 2005/0271823 A1 Dec. 8, 2005

(30) Foreign Application Priority Data

| May 31, 2004 | (JP) | ............................. 2004-162100 |
| Jul. 20, 2004 | (JP) | ............................. 2004-211115 |
| Nov. 2, 2004 | (JP) | ............................. 2004-319213 |
| Dec. 28, 2004 | (JP) | ............................. 2004-380987 |

(51) Int. Cl.
*C23C 18/00* (2006.01)
(52) U.S. Cl. .............................. 106/287.19; 106/287.16
(58) Field of Classification Search ............ 106/287.16, 106/287.19
See application file for complete search history.

(56) References Cited

U.S. PATENT DOCUMENTS

| 5,894,064 A | 4/1999 | Hampden-Smith et al. |
| 5,908,802 A | 6/1999 | Voigt et al. |

| 2004/0214352 A1 | 10/2004 | Kijima et al. |
| 2006/0283354 A1* | 12/2006 | Shinoda et al. ........ 106/287.18 |

FOREIGN PATENT DOCUMENTS

| JP | A-07-069645 | 3/1995 |
| JP | A 07-267731 | 10/1995 |
| WO | WO 90/12755 | 11/1990 |
| WO | WO 2004/038733 A1 | 5/2004 |

OTHER PUBLICATIONS

Hiromu Miyazawa et al.; "Electronic States of Perovskite-Type Oxides and Ferroelectricity"; *Jpn. J. Appl. Phys.*; vol. 39; pp. 5679-5682; 2000.

L. Bellaiche et al.; "Intrinsic Piezoelectric Response in Perovskite Alloys: PMN-PT versus PZT"; *Physical Review Letters*; vol. 83, No. 7; pp. 1347-1350; Aug. 16, 1999.

Boyle et al., "Aging characteristics of a hybrid sol-gel Pb(ZR, Ti)$O_3$ precursor solution," Journal of Materials Research, Materials Research Society, vol. 12, No. 4, Apr. 1997, pp. 1022-1030.

Tuttle et al., "Chemically Prepared Lead Magnesium Niobate Dielectrics," Materials Research Society Symposium Proceedings, vol. 495, 1998, pp. 185-195.

* cited by examiner

*Primary Examiner*—David M Brunsman
(74) *Attorney, Agent, or Firm*—Oliff & Berridge, PLC

(57) ABSTRACT

To provide precursor compositions for forming ferroelectric, methods for manufacturing precursor compositions, and methods for forming ferroelectric films using precursor compositions, which have excellent composition controllability in a liquid phase method, and in which metal compositions such as lead can be reused. A precursor composition pertains to a precursor composition including a precursor for forming a ferroelectric, wherein the ferroelectric is expressed by a general formula of $AB_{1-x}C_xO_3$, where an element A is composed of at least Pb, an element B is composed of at least one of Zr, Ti, V, W and Hf, an element C is composed of at least one of Nb and Ta, and the precursor includes at least the element B and the element C, and has an ester-bond in a part thereof.

14 Claims, 48 Drawing Sheets

FIG. 3B [CHAIN SATURATED POLYCARBOXYLIC ACID]
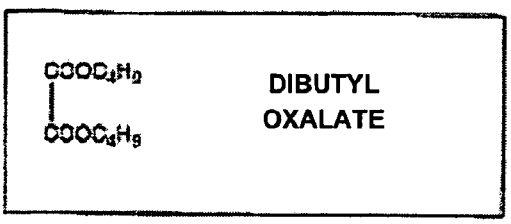
DIBUTYL OXALATE
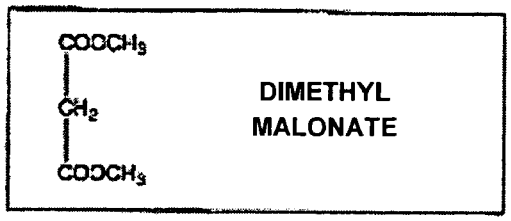
DIMETHYL MALONATE
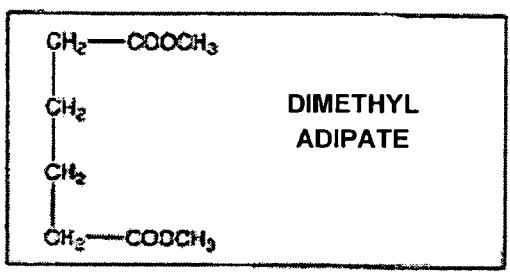
DIMETHYL ADIPATE
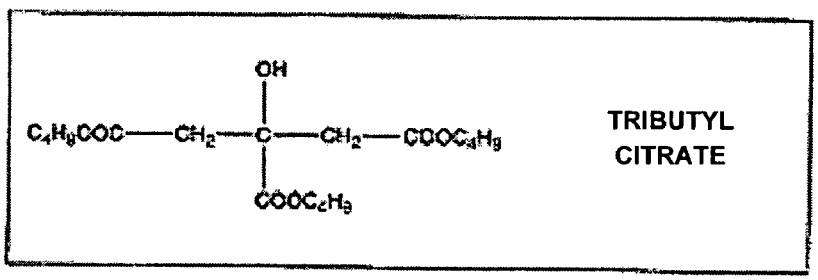
TRIBUTYL CITRATE
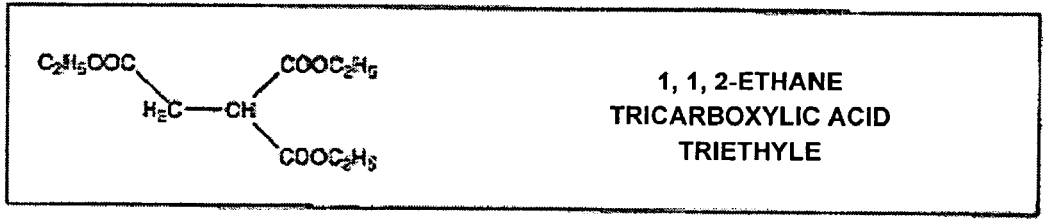
1, 1, 2-ETHANE TRICARBOXYLIC ACID TRIETHYLE
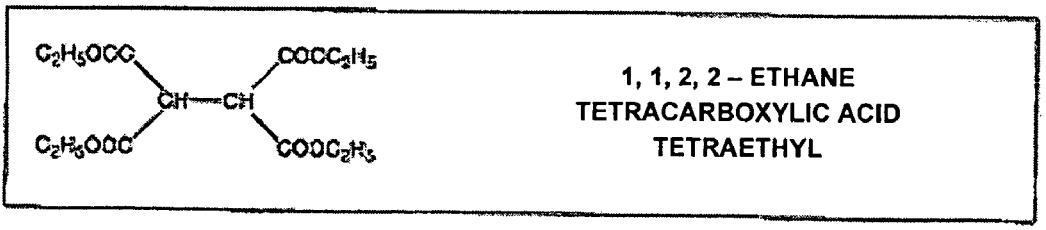
1, 1, 2, 2 – ETHANE TETRACARBOXYLIC ACID TETRAETHYL

[CHAIN UNSATURATED POLYCARBOXYLIC ACID]

DIMETHYL MALEATE

DIETHYL FUMARATE

TRANS-ACONITIC ACID

FIG. 3D [CYCLIC POLYCARBOXYLIC ACID]
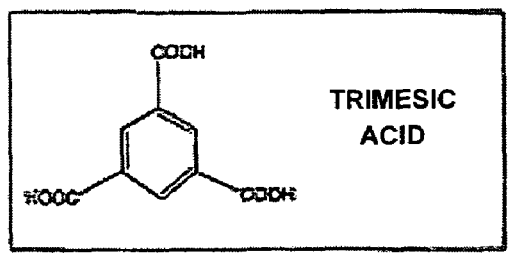
TRIMESIC ACID
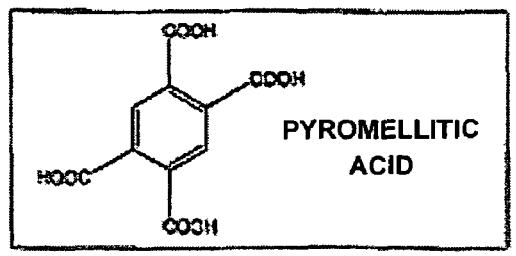
PYROMELLITIC ACID
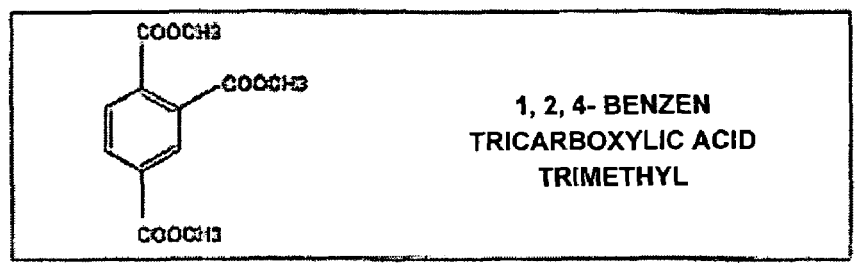
1, 2, 4- BENZEN TRICARBOXYLIC ACID TRIMETHYL
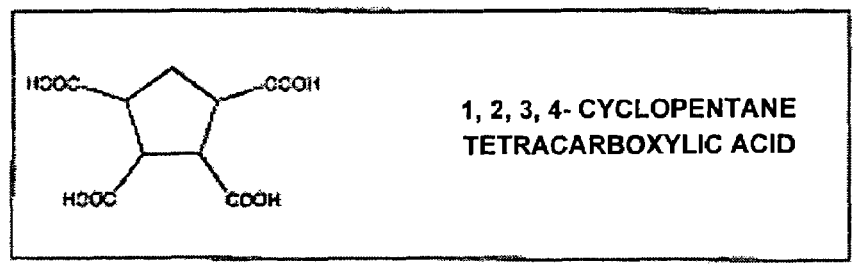
1, 2, 3, 4- CYCLOPENTANE TETRACARBOXYLIC ACID
FIG. 4
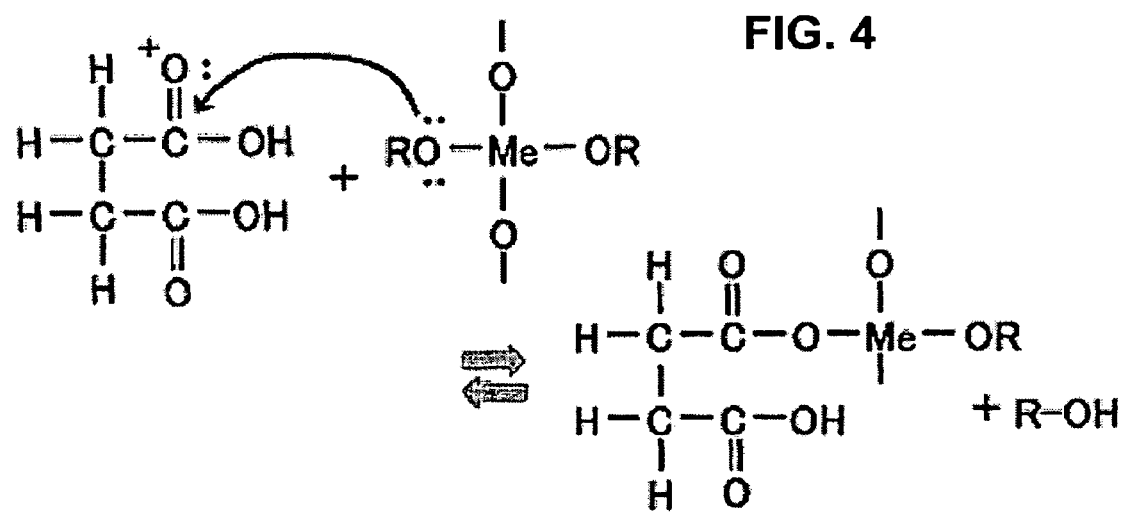

a: 80°C, 60min
b: 3Week

3Week

80°C 60min

NONE 0.5%

1%

WO₃

DIMETHYL SUCCINATE

DIMETHYL MALEATE

DIMETHYL MALONATE

TRIBUTYL CITRATE

PRECURSOR COMPOSITION, METHOD FOR MANUFACTURING PRECURSOR COMPOSITION, METHOD FOR MANUFACTURING FERROELECTRIC FILM, PIEZOELECTRIC ELEMENT, SEMICONDUCTOR DEVICE, PIEZOELECTRIC ACTUATOR, INK JET RECORDING HEAD, AND INK JET PRINTER

BACKGROUND

The present invention relates to precursor compositions for forming ferroelectric, methods for manufacturing precursor compositions, methods for manufacturing ferroelectric films, piezoelectric elements, semiconductor devices, piezoelectric actuators, ink jet recording heads, and ink jet printers.

Ferroelectric materials including PZT are used in various applications, such as, ferroelectric memories, piezoelectric elements, infrared ray sensors, SAW devices, and the like, and their research and development are actively conducted.

A chemical solution method (CSD: Chemical Solution Deposition Method), such as, a sol-gel method and an MOD method is known as a typical method for forming ferroelectrics.

In the sol-gel method, a solution of precursor in which a compound such as metal alkoxide is polymerized through hydrolysis and polycondensation (which is also referred to as "hydrolysis-condensation") is used. The sol-gel method has an advantage in that the compositions of ferroelectric to be obtained can be controlled well by controlling the compositions of metal alkoxide solution, but has a difficulty in that, because the hydrolysis-condensation reaction is an irreversible reaction, a material that has once been cross-linked and polymerized cannot be used as a sol-gel raw material. In particular, in the case of ferroelectric that includes lead such as PZT, a lead waste treatment needs to be conducted.

Also, in the metal organic decomposition method (MOD: Metal Organic Decomposition Method), a solution of a stable organometallic compound such as carboxylate of a metal or the like is used. The raw material solution used by the MOD method uses a stable organometallic compound as a raw material, and this method provides advantages in that preparation and handling of the solution composition are easy. Unlike the sol-gel method that forms a compound oxide through hydrolysis and polycondensation of a compound, the MOD method forms a compound oxide by resolving an organic group with a large molecular weight in an oxygen atmosphere, and thus has a tendency in which the crystallization temperature is high, and crystal grains would likely become large, compared to the sol-gel method.

SUMMARY

It is an object of the present invention to provide precursor compositions for forming ferroelectric, methods for manufacturing precursor compositions, and methods for forming ferroelectric films using precursor compositions, which have excellent composition controllability in a liquid phase method, and in which metal compositions such as lead are reusable.

It is another object of the present invention to provide piezoelectric elements, semiconductor devices, piezoelectric actuators, ink jet recording heads, and ink jet printers.

A precursor composition in accordance with the present invention pertains to a precursor composition including a precursor for forming a ferroelectric, wherein the ferroelectric is expressed by a general formula of $AB_{1-x}C_xO_3$, where an element A is composed of at least Pb, an element B is composed of at least one of Zr, Ti, V, W and Hf, an element C is composed of at least one of Nb and Ta, and the precursor includes at least the element B and the element C, and has an ester-bond in a part thereof.

In the precursor composition, the precursor has ester-bonds and reversibly reacts, such that the precursor that has been polymerized can be decomposed again. For this reason, the decomposition product can be reused as a precursor raw material.

In the precursor composition in accordance with the present invention, the element B may be Zr and Ti, and the element C may be Nb.

In the precursor composition in accordance with the present invention, the precursor may further include the element A.

In the precursor composition in accordance with the present invention, the precursor may be dissolved or dispersed in an organic solvent. It is noted here that alcohol may be used as the organic solvent.

In the precursor composition in accordance with the present invention, the ferroelectric may preferably include Nb in a range of $0.05 \leq x < 1$, and more preferably, in a range of $0.1 \leq x \leq 0.3$.

In the precursor composition in accordance with the present invention, the ferroelectric may include Ta in a range of $0.05 \leq x < 1$.

In the precursor composition in accordance with the present invention, the ferroelectric may further include Si or Si and Ge by 0.5 mol % or more, and more preferably, by 0.5-5 mol %. Addition of a small amount of Si creates a crystallization temperature lowering effect as a sintering agent.

A method for manufacturing a precursor composition in accordance with the present invention pertains to a method for manufacturing a precursor composition including a precursor for forming a ferroelectric, wherein the ferroelectric is expressed by a general formula of $AB_{1-x}C_xO_3$, where an element A is composed of at least Pb, an element B is composed of at least one of Zr, Ti, V, W and Hf, and an element C is composed of at least one of Nb and Ta, and includes:

mixing a sol-gel raw material including at least the element B and the element C, which is a sol-gel raw material including a hydrolysis-condensation product of a metal alkoxide, polycarboxylic acid or polycarboxylic acid ester, and an organic solvent; and forming the precursor having an ester-bond through esterification of the polycarboxylic acid or polycarboxylic acid derived from the polycarboxylic acid ester and the metal alkoxide.

According to this manufacturing method, the precursor composition in accordance with the present invention can be readily obtained by esterification of the polycarboxylic acid or polycarboxylic acid derived from the polycarboxylic acid ester and the metal alkoxide.

In the method for manufacturing a precursor composition in accordance with the present invention, the organic solvent may be alcohol. Concrete examples of alcohol are described later.

In the method for manufacturing a precursor composition in accordance with the present invention, the polycarboxylic acid or the polycarboxylic acid ester may have a valence of 2 or more. The following can be enumerated as polycarboxylic acids used in the present invention. As carboxylic acids with a valence of 3, trans-aconitic acid and trimesic acid can be enumerated; and as carboxylic acids with a valence of 4, pyromellitic acid, 1,2,3,4-cyclopentane tetracarboxylic acid and the like can be enumerated. Moreover, as polycarboxylic acid esters that dissociate in alcohol and work as polycarboxylic acid, those with a valence of 2 include dimethyl succinate, diethyl succinate, dibutyl oxalate, dimethyl malonate, dimethyl adipate, dimethyl maleate, and diethyl funarate, those with a valence of 3 include tributyl citrate, 1,1,2-ethane tricarboxylic acid triethyle, and the like, and those with a valence of 4 include 1,1,2,2-ethane tetracarboxylic acid tetraethyl, 1,2,4-benzen tricarboxylic acid trimethyl, and the like. These polycarboxylic acid esters enumerated above dissociate in alcohol and work as polycarboxylic acid. Examples of the polycarboxylic acids or their esters are shown in FIGS. 3A-3D. Also, the present invention is characterized in linking networks through esterification by using polycarboxylic acid. Because ester networks do not grow with single carboxylic acids or their esters, such as, for example, acetic acid, methyl acetate or the like, they are not included in the present invention.

In the method for manufacturing a precursor composition in accordance with the present invention, the carboxylic acid ester with a valence of 2 may be at least one kind selected from ester succinate, ester maleate, and ester malonate. As concrete examples of these esters, dimethyl succinate, dimethyl maleate, and dimethyl malonate can be enumerated.

The molecular weight of the aforementioned polycarboxylic acid ester may be 150 or less. When the molecular weight of polycarboxylic acid ester is too large, the film might be damaged easily when ester volatilizes at the time of heat-treatment, and a dense film may not be obtained.

The aforementioned polycarboxylic acid ester can be a liquid in room temperature. This is because the liquid might gel if polycarboxylic acid ester is in a solid state at room temperature.

In the method for manufacturing a precursor composition in accordance with the present invention, a sol-gel raw material using metal carboxylate may be further included when mixing the sol-gel raw material, the polycarboxylic acid or the polycarboxylic acid ester and the organic solvent. As the metal carboxylate, typically, lead acetate that is carboxylate of lead, and further, lead octylate, niobate octylate and lead octylate niobate shown in FIG. 2 can be enumerated.

In the method for manufacturing a precursor composition in accordance with the present invention, an organic metal compound (MOD raw material) may be further included when mixing the sol-gel raw material, the polycarboxylic acid or the polycarboxylic acid ester and the organic solvent. In this manner, in the method for manufacturing a precursor composition in accordance with the present invention, alkoxide raw materials can be ester-bonded, as well as MOD raw material and alkoxide raw material can be ester-bonded.

In the method for manufacturing a precursor composition in accordance with the present invention, a sol-gel raw material including Si or Si and Ge may be further included when mixing the sol-gel raw material, the polycarboxylic acid or the polycarboxylic acid ester and the organic solvent.

In the method for manufacturing a precursor composition in accordance with the present invention, a mixture of at least a sol-gel solution for $PbZrO_3$, a sol-gel solution for $PbTiO_3$ and a sol-gel solution for $PbNbO_3$ may be used as the sol-gel solution. For example, the sol-gel solution for $PbNbO_3$ may be formed by mixing lead octylate and niobate octylate, which exhibits phases shown in FIG. 2, as a result of alcohol exchange reaction of the two. Also, a sol-gel solution for $PbTaO_3$ may be used instead of the sol-gel solution for $PbNbO_3$.

In the method for manufacturing a precursor composition in accordance with the present invention, the sol-gel solution that is further mixed with a sol-gel solution for $PbSiO_3$ may be used.

In a method for manufacturing a ferroelectric film in accordance with the present invention includes heat-treating the precursor composition in accordance with the present invention, after it has been coated on a conductive film. As the conductive film, a platinum system metal such as Pt, Ir or the like may be used. Further, as the conductive film, a perovskite type electrode material such as $SrRuO_3$, $LaNiO_3$ or the like may also be used.

A piezoelectric element in accordance with the present invention includes a ferroelectric film that is formed by using the precursor composition in accordance with the present invention.

A semiconductor device in accordance with the present invention includes a ferroelectric film that is formed by using the precursor composition in accordance with the present invention.

A piezoelectric actuator in accordance with the present invention includes the piezoelectric element in accordance with the present invention.

An ink jet recording head in accordance with the present invention includes the piezoelectric actuator in accordance with the present invention.

An ink jet printer in accordance with the present invention includes the ink jet recording head in accordance with the present invention.

BRIEF DESCRIPTION OF THE DRAWINGS

FIG. 3B are figures indicating polycarboxylic acid or polycarboxylic acid ester, which are used in the present embodiment;

FIG. 3D are figures indicating polycarboxylic acid or polycarboxylic acid ester, which are used in the present embodiment;

FIG. 4 are figures indicating a precursor generating reaction in a precursor composition in accordance with the present embodiment;

DETAILED DESCRIPTION OF EMBODIMENTS

Figure 1:
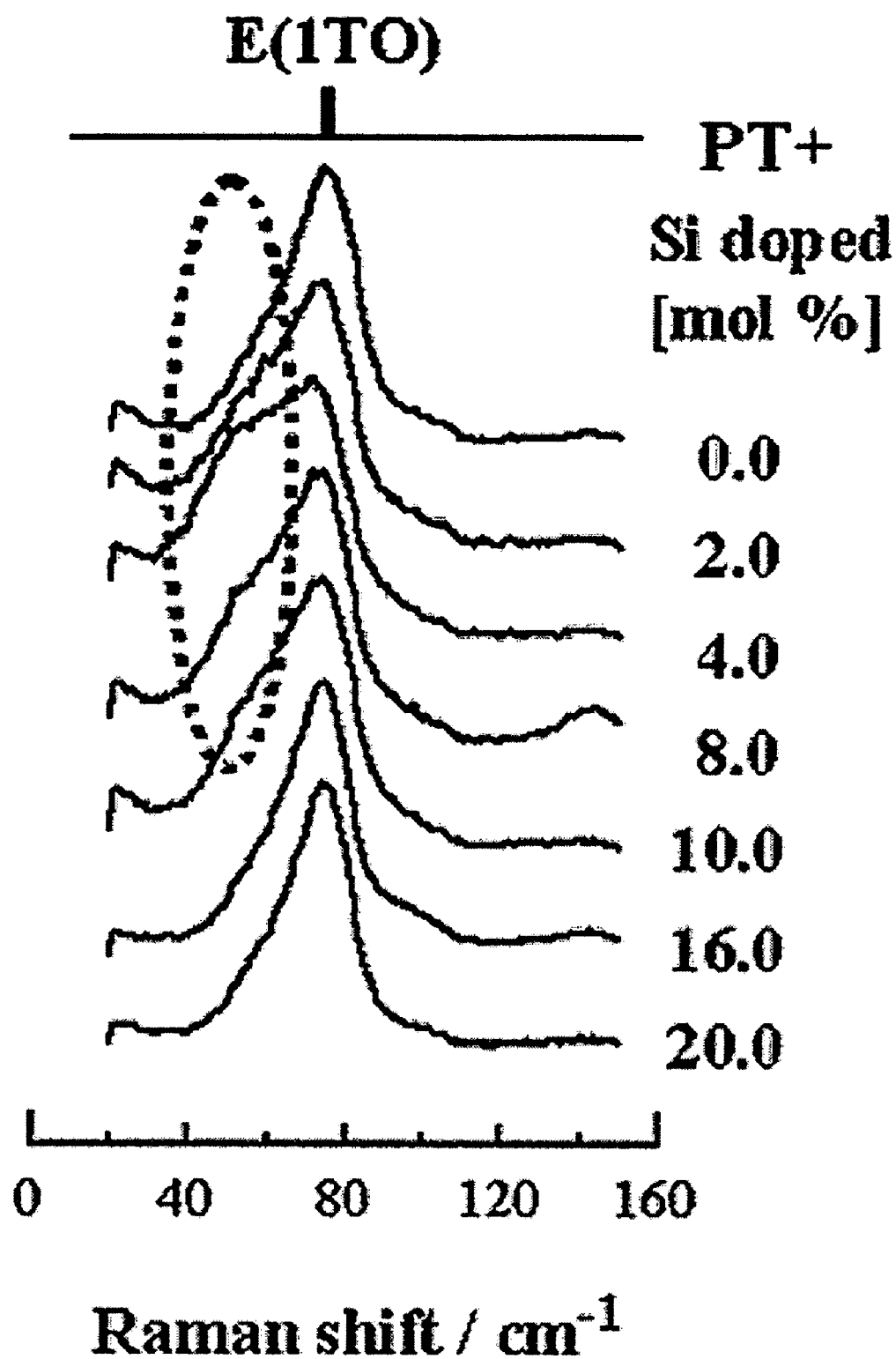
FIG. 1 is a graph showing changes in Raman vibration mode of A site ions, when Si is added to lead titanate, in accordance with a present embodiment.

Examples of embodiments of the present invention are described below with reference to the drawings.

1. Precursor Composition

A precursor composition in accordance with an embodiment is used for forming films of ferroelectric. It is noted here that the ferroelectric is expressed by a general formula of $AB_{1-x}C_xO_3$, where an element A is composed of at least Pb, an element B is composed of at least one of Zr, Ti, V, W and Hf, and an element C is composed of at least one of Nb and Ta. Further, in the present embodiment, the precursor includes at least the element B and the element C, and has an ester-bond in a part thereof.

In the precursor composition of the present embodiment, the precursor may be dissolved or dispersed in an organic solvent. Alcohol can be used as the organic solvent. Any alcohol can be used without any particular limitation, and monovalent alcohols such as buthanol, methanol, ethanol, propanol, and the like, and polyhydric alcohols can be enumerated. For example, the following can be enumerated as the alcohols.

Monovalent Alcohols:

As propanol (propyl alcohol), 1-propanol (97.4° C. in boiling point), and 2-propanol (82.7° C. in boiling point);

As buthanol (butyl alcohol), 1-buthanol (117° C. in boiling point), 2-buthanol (100° C. in boiling point), 2-methyl-1-propanol (108° C. in boiling point), and 2-methyl-2-propanol (25.4° C. in melting point and 83° C. in boiling point); and As pentanol (amyl alcohol), 1-pentanol (137° C. in boiling point), 3-methyl-1-buthanol (131° C. in boiling point), 2-methyl-1-buthanol (128° C. in boiling point), 2,2-dimetyl-1-propanol (113° C. in boiling point), 2-pentanol (119° C. in boiling point), 3-methyl-2-buthanol (112.5° C. in boiling point), 3-pentanol (117° C. in boiling point), and 2-methyl-2-buthanol (102° C. in boiling point).

Polyhydric Alcohols:

Ethylene glycol (−11.5° C. in melting point, 197.5° C. in boiling point), and glycerin (17° C. in melting point, 290° C. in boiling point).

The ferroelectric that is obtained by the precursor composition of the present embodiment can include Nb in a range of $0.05 \leq x < 1$, and more preferably, in a range of $0.1 \leq x \leq 0.3$. Also, the ferroelectric can include Si, or Si and Ge by 0.5 mol % or more, and more preferably by 0.5 mol % or greater but 5 mol % or less. Furthermore, the element B can be Zr and Ti. In other words, in accordance with the present embodiment, the ferroelectric can be Pb (Zr, Ti, Nb) $O_3$ (PZTN) in which Nb is doped in the Ti site.

Because Nb has generally the same size as that of Ti (ionic radii are close to each other and atomic radii are identical), and weighs two times, it is hard for atoms to slip out the lattice even by collision among atoms by lattice vibration. Further, the valence of Nb is +5, which is stable. Therefore, even if Pb slips out, the valence resulting from the vacated Pb can be supplemented by $Nb^{5+}$. Also, even if a Pb vacancy occurs at the time of crystallization, it is easier for Nb having a small size to enter than O having a larger size to slip out.

Furthermore, Nb may also have a valence of +4, such that Nb can sufficiently substitute for $Ti^{4+}$. Moreover, Nb has in effect a very strong covalent bond, and it is believed that Pb is also difficult to slip out (H. Miyazawa, E. Natori, S. Miyashita; Jpn. J. Appl. Phys. 39 (2000) 5679).

Because the ferroelectric, and PZTN in particular, obtained with the precursor composition of the present embodiment includes Nb by a specific proportion, adverse effects by the Pb vacancy are canceled, and excellent composition controllability can be obtained. As a result, as it is clear from embodiment examples to be described below that the PZTN has excellent hysteresis characteristics, leakage characteristics, reduction resistance and insulation characteristics.

Until now, the Nb doping in PZT has been mainly performed into Zr-rich rhombohedral crystal regions and is extremely small, on the order of 0.2 to 0.025 mol % (see J. Am. Ceram. Soc, 84 (2001) 902 and Phys. Rev. Let, 83 (1999) 1347). The main reason why it has not been possible to dope a large amount of Nb is considered to be because the addition of 10 mol % of Nb, for example, would increase the crystallization temperature to at least 800° C.

Therefore, $PbSiO_3$ silicate may preferably be further added by a proportion of 0.5 to 5 mol %, for example, in the precursor composition for the ferroelectric. This makes it possible to reduce the crystallization energy of the PZTN. In other words, if PZTN is used as the material of the ferroelectric film, the addition of $PbSiO_3$ silicate makes it possible to design a reduction in the crystallization temperature of the PZTN. Also, instead of a silicate, a mixture of a silicate and a germanate may be used. The inventors of the present application confirmed that Si composed a part of the crystal as the A site ion, after functioned as a sintering agent (see FIG. 1). In other words, as shown in FIG. 1, when silicon was added in lead titanate, changes were observed in the Raman vibration mode E (1TO) of A site ions. Also, changes were observed in the Raman vibration mode, when the amount of Si added was 8 mol % or less. Accordingly, it is confirmed that Si exists at the A site of perovskite when a small amount of Si is added.

In the present invention, Ta may be used instead of Nb or together with Nb. When Ta is used, the tendency similar to those of Nb described above was observed.

With the precursor composition of the present embodiment, the precursor has ester-bonds by esterification of a polycarboxylic acid or a metal alkoxide and a reversible reaction is possible, such that the polymerized precursor can be decomposed to form metal alkoxides. For this reason, the metal alkoxides can be reused as precursor raw materials.

In addition, the present invention provides the following advantages. Lead acetate is generally used as a lead material in PZT sol-gel solutions that are commercially sold. However, lead acetate is difficult to bond with other alkoxide of Ti, Zr or the like, and difficult for lead to be taken into networks of the precursor. In the present invention, for example, of the two carboxyl groups of succinic acid that is polycarboxylic acid with a valence of 2, a first one of the carboxyl groups, which initially works as an acid, has an acidity of pH=4.0, which is smaller than pH=4.56 of acetic acid, and therefore is a stronger acid than acetic acid, such that lead acetate bonds with succinic acid. In other words, weak acidic salt+strong acid becomes strong acidic salt+weak acid. Further, the remaining second carboxyl group of succinic acid bonds with other MOD molecules or alkoxide, such that networking of Pb in the precursor, which was difficult so far, becomes easy.

2. Method for Manufacturing Precursor Composition

A method for manufacturing a precursor composition in accordance with the present embodiment can be used for manufacturing a ferroelectric that is expressed by a general formula of $AB_{1-x}C_xO_3$, where an element A is composed of at least Pb, an element B is composed of at least one of Zr, Ti, V, W and Hf, and an element C is composed of at least one of Nb and Ta. The method for manufacturing in accordance with the present embodiment includes the steps of mixing a sol-gel raw material including at least the element B and the element C, which is a sol-gel raw material including a hydrolysis-condensation material of a metal alkoxide, polycarboxylic acid or polycarboxylic acid ester, and an organic solvent; and forming a precursor having ester-bonds through esterification of the polycarboxylic acid or polycarboxylic acid derived from the polycarboxylic acid ester and the metal alkoxide.

The present embodiment is useful for methods for manufacturing a ferroelectric in which the element B is Zr and Ti, and the element C is Nb or Ta.

Figure 5:
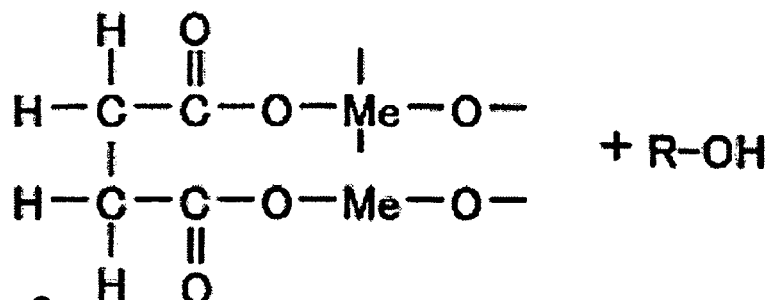
FIG. 5 is a figure indicating a precursor generating reaction in a precursor composition in accordance with the present embodiment.

FIG. 4 and FIG. 5 schematically show a precursor generation reaction in accordance with the manufacturing method of the present embodiment.

Figure 6:
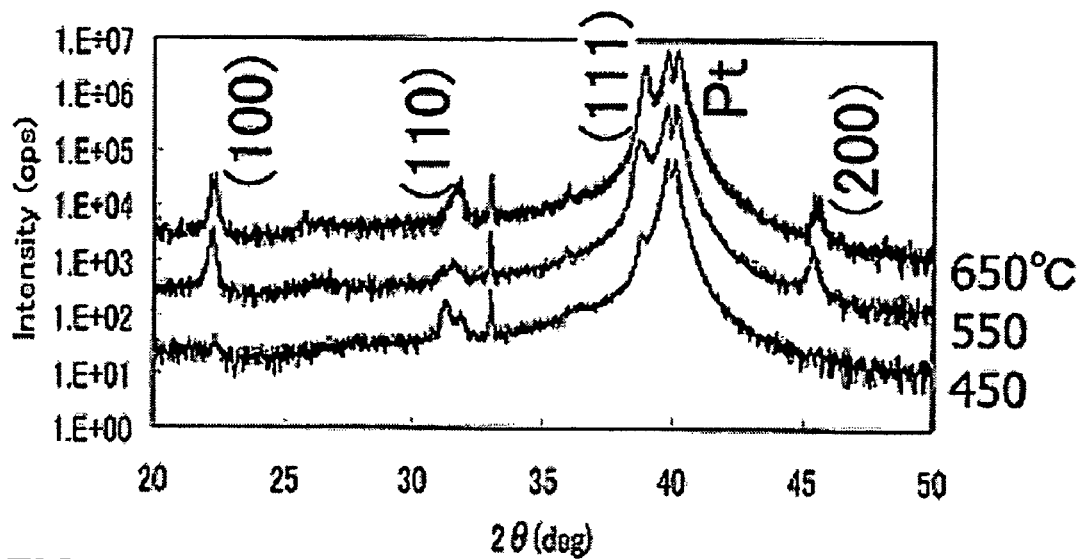
FIG. 6 is a graph showing crystallinity when sol-gel raw materials including Si and Ge in accordance with the present embodiment are used.

The precursor generation reaction roughly includes an alkoxy group substitution reaction in a first stage shown in FIG. 4, and a polymer network forming reaction by esterification in a second stage shown in FIG. 5. FIGS. 5 and 6 show an example in which dimethyl succinate is used expediently as polycarboxylic acid ester, and n-buthanol is used as an organic solvent. Dimethyl succinate is of non-polarity, but dissociates in alcohol and becomes polycarboxylic acid.

In the reaction in the first stage, as shown in FIG. 4, by esterification of dimethyl succinate and metal alkoxide of the sol-gel raw material, they are ester-bonded together. More specifically, dimethyl succinate dissociates in n-buthanol, and becomes to have a state in which proton is added to one of carbonyl groups (the first carbonyl group). A substitution reaction of the alkoxy group of the metal alkoxide with the first carbonyl group occurs, and a reaction product in which the first carboxyl group is esterified and alcohol are generated. It is noted here that the "ester-bond" means a bond between a carbonyl group and an oxygen atom (—COO—).

In the reaction in the second stage, as shown in FIG. 5, a substitution reaction between the other carboxyl group that remains in the reaction in the first step (the second carboxyl group) and the alkoxy group of the metal alkoxide occurs, and a reaction product in which the second carboxyl group is esterified and alcohol are generated.

In this manner, by the reactions in two stages, a polymer network in which hydrolysis-condensation products of the metal alkoxides included in the sol-gel raw material are mutually ester-bonded is obtained. Therefore, this polymer network has ester-bonds in the network in a moderately orderly fashion. It is noted that dimethyl succinate dissociates in two stages, and the first carboxyl group has an acid dissociation constant that is larger than that of the second carboxyl group, such that the reaction in the first stage has a reaction rate greater than that of the reaction in the second stage. Accordingly, the reaction in the second stage advances more slowly than the reaction in the first stage.

In the present embodiment, the following methods can be used to promote the esterification reaction described above.

(1) The concentration or the reactivity of reaction product is increased. Concretely, by increasing the temperature of the reaction system, the degree of dissociation of polycarboxylic acid or polycarboxylic acid ester is increased, thereby increasing the reactivity. The temperature of the reaction system depends on the boiling point of an organic solvent, and is preferably be higher than room temperature, but lower than the boiling point of the organic solvent. The temperature of the reaction system may preferably be, for example, 100° C., and more preferably, 50-100° C.

(2) Reaction vice-generative products are removed. Concretely, water and alcohol generated with esterification are removed whereby the esterification further advances.

(3) Molecular motions of reaction products are physically accelerated. Concretely, energy rays, such as, for example, ultraviolet rays may be irradiated to increase the reactivity of the reaction products.

The organic solvent that is used in the method for manufacturing a precursor composition in accordance with the present embodiment can be alcohol, as described above. When alcohol is used as the solvent, both of the sol-gel raw material and polycarboxylic acid or polycarboxylic acid ester can be dissolved well.

The polycarboxylic acid or the polycarboxylic acid ester that is used in the method for manufacturing a precursor composition in accordance with the present embodiment is not particularly limited, but the polycarboxylic acids or the polycarboxylic acid esters described above can be used.

The amount of polycarboxylic acid or polycarboxylic acid ester to be used depends on the sol-gel raw materials and the composition ratio of the ferroelectric. For example, the total mol ion concentration of a PZT sol-gel raw material, a PbNb sol-gel raw material and a PbSi sol-gel raw material and the mol ion concentration of polycarboxylic acid, when the polycarboxylic acid bonds, may preferably satisfy 1≧(the mol ion concentration of polycarboxylic acid)/(the total mol ion concentration of the raw material solution), and more preferably be 1:1. The amount of polycarboxylic acid to be added is, for example, 0.35 mol.

The amount of polycarboxylic acid or polycarboxylic acid ester to be added may preferably be equal to or greater than the total mol number of the raw material solutions to be bonded. All of the raw materials bond when the ratio of mol ion concentrations of the two is 1:1. However, because ester stably exists in an acidic solution, polycarboxylic acid may preferably be added in an amount greater than the total mol number of the material solutions such that ester can stably exist. Also, it is noted here that the mol number of polycarboxylic acid or polycarboxylic acid ester is a valence. In other words, in the case of polycarboxylic acid or polycarboxylic acid ester with a valence of 2, one molecule of polycarboxylic acid or polycarboxylic acid ester can bond with two molecules of the raw material molecules. Therefore, in the case of polycarboxylic acid or polycarboxylic acid ester with a valence of 2, one mol of the material solution and 0.5 mol of polycarboxylic acid or polycarboxylic acid ester make the ratio of 1:1. In addition, polycarboxylic acid or polycarboxylic acid ester may not initially be an acid, but ester of polycarboxylic acid may be dissociated in alcohol, and becomes polycarboxylic acid. In this case, the mol number of alcohol to be added may preferably satisfy $1 \geq$ (the mol number of alcohol/the mol number of polycarboxylic acid ester). This is because, the greater the mol number of alcohol, the more the entire polycarboxylic acid ester stably dissociates. It is noted here that the mol number of alcohol is also a so-called mol ion concentration obtained by division by the valence of alcohol.

In the method for manufacturing a precursor composition in accordance with the present embodiment, a raw material composed of metal carboxylate cay be further included. As the metal carboxylate, typically, lead acetate that is carboxylate of lead, lead octylate, and the like can be enumerated.

Figure 2:
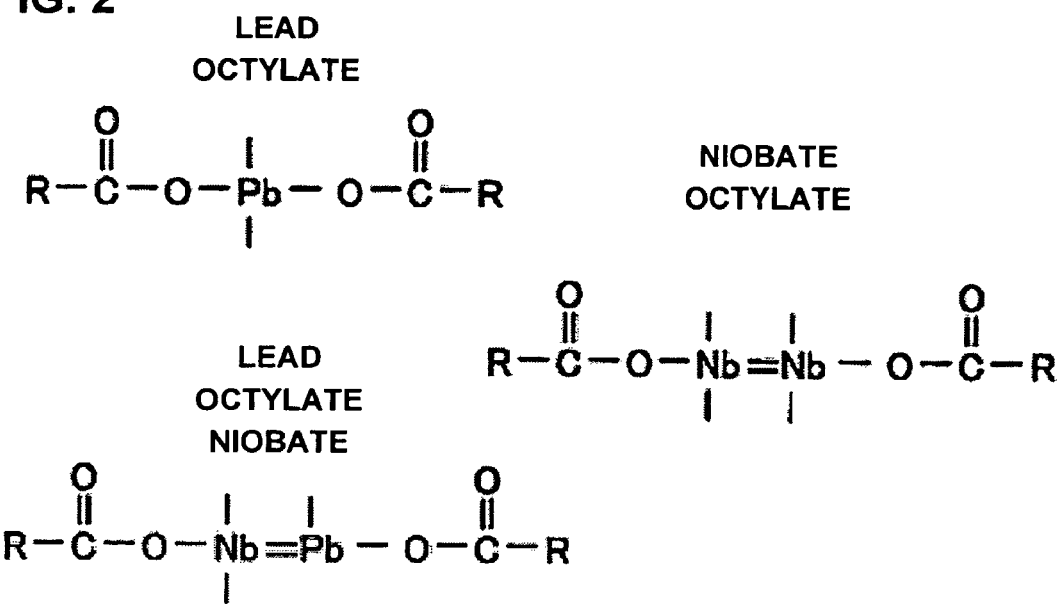
FIG. 2 are figures indicating carboxylic acid including lead, which are used in the present embodiment.
Figure 3A:
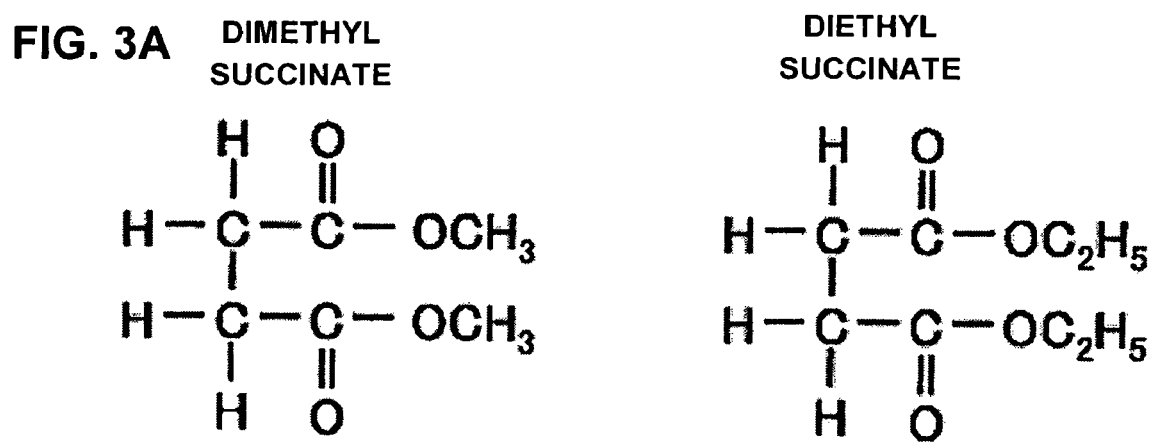
FIG. 3A are figures indicating polycarboxylic acid or polycarboxylic acid ester, which are used in the present embodiment.
Figure 3C:
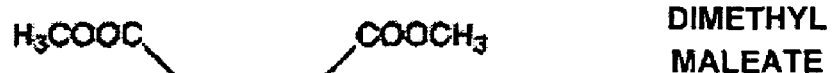
FIG. 3C are figures indicating polycarboxylic acid or polycarboxylic acid ester, which are used in the present embodiment.
Figure 3C:
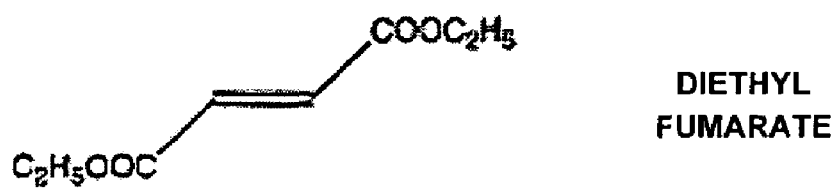
Figure 3C:
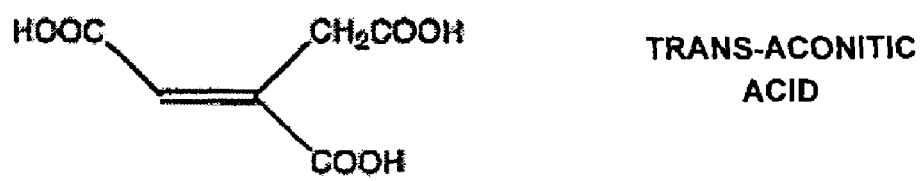

Also, in the method for manufacturing a precursor composition in accordance with the present embodiment, an organic metal compound (MOD material) can be used together with the sol-gel raw material. As the organic metal compound, for example, niobate octylate can be used. As shown in FIG. 2, niobate octylate has a structure in which two Nb atoms covalently bond together and octyl groups are present at other portions thereof. In this case, although two atoms Nb—Nb are covalently bonded together, no more network is present, and therefore this is treated as an MOD raw material.

Network formation of carboxylic acid and an MOD raw material progresses mainly through alcohol exchange reaction. For example, in the case of niobate octylate, a reaction takes place between carboxylic acid and octyl groups (alcohol exchange reaction), whereby esterification of R—COO—Nb progresses. In this manner, in accordance with the present embodiment, the MOD raw material is esterified, thereby causing condensation of the MOD raw material and alkoxides, such that molecules of the MOD raw material can be bonded to the network of the precursor.

Further, in the method for manufacturing a precursor composition in accordance with the present embodiment, a sol-gel raw material including Si or Si and Ge can be used as a sol-gel raw material including hydrolysis-condensation product of a metal alkoxide. As such a sol-gel solution, a sol-gel solution for $PbSiO_3$ alone, or a sol-gel solution for $PbSiO_3$ and a sol-gel solution for $PbGeO_3$ together can be used. By using a sol-gel raw material including Si and/or Ge, the film forming temperature can be lowered, and crystallization of ferroelectric at around 450° C. becomes possible. More concretely, as shown in FIG. 6, a peak indicating PZTN ferroelectric in accordance with the present invention can be recognized even at a crystallization temperature of 450° C.

In the method for manufacturing a precursor composition in accordance with the present embodiment, as a sol-gel solution to obtain PZTN, a mixture of a sol-gel solution for $PbZrO_3$, a sol-gel solution for $PbTiO_3$ and a sol-gel solution for $PbNbO_3$ can be used. In this case also, the sol-gel raw material including Si or Si and Ge described above can be further mixed.

Also, when Ta is introduced instead of Nb, a sol-gel solution for $PbTaO_3$ can be used as the sol-gel raw material.

The precursor of the precursor composition obtained in accordance with the present embodiment, as it moderately has ester-bonds in plural molecular networks, can have a reversible reaction. Accordingly, by advancing a reaction in a leftward direction indicated in FIG. 4 in the precursor, the polymerized precursor (polymer network) can be decomposed into condensates of metal alkoxides.

The manufacturing method and the precursor composition in accordance with the present embodiment have the following characteristics.

By the manufacturing method in accordance with the present embodiment, a polymer network in which hydrolysis-condensation products (plural molecular networks) of the metal alkoxides included in the sol-gel raw materials are mutually condensation-polymerized by polycarboxylic acid in the organic solvent through ester-bonds can be obtained. Therefore, this polymer network moderately has ester-bonds among the multiple molecular networks originated from the aforementioned hydrolysis-condensation products. Further, the esterification reaction can be readily conducted by temperature control.

Also, the precursor composition of the present embodiment moderately has ester-bonds among plural molecular networks, and therefore can have a reversible reaction. Accordingly, among the compositions remaining after the ferroelectric film has been formed, the polymerized precursor (polymer networks) can be decomposed to form metal alkoxides (or molecular networks composed of condensates thereof). Such metal alkoxides (or molecular networks composed of condensation products thereof) can be reused as precursor raw material, such that harmful substances such as lead can be reused, which is greatly advantageous from the viewpoint of the environment.

3. Method for Manufacturing Ferroelectric Film

A method for manufacturing a ferroelectric film in accordance with an embodiment includes coating the precursor composition of the present embodiment described above on a metal film composed of a platinum system metal, and then heat-treating the same. A platinum system metal has an excellent acidic catalytic action to esterification, such that the ferroelectric film can be crystallized much better. As the platinum system metal, at least one of Pt and Ir can be used. Instead of the platinum system metal, a perovskite type electrode material such as $SrRuO_3$, $LaNiO_3$ or the like can also be used. According to this manufacturing method, a ferroelectric film having excellent characteristics can be obtained by a simple method using a known coating method.

4. EMBODIMENT EXAMPLE

Embodiment examples of the present invention are described below.

(1) Embodiment Example 1

(A) In the present embodiment example, a PZTN ferroelectric film was obtained through mixing first to third raw material liquids including at least one of Pb, Zr, Ti and Nb, dimethyl succinate as polycarboxylic acid ester, and n-buthanol as an organic solvent, and crystallizing oxides contained in the mixed solution by heat treatment or the like. The mixed solution is formed by dissolving the sol-gel raw material and dimethyl succinate at a rate of 1:1 in n-buthanol.

As the first raw material liquid, a solution in which a condensation polymer for forming $PbZrO_3$ perovskite crystal with Pb and Zr among the constituent metal elements of the PZTN ferroelectric phase was dissolved in a solvent of n-buthanol in an anhydrous state was used.

As the second raw material liquid, a solution in which a condensation polymer for forming $PbTiO_3$ perovskite crystal with Pb and Ti among the constituent metal elements of the PZTN ferroelectric phase was dissolved in a solvent of n-buthanol in an anhydrous state was used.

As the third raw material liquid, a solution in which a condensation polymer for forming $PbNbO_3$ perovskite crystal with Pb and Nb among the constituent metal elements of the PZTN ferroelectric phase was dissolved in a solvent of n-buthanol in an anhydrous state was used.

When a ferroelectric film composed of $PbZr_{0.2}Ti_{0.6}Nb_{0.2}O_3$ (PZTN) is to be obtained by using the first, second and third raw material liquids, they are mixed in a mixing ratio ((the first raw material liquid): (the second raw material liquid): (the third raw material liquid)) of 2:6:2. Moreover, for the purpose of lowering the crystallization temperature of the ferroelectric film, a solution in which a condensation polymer for forming $PbSiO_3$ crystal was dissolved in a solvent of n-buthanol in an anhydrous state was added by 3 mol % as a fourth raw material liquid to the above mixed solution. In other words, by using the mixed solution of the first, second, third and fourth raw material liquids as the sol-gel raw materials, PZTN can be crystallized at crystallization temperatures in a temperature range at 700° C. or below.

Samples were obtained by the following method.

Figure 36:
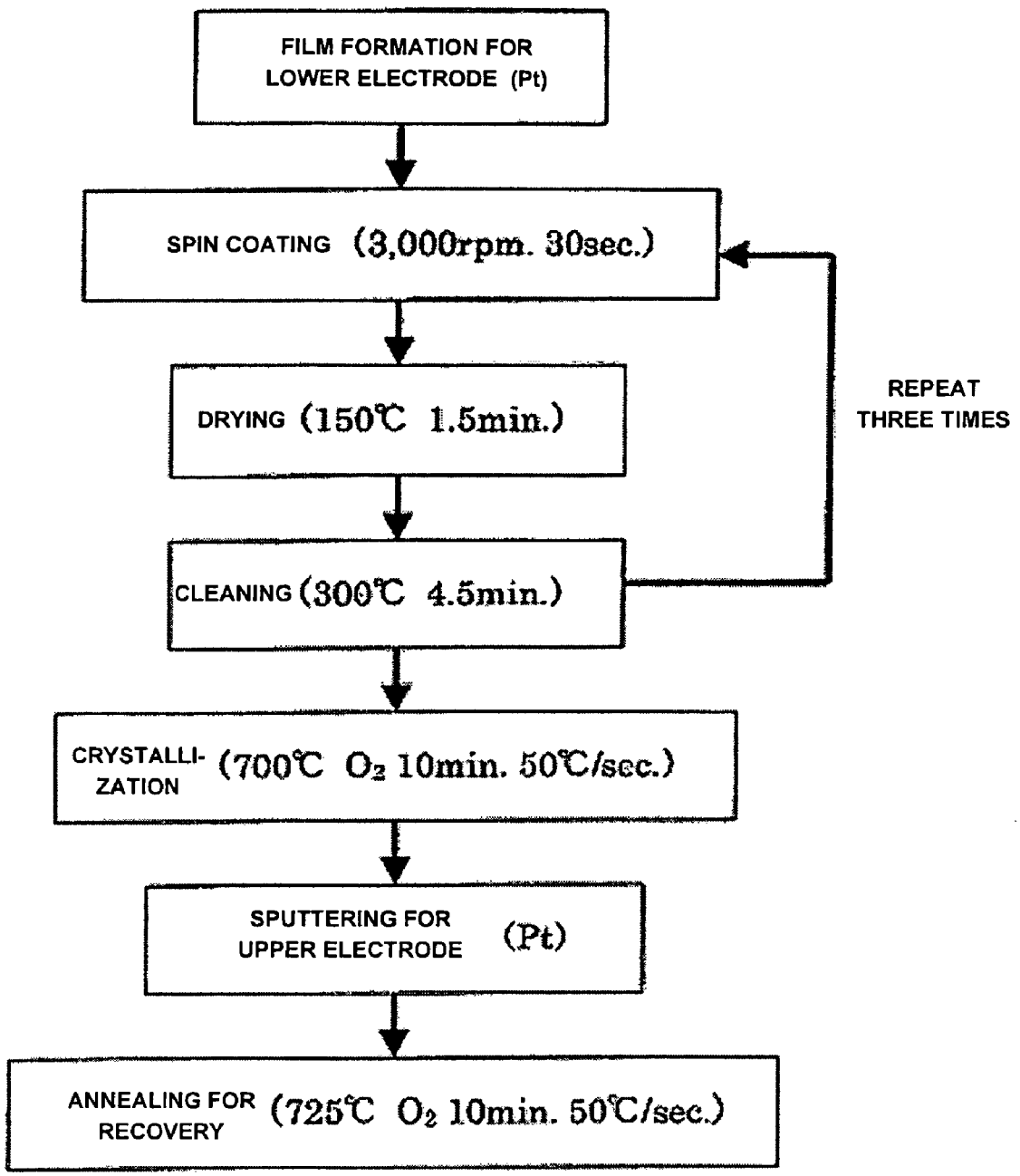
FIG. 36 is a chart showing a method for forming samples according to Embodiment Example 1 in accordance with the present embodiment.

First, at room temperature, a solution (precursor composition) was prepared by dissolving the aforementioned first to fourth raw material liquids and dimethyl succinate in n-buthanol. Then, the solution was retained for 8 weeks at normal temperature. During this period, the liquid was used after predetermined periods of time passed to thereby form samples by a method shown in FIG. 36. More concretely, the solution was coated by a spin coat method on a platinum substrate (that is a substrate having a silicon oxide layer, a titanium oxide layer and a platinum layer formed on a silicon substrate), and a drying treatment was conducted at 150-180° C. (150° C.), using a hot plate to thereby remove alcohol. Then, a cleaning thermal treatment was conducted using a hot-plate at 300-350° C. (300° C.). Then, the aforementioned coating step, the drying treatment step, and the cleaning thermal treatment were conducted multiple times according to the requirement to thereby obtain a coated film having a desired film thickness. Further, a sample of a ferroelectric film having a film thickness of 150 nm was obtained by conducting crystallization annealing (sintering). The sintering for crystallization was conducted by using rapid thermal annealing (RTA) in an oxygen atmosphere at 650° C.-700° C. (700° C.). Further, an upper electrode composed of platinum was formed by a sputter method, whereby a sample of a ferroelectric capacitor (hereafter also referred to as a "capacitor sample").

These samples were used to examine the following characteristics.

Figure 7:
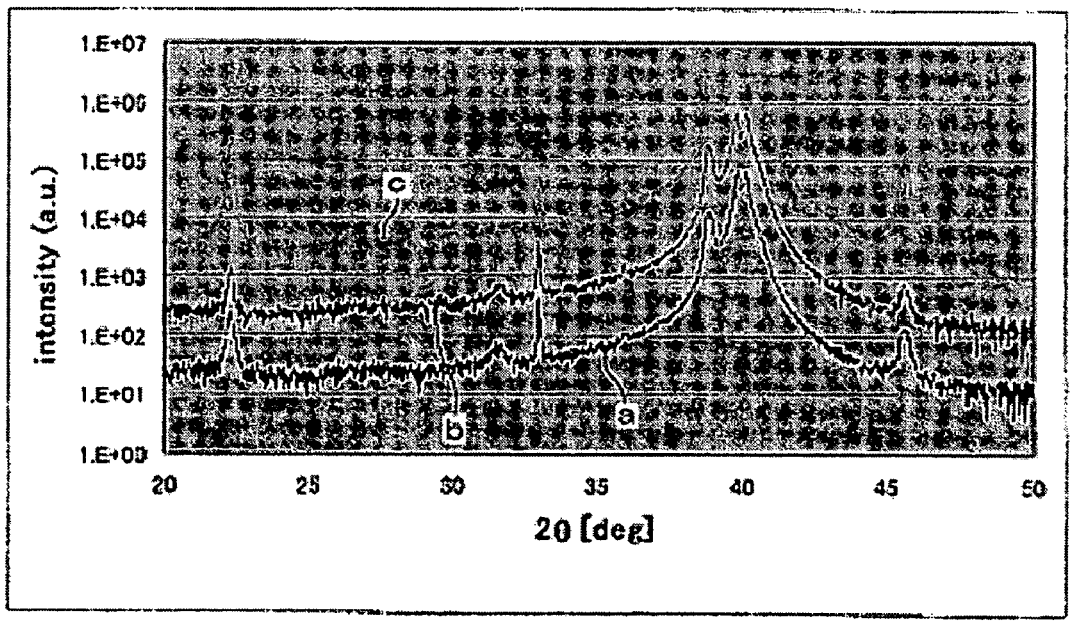
FIG. 7 is a graph showing crystallinity of samples of Embodiment Example 1 in accordance with a present embodiment example obtained by X-ray diffraction.

(a) Crystallinity of three kinds of the samples of ferroelectric films was examined by X-ray diffraction. FIG. 7 shows the results. In FIG. 7, a graph indicated by the sign a indicates the result of a sample a that used the solution immediately after it was prepared, a graph indicated by the sign b indicates the result of a sample b that used the solution after three weeks passed since immediately after its preparation, and a graph indicated by the sign c indicates the result of a sample c that used the solution after eight weeks passed since immediately after its preparation.

It was observed from FIG. 7 that each of the samples exhibited peaks indicating (100), (111) of PZTN, and it was confirmed that esterification progressed in each of the raw material liquids. In particular, the peaks were significant in the sample c.

Figure 8A:
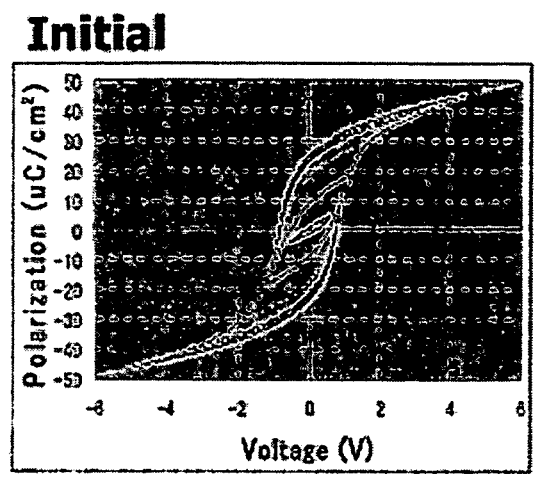
FIGS. 8A-8C are graphs showing hysteresis of the samples of Embodiment Example 1 in accordance with the present embodiment example.
Figure 8B:
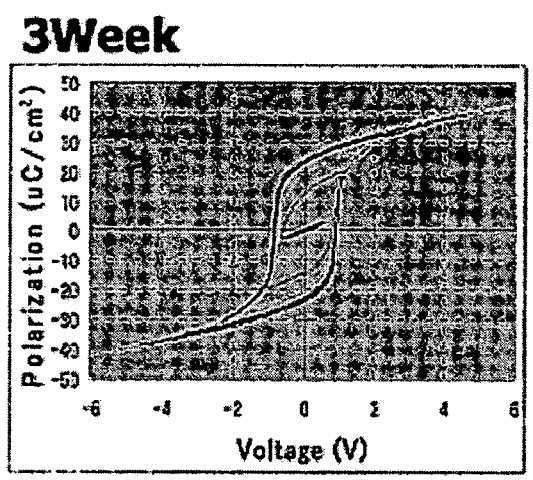
Figure 8C:
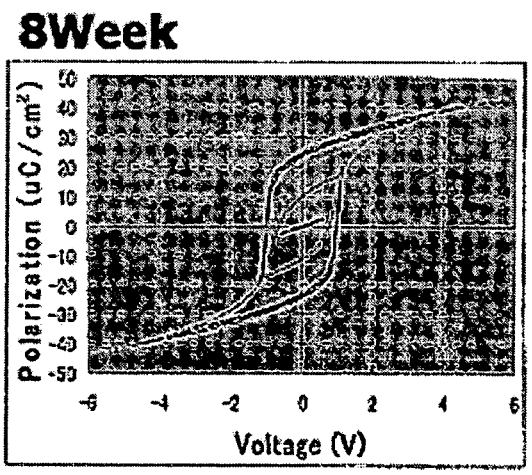

(b) FIGS. 8(A)-(C) show hysteresis obtained on capacitor samples a, b and c having the samples of a, b and c of ferroelectric films. It was confirmed from FIGS. 8 (A)-(C) that the capacitor samples b and c had better hysteresis characteristics than that of the capacitor sample a.

Figure 9:
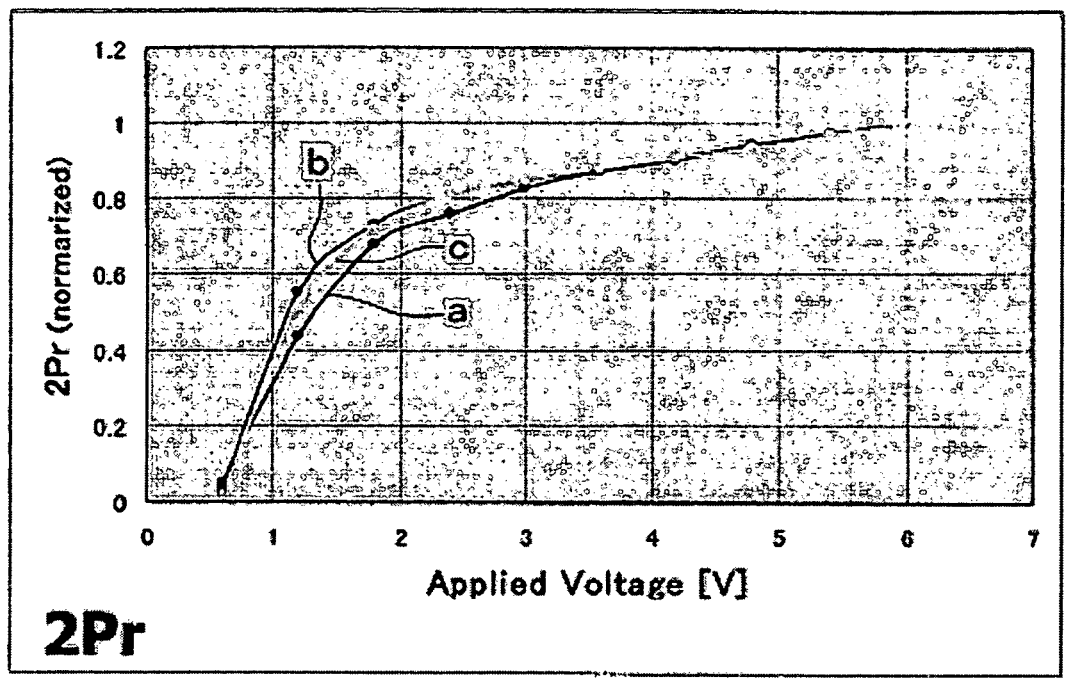
FIG. 9 is a graph showing polarization characteristics of the samples of Embodiment Example 1 in accordance with the present embodiment example.

(c) FIG. 9 shows polarization characteristics obtained on the capacitor samples a, b and c. It was confirmed from FIG. 9 that the capacitor samples b and c had better polarization characteristics than that of the capacitor sample a.

(B) Further, samples of ferroelectric films were formed by using the solution (precursor composition) described above after 4 days, 7 days, 11 days, 2 weeks, 3 weeks, 8 weeks and 12 weeks since the solution was prepared. Each sample was formed by coating the solution on a platinum substrate, and removing the organic solvent (n-buthanol) in the coated film by blowing nitrogen gas in room temperature. These samples are referred to samples b, c, d, e, f, g and h, respectively.

Figure 10:
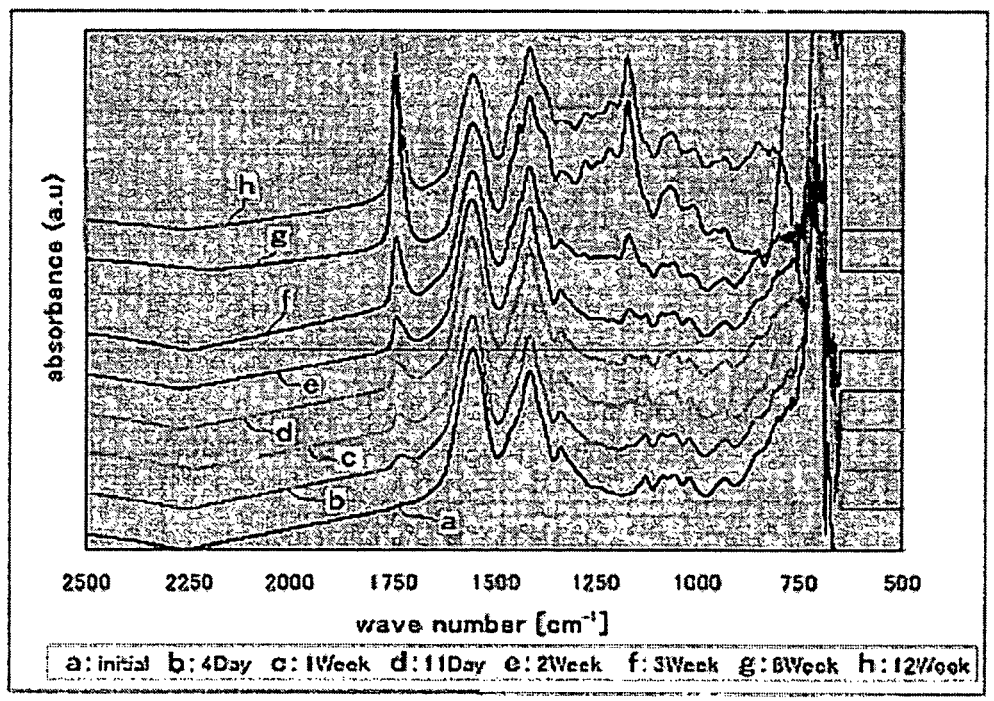
FIG. 10 is a graph showing spectra by FT-IR of the samples of Embodiment Example 1 in accordance with the present embodiment example.
Figure 11:
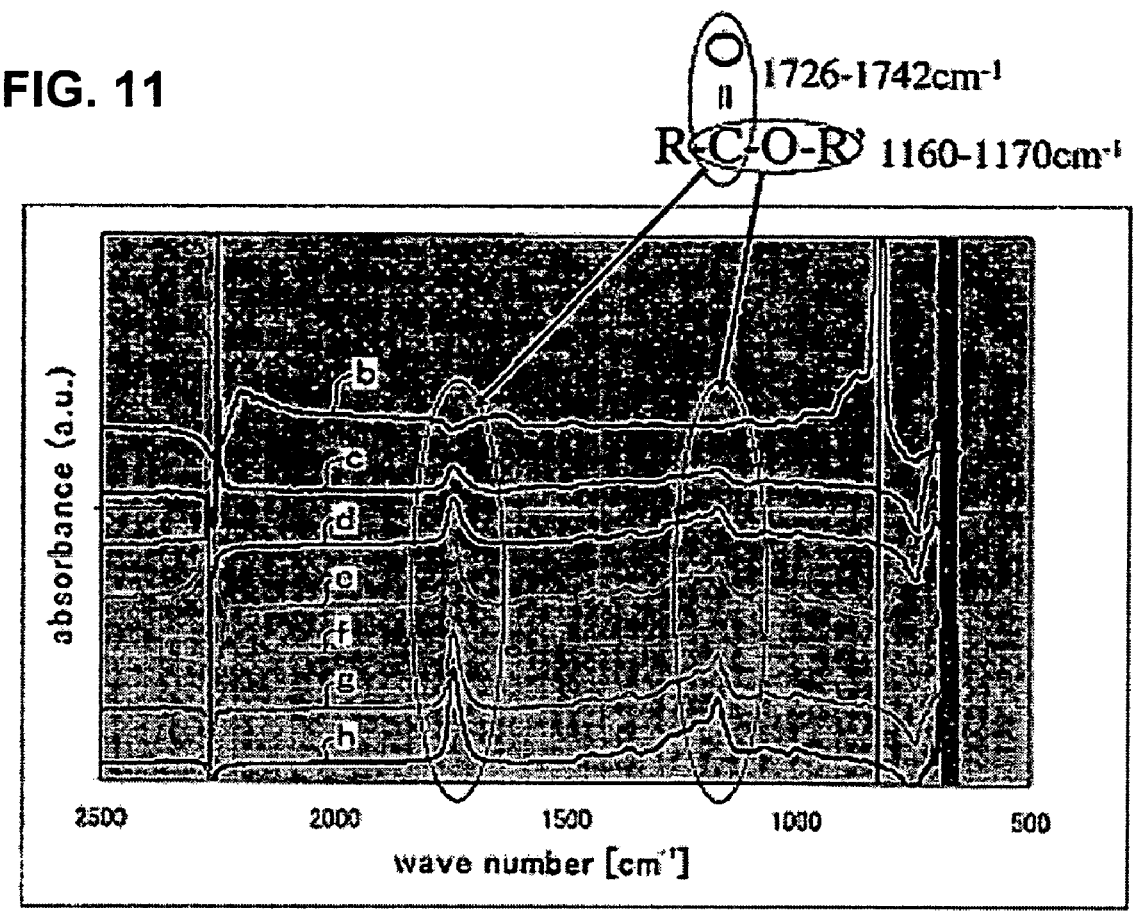
FIG. 11 is a graph showing difference spectra by FT-IR of the samples of Embodiment Example 1 in accordance with the present embodiment example.

FIG. 10 and FIG. 11 show the results of Fourier transform infrared spectroscopy (FT-IR) obtained on the samples a-h, respectively. FIG. 10 also shows the result of the capacitor sample a. FIG. 11 shows differences (difference spectra) between the spectrum of each of the samples b-h and the spectrum of the sample a obtained from the spectra shown in FIG. 10. Peaks at wavelengths of 1160-1170 cm$^{-1}$ indicate C—O—R', and peaks at wavelengths of 1726-1742 cm$^{-1}$ indicate carbonyl groups (C=O). It was confirmed from FIG. 10 and FIG. 11 that, the longer the time passed after the preparation of the solution, the greater the peaks indicating ester-bonds became, and the more the polymer network having ester-bonds was formed in the solution.

Figure 12:
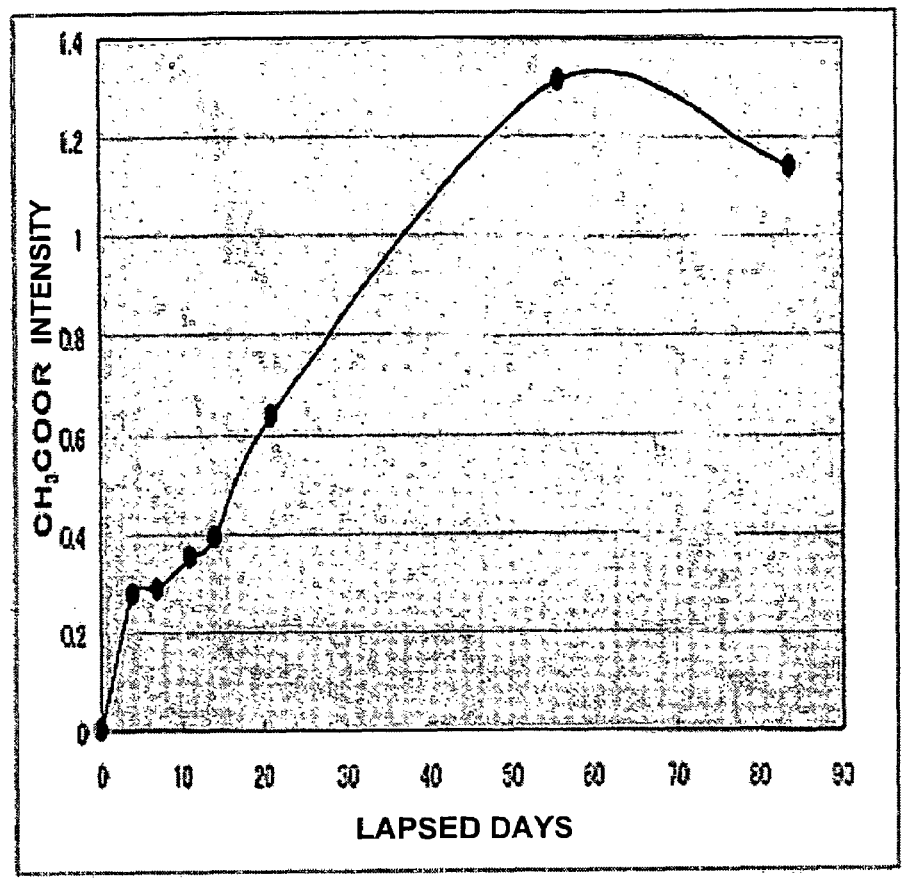
FIG. 12 is a graph showing relative intensity of peaks originating from carbonyl groups with respect to PZT peaks in the spectra by FT-IR of the samples of Embodiment Example 1 in accordance with the present embodiment example.

Further, FIG. 12 shows changes in the relative intensity of peaks originating from the carbonyl groups with respect to the plural peaks at 1300-1600 cm$^{-1}$ originating from PZT. It is observed from FIG. 12 that the peak intensity of carbonyl groups becomes larger around 7 days after the preparation of the solution, and becomes generally saturated around 8 weeks after.

(2) Embodiment Example 2

The present embodiment example differs from Embodiment Example 1 in that the solution is heated when it is prepared. Compositions of the solution are similar to those of Embodiment Example 1. More specifically, a sol-gel raw material in which the forth raw material liquid for forming $PbSiO_3$ crystal was added by 2 mol % to the first—third raw material liquids corresponding to $PbZr_{0.2}Ti_{0.8}Nb_{0.2}O_3$ (PZTN) used in Embodiment Example 1 was used. This sol-gel raw material and dimethyl succinate were dissolved at a rate of 1:1 in n-buthanol, and then the solution was heated at 80° C. for 60 minutes to thereby obtain a solution (precursor composition).

Figure 13:
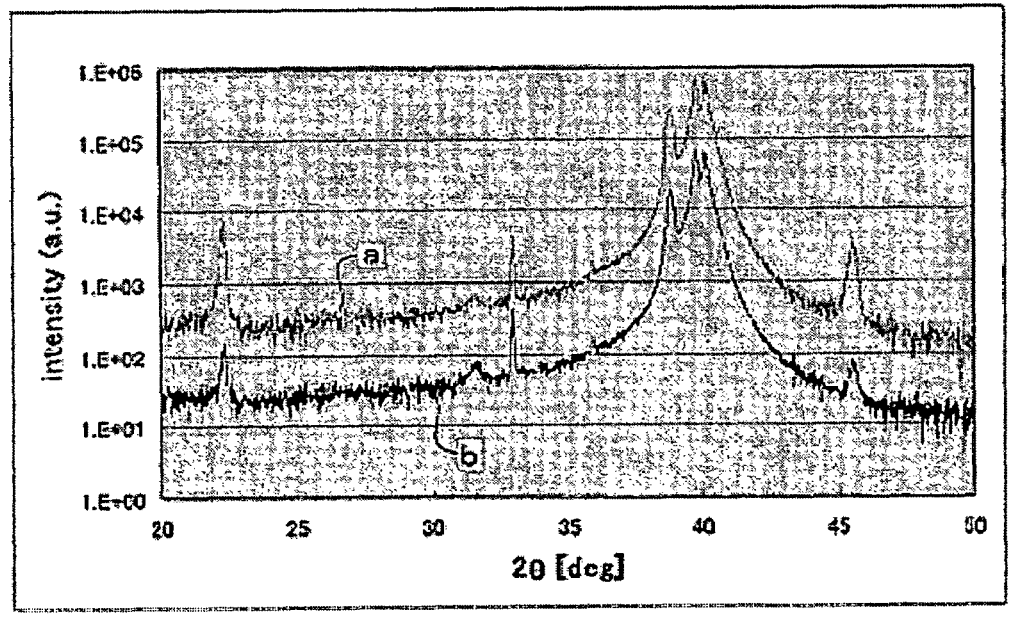
FIG. 13 is a graph showing crystallinity examined by X-ray diffraction of samples of Embodiment Example 2 in accordance with the present embodiment example.

Sample 1 was obtained by the following method. First, the solution (precursor composition) was coated by a spin coat method on a platinum substrate, and a drying treatment was conducted at 150-180° C. using a hot plate to thereby remove alcohol. Then, a cleaning thermal treatment was conducted using a hot-plate at 300-350° C. Then, the aforementioned coating step, the drying treatment step, and the cleaning thermal treatment were conducted multiple times according to the requirement to obtain a coated film having a desired film thickness. Further, a ferroelectric film having a film thickness of 150 nm was obtained by conducting crystallization annealing (sintering). The sintering for crystallization was conducted by using rapid thermal annealing (RTA) in an oxygen atmosphere at 700° C. In this manner, Sample 1 of a ferroelectric film was obtained. Crystallinity of Sample 1 was examined by X-ray diffraction. FIG. 13 shows the results. In FIG. 13, a graph indicated by the sign a indicates the result of the sample b of Embodiment Example 1 that used the solution after three weeks passed since its preparation, and a graph indicated by the sign b indicates the result of Sample 1 of the present embodiment.

Figure 54:
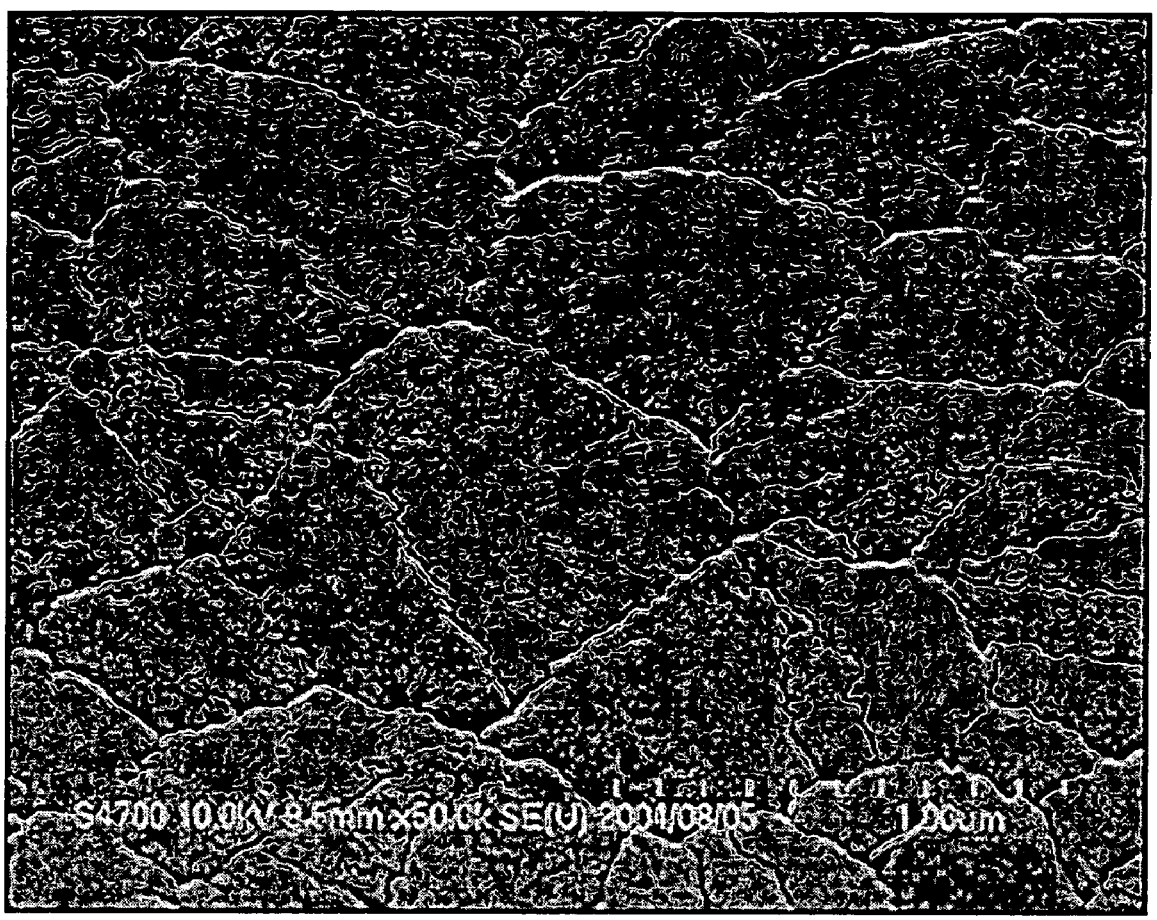
FIG. 54 is a picture showing a surface morphology of a PZTN film according to Embodiment Example 2 in accordance with the present embodiment.

It is observed from FIG. 13 that Sample 1 of the present embodiment example has excellent crystallinity equal to or better than that of the sample b of Embodiment Example 1. Also, the surface morphology of the ferroelectric film of Sample 1 was examined by SEM, and it was excellent as shown in FIG. 54.

Figure 14:
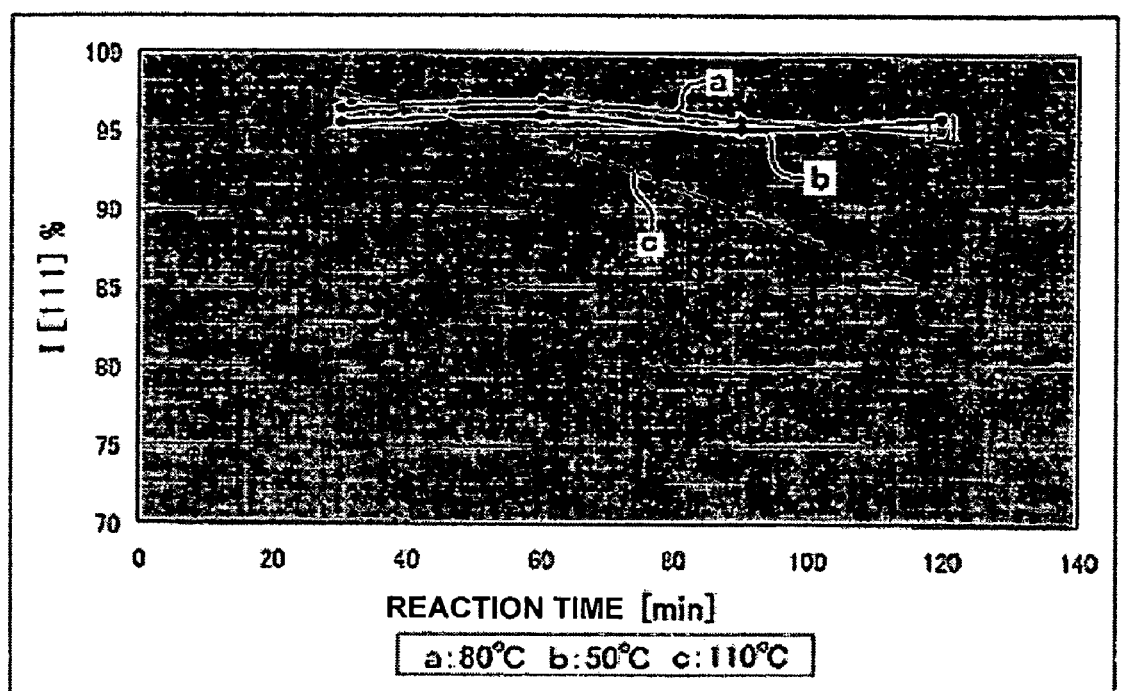
FIG. 14 is a graph showing the relation between crystallinity examined by X-ray diffraction, reaction temperatures and reaction times of samples of Embodiment Example 2 in accordance with the present embodiment example.

Samples 2 and 3 of ferroelectric films were obtained in a manner similar to the method described above except that the temperature of the solution was set to 50° C. and 110° C. FIG. 14 shows the relationship between crystallinity of each of Samples 1,2 and 3 obtained from their XRD patterns obtained by X-ray diffraction, reaction temperatures and reaction times. In FIG. 14, a graph indicated by the sign a indicates a sample at a temperature of 80° C., a graph indicated by the sign b indicates a sample at a temperature of 50° C., and a graph indicated by the sign c indicates a sample at a temperature of 110° C.

It is observed from FIG. 14 that, when the temperature for preparing the solution was 110° C., the crystallinity was inferior to the cases when the temperature was 50° C. and 80° C. In this case, it is believed that the alcohol solvent evaporated because the temperature was too high, which prevented esterification.

Figure 15A:
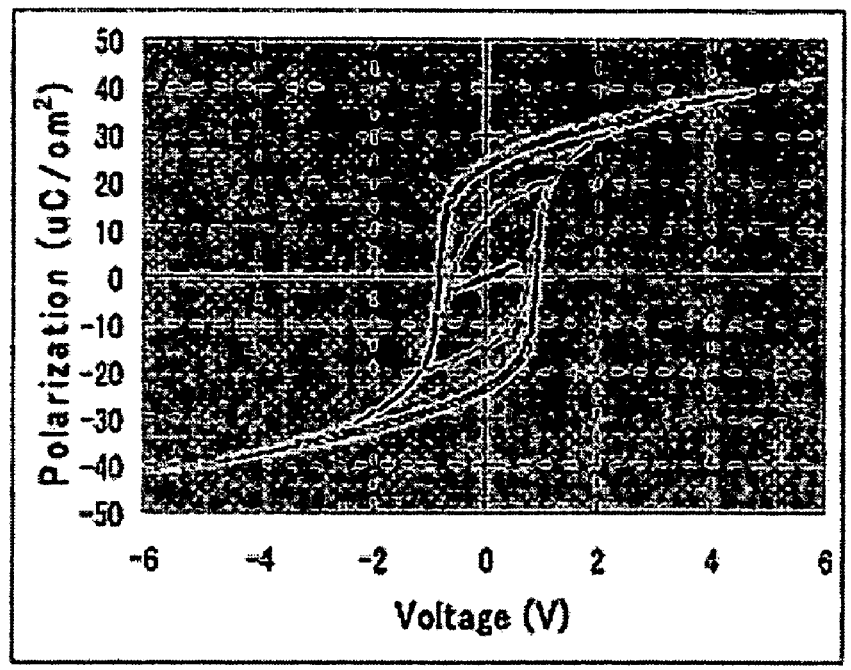
FIGS. 15A and 15B are graphs showing hysteresis characteristics of the samples of Embodiment Example 2 in accordance with the present embodiment example.
Figure 15B:
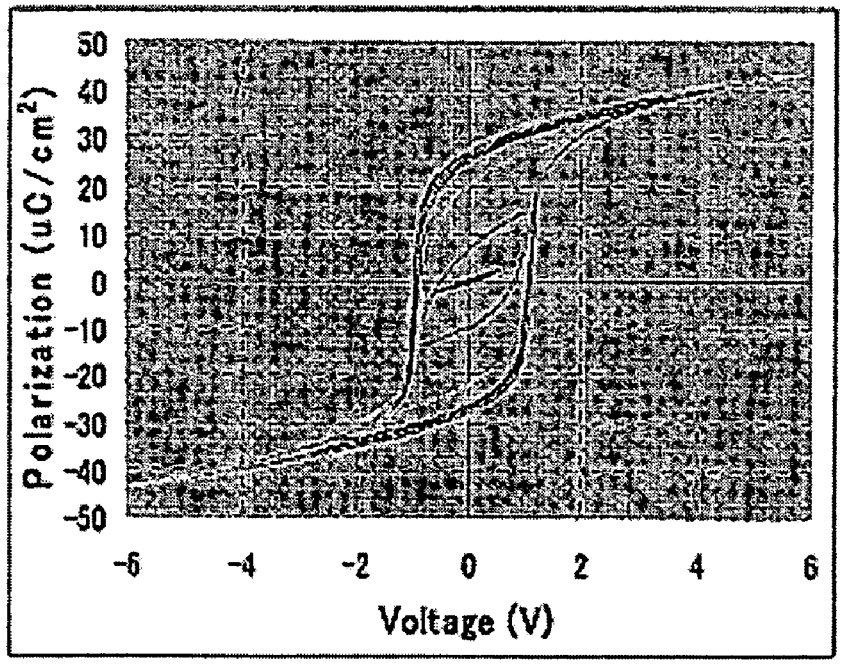

FIGS. 15(A) and (B) show hysteresis of samples obtained with different solution preparation conditions. FIG. 15(A) shows the result of the sample b of Embodiment Example 1 that used the solution after three weeks passed in normal temperature from the preparation of the solution, and FIG. 15(B) shows the result of Sample 1 of the present embodiment example. It was confirmed from FIG. 15 that both of them had excellent hysteresis characteristics.

Figure 37:
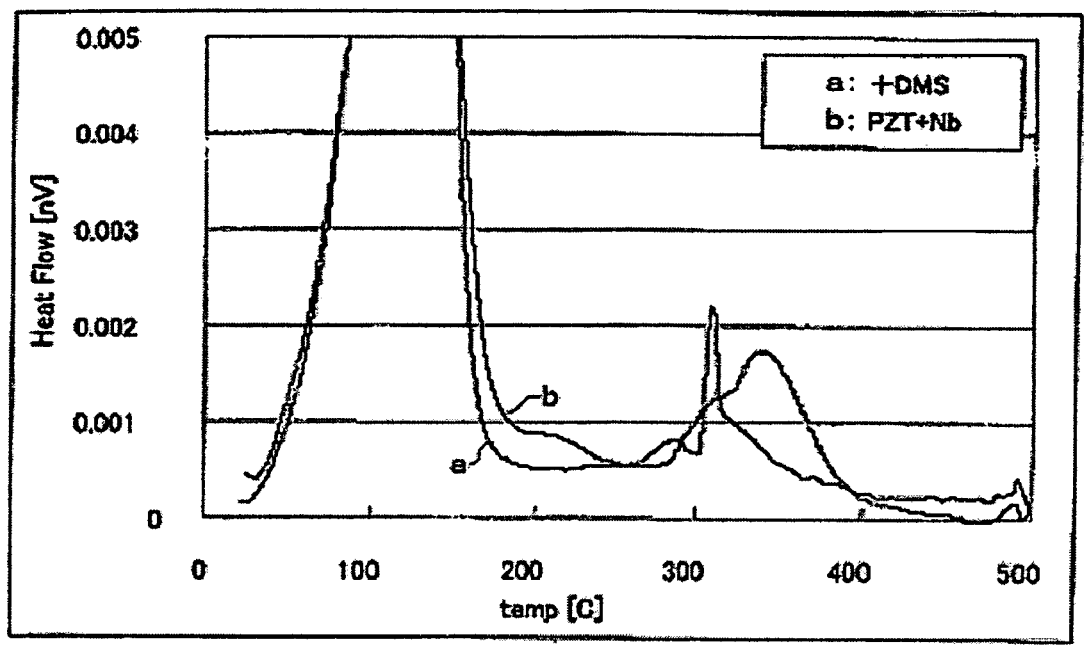
FIG. 37 is a graph showing results of differential thermal analysis of samples according to Embodiment Example 2 in accordance with the present embodiment.

Further, the decomposing process of the solution was examined by differential thermal analysis on Sample 1 of the present embodiment example and a sample of Comparison Example 1. In FIG. 37, a graph indicated by the sign a indicates the result of Sample 1 of the present embodiment example, and a graph indicated by the sign b indicates the result of a sample of Comparison Sample 1. Comparison Example 1 was prepared by adding niobate octylate in a commercially available sol-gel raw material for forming PZT to have the same compositions as those of the present embodiment example.

It was confirmed from FIG. 37 that Sample 1 of the present embodiment example had a steep peak existing around about 300° C. This is believed to occur because the raw material solution of the present embodiment example includes a precursor in which esterification progresses and carboxyl groups are regularly arranged, and the precursor has organic chains whose decomposition energy is regular such that the decomposition progresses at a burst. In contrast, in the sample of Comparison Example 1, it is observed that its peak is broad, and its decomposition energy of organic chains is not regular, such that the chemical structure of the precursor is not uniform.

(3) Embodiment Example 3

In the present embodiment example, PZTN obtained in accordance with the present invention and conventional PZT are compared. The solution for forming a film is the same as Embodiment Example 2. Concretely, the first to fourth raw material liquids and dimethyl succinate were dissolved in n-buthanol, and then retained at a temperature of 80° C. for one hour, whereby a solution (precursor composition) was prepared. Compositions of the solution are as follows.

The ratio of Pb:Zr:Ti:Nb was set at 1:0.2:0.6:0.2. $PbSiO_3$ was added here by 0 mol %, 0.5 mol % and 1 mol %, respectively.

Figure 16A:
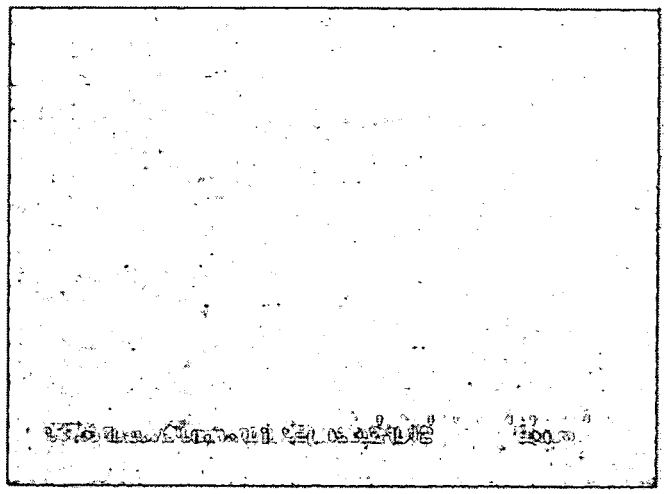
FIGS. 16A-16C are pictures showing surface morphologies of PZTN films of Embodiment Example 3 in accordance with the present embodiment.
Figure 16B:
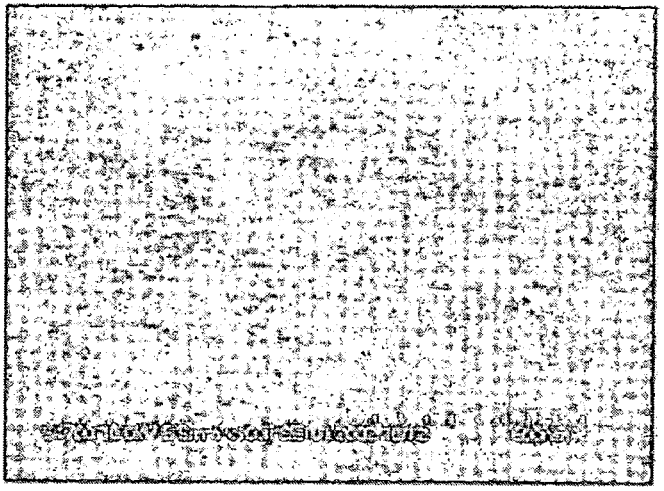
Figure 16C:
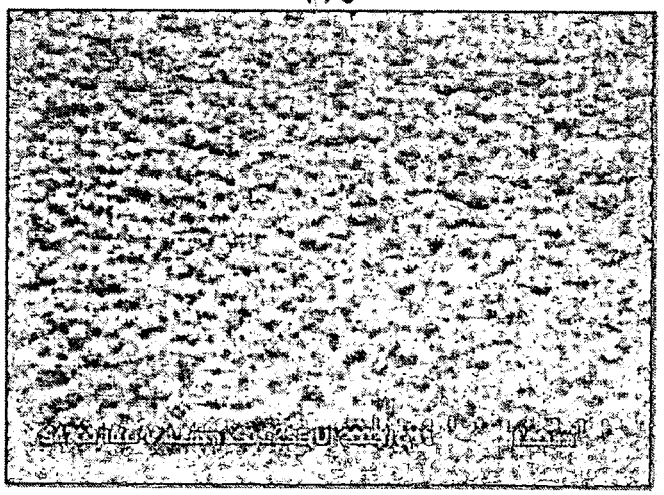
Figure 17C:
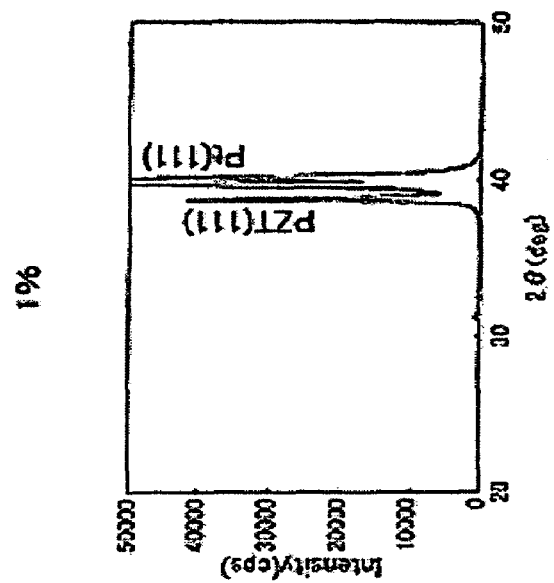
FIGS. 17A-17C are graphs showing crystallinity of the PZTN films of Embodiment Example 3 in accordance with the present embodiment.
Figure 17B:
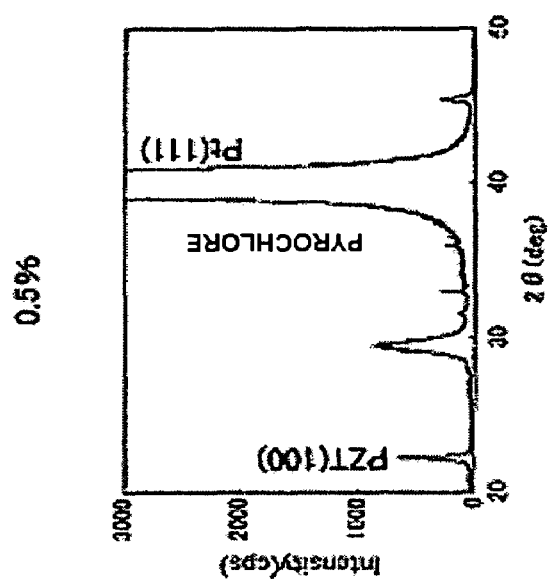
Figure 17A:
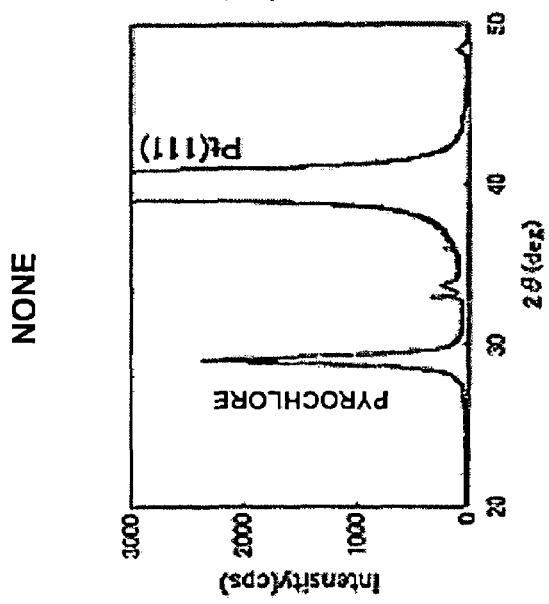

Surface morphologies of the films obtained are shown in FIGS. 16(A)-16(C). Also, the crystallinity of the films was measured by an X-ray diffraction method, and the results shown in FIGS. 17(A)-17(C) were obtained. In the case of 0% (none) of silicate shown in FIG. 17(A), paraelectric pyrochlore alone was obtained even when the crystallization temperature was raised to 800° C. In the case of 0.5 mol % of silicate shown in FIG. 17(B), PZT and pyrochlore were present in a mixed state. Also, in the case of 1 mol % of silicate shown in FIG. 17(C), a single oriented film of PZT (111) was obtained, and its crystallinity was excellent to a level that had never been achieved.

Figure 18A:
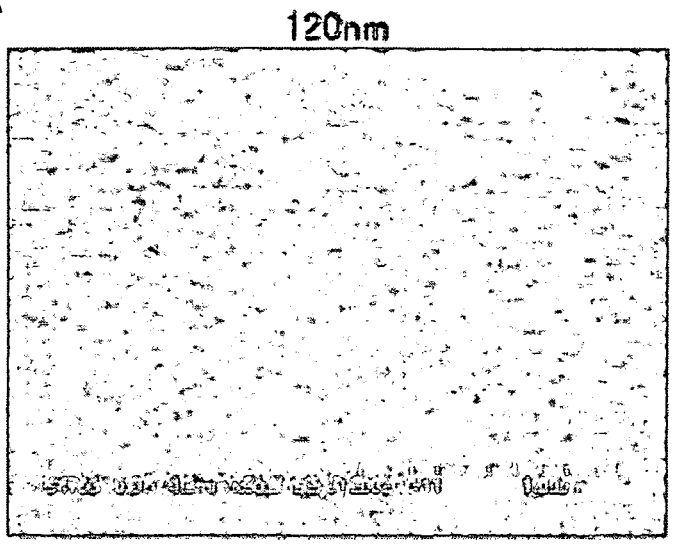
FIGS. 18A-18C are pictures showing the relation between the film thickness of the PZTN films and their surface morphologies of Embodiment Example 3 in accordance with the present embodiment.
Figure 18B:
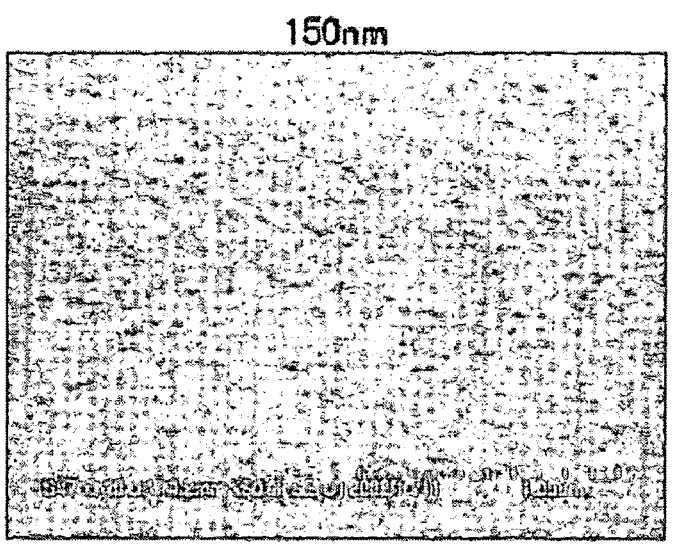
Figure 18C:
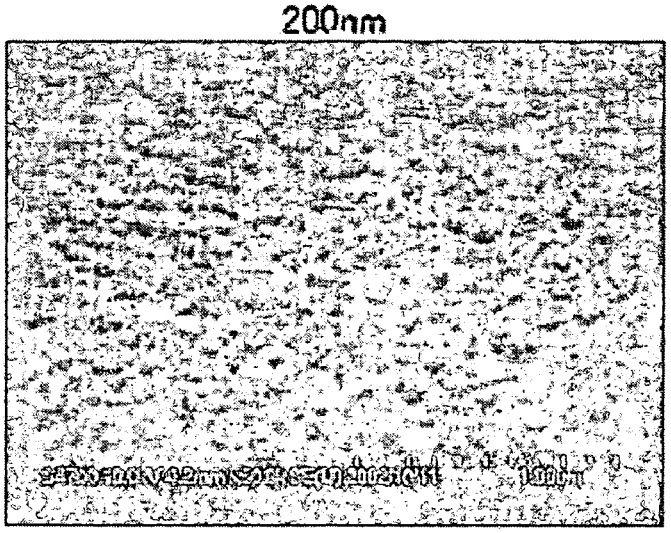
Figure 19A:
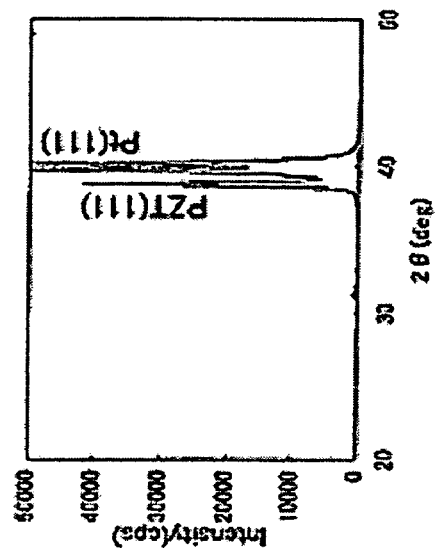
FIGS. 19A-19C are graphs showing the relation between the film thickness of the PZTN films and their crystallinity of Embodiment Example 3 in accordance with the present embodiment.
Figure 19B:
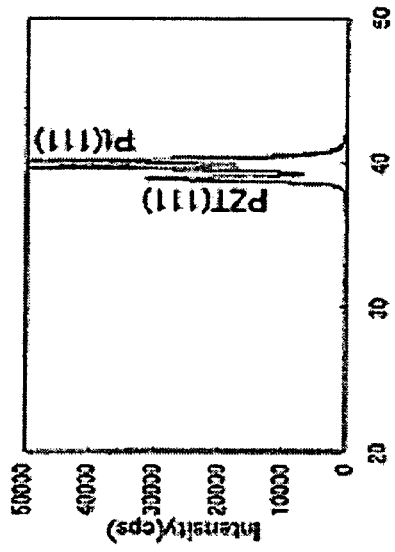
Figure 19C:
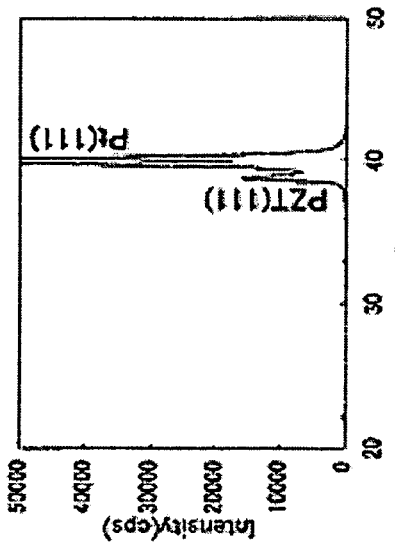
Figure 20A:
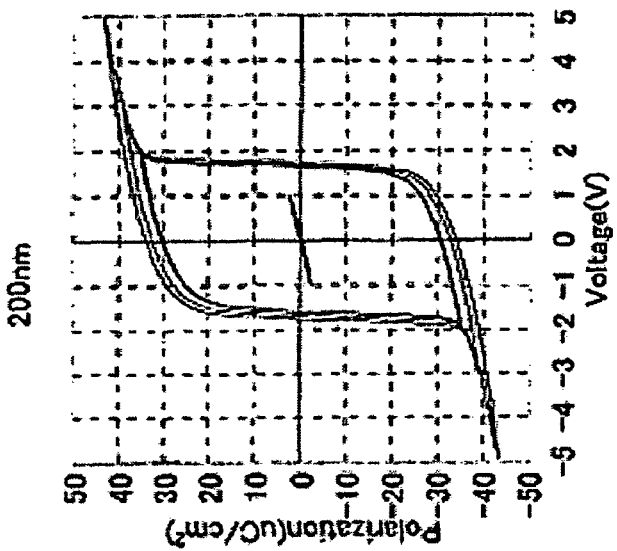
FIGS. 20A-20C are graphs showing hysteresis characteristics for film thicknesses of the PZTN films of Embodiment Example 3 in accordance with the present embodiment.
Figure 20B:
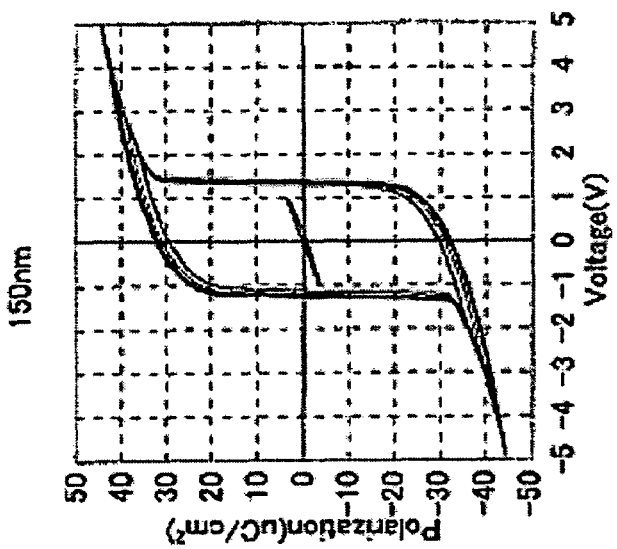
Figure 20C:
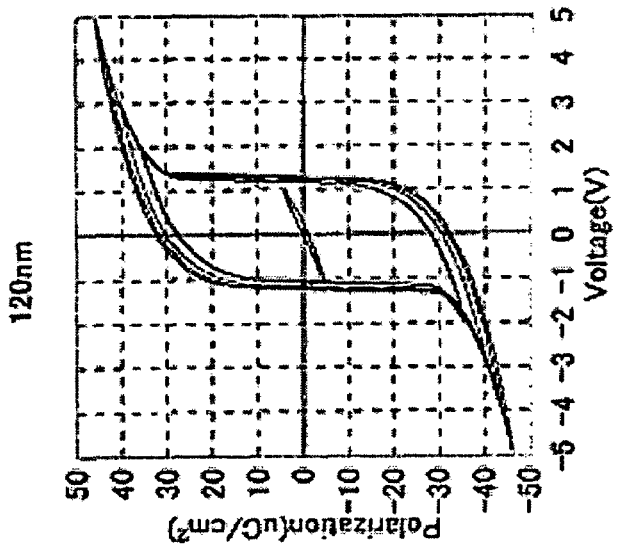
Figure 21C:
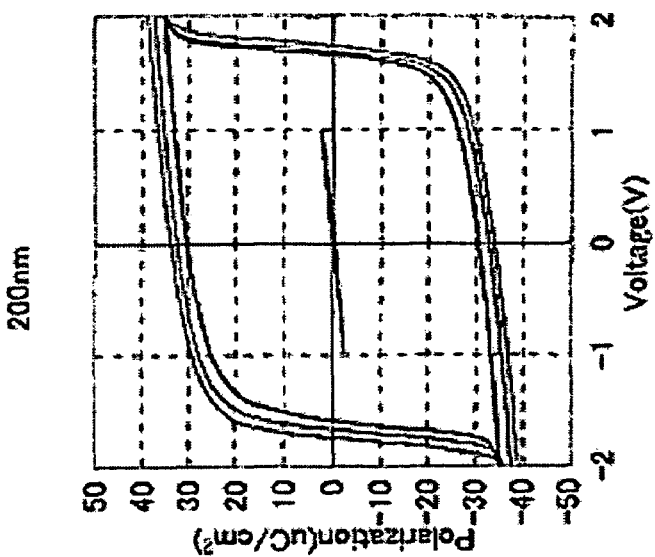
FIGS. 21A-21C are graphs showing hysteresis characteristics for film thicknesses of the PZTN films of Embodiment Example 3 in accordance with the present embodiment.
Figure 21B:
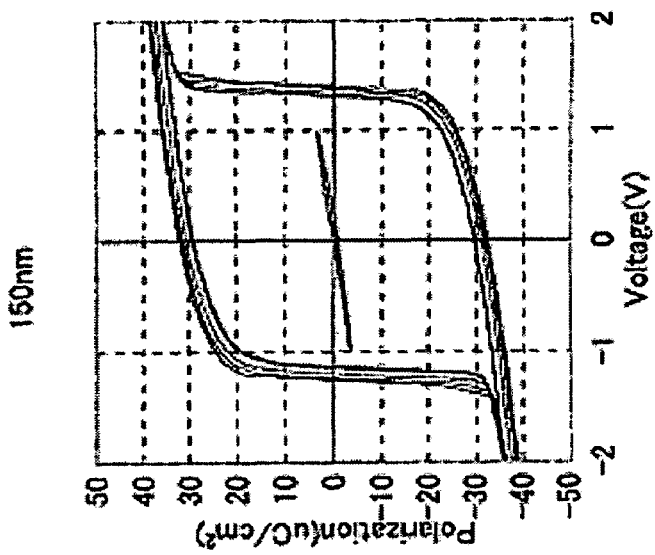
Figure 21A:
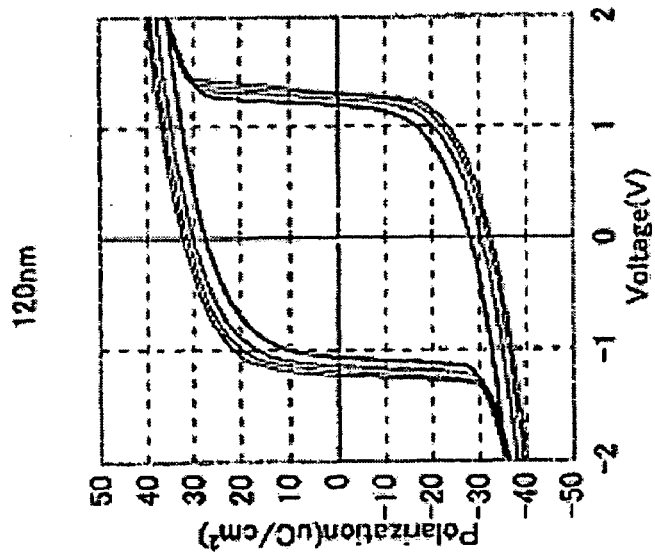

Next, PZTN thin films in which $PbSiO_3$ was added by 1 mol % were formed in film thickness ranging from 120 nm to 200 nm. As shown in FIGS. 18(A)-18(C) and FIGS. 19(A)-19(C), the levels of crystallinity proportional to the respective film thickness were exhibited. It is noted that FIGS. 18(A)-18(C) are electron micrographs showing the surface morphologies for the film thickness ranging from 120 nm to 200 nm, and FIGS. 19(A)-19(C) show the results of measurements conducted by an X-ray diffraction method showing the crystallinity of PZTN thin films having the film thickness ranging from 120 nm to 200 nm. As shown in FIGS. 20(A)-20(C) and FIGS. 21(A)-21(C), hysteresis characteristics with good squareness were obtained over the entire range of film thickness from 120 nm to 200 nm. It is noted that FIGS. 21(A)-21(C) are enlarged views of the hysteresis curves of FIGS. 20(A)-20(C). In particular, as shown in FIGS. 21(A)-21(C), it was confirmed that, in the ZPTN thin films of the present examples, the hysteresis clearly opened up and also reached saturation at low voltages at 2 V or less.

Figure 22B:
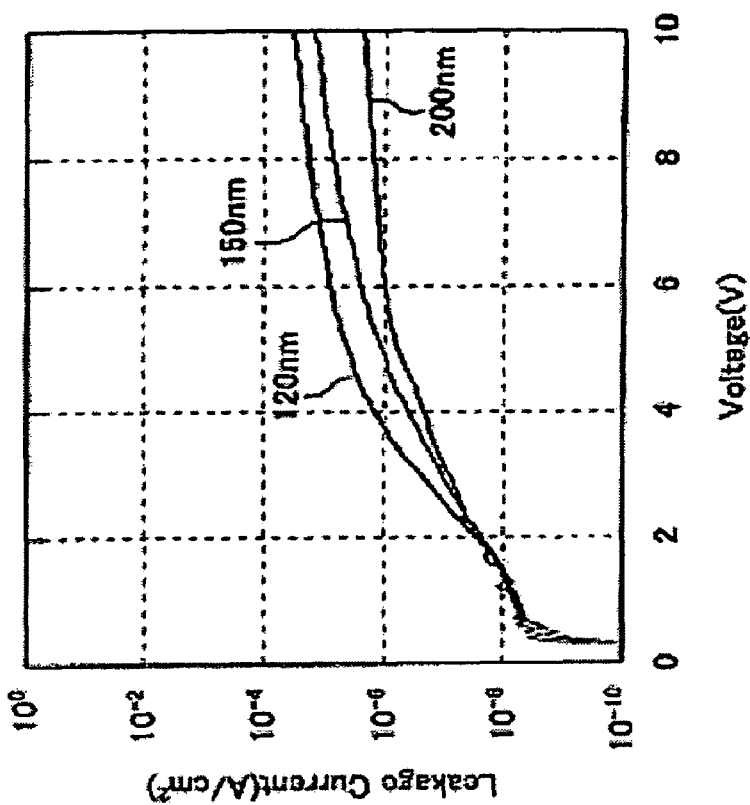
FIGS. 22A and 22B are graphs showing leakage current characteristics of the PZTN films of Embodiment Example 3 in accordance with the present embodiment.
Figure 22A:
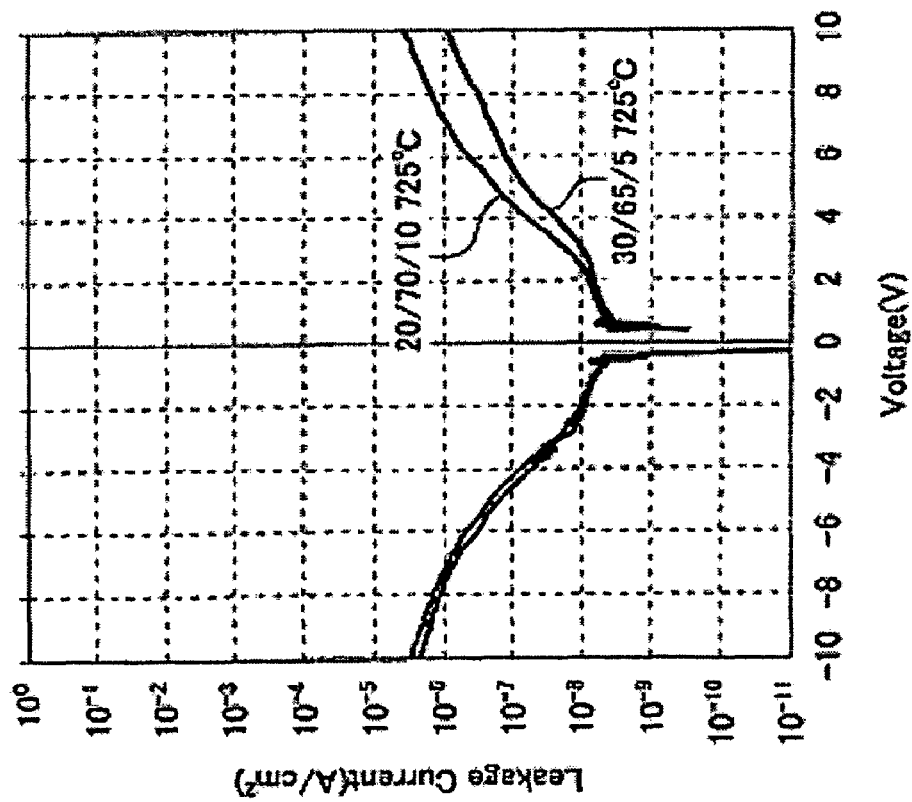

Also, the leakage characteristics were very good at $5 \times 10^{-8}$ to $7 \times 10^{-9}$ $A/cm^2$ when 2 V was applied thereto (at the time of saturation), regardless of the film composition and film thickness, as shown in FIG. 22(A) and FIG. 22(B).

Figure 23A:
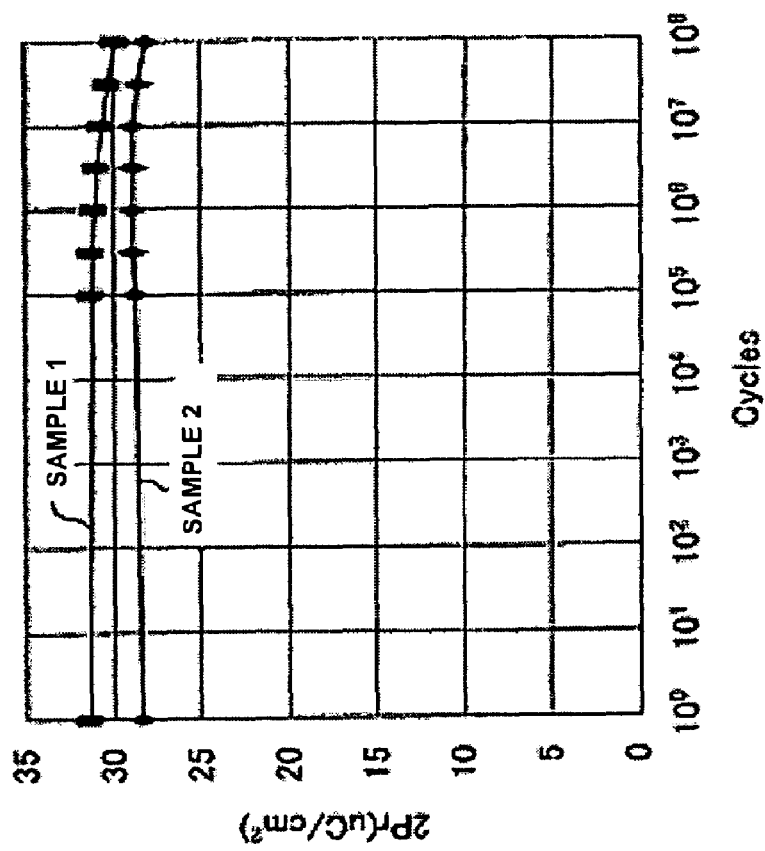
FIGS. 23A and 23B are graphs showing fatigue characteristics and static imprint characteristics of the PZTN films of Embodiment Example 3 in accordance with the present embodiment.
Figure 23B:
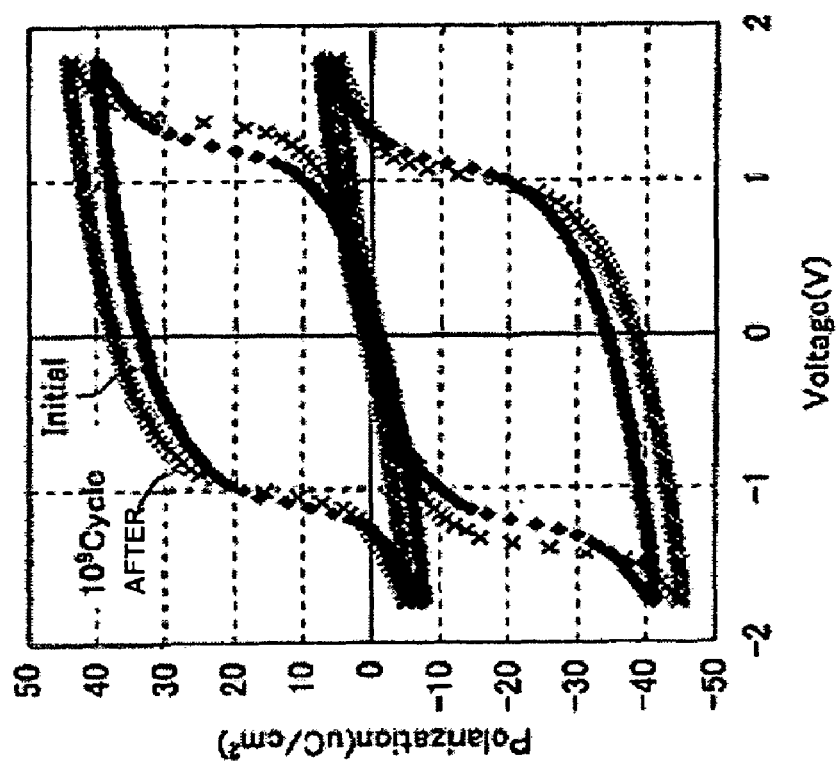

Next, the fatigue characteristics and static imprinting of $PbZr_{0.2}Ti_{0.6}Nb_{0.2}O_3$ thin films were measured, and the results of measurements were also very good, as shown in FIG. 23(A) and FIG. 23(B). In particular, the fatigue characteristics shown in FIG. 23(A) are excellent, despite that Pt is used in the upper and lower electrodes.

Figure 24:
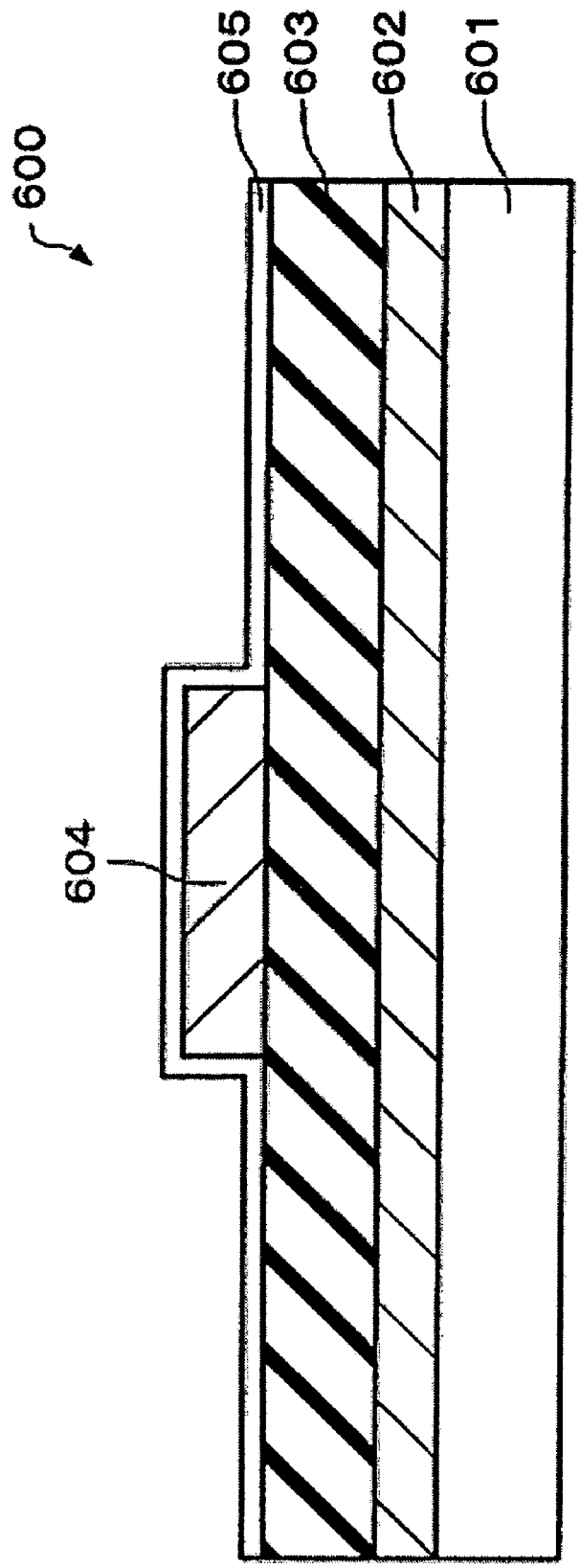
FIG. 24 is a view showing a capacitor structure after a $SiO_2$ protection film with ozone TEOS has been formed according to Embodiment Example 3 in accordance with the present embodiment.

Further, as shown in FIG. 24, attempts were made to form a $SiO_2$ film 604 with ozone TEOS on a ferroelectric capacitor 600 including a lower electrode 602, a PZTN ferroelectric film 603 of the present embodiment example, and an upper electrode 605 formed over a substrate 601. It is known in the art that, if a $SiO_2$ film is formed with ozone TEOS on PZT, hydrogen generated from the TEOS penetrates the upper Pt and reduces the PZT, such that the PZT crystal is destroyed to the extent that the hysteresis phenomenon does not occur at all.

Figure 25:
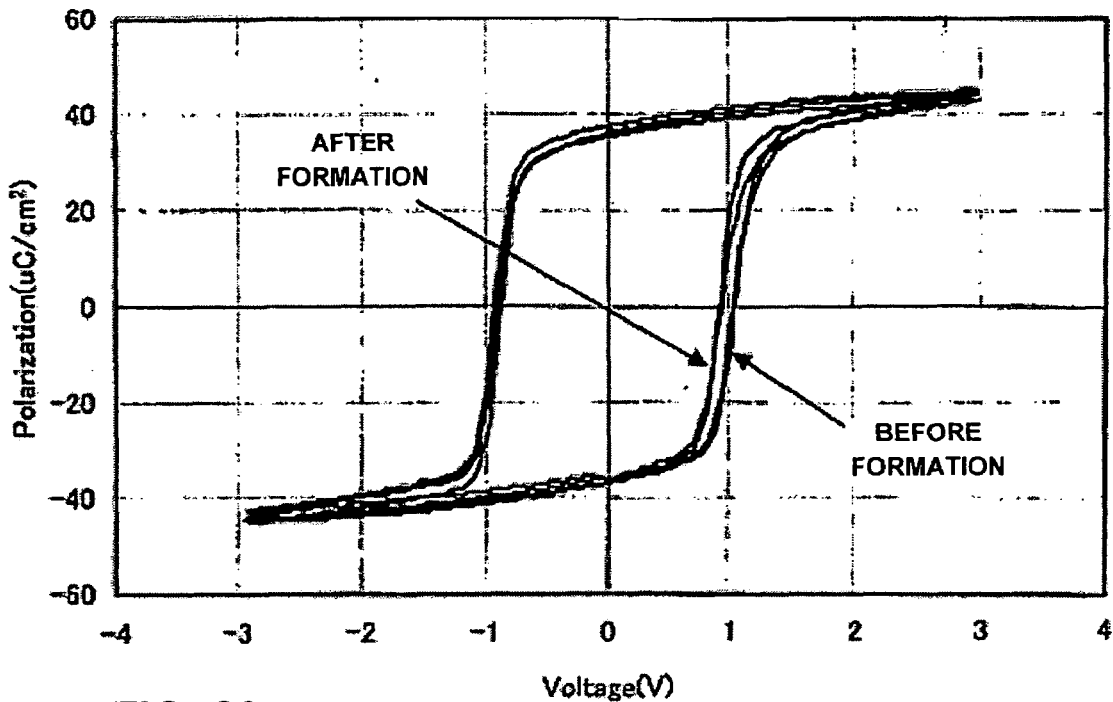
FIG. 25 is a graph showing hysteresis characteristics of a capacitor after a $SiO_2$ protection film with ozone TEOS has been formed according to Embodiment Example 3 in accordance with the present embodiment.

With the PZTN ferroelectric film 603 of the present embodiment example, however, favorable hysteresis is maintained with substantially no deterioration, as shown in FIG. 25. In other words, it is found that the PZTN ferroelectric film 603 of the present embodiment example also has a strong resistance to reduction. When Nb in the tetragonal PZTN ferroelectric film 603 of the present invention did not exceed 40 mol %, favorable hysteresis in proportion to the quantity of Nb added was obtained.

Figure 26:
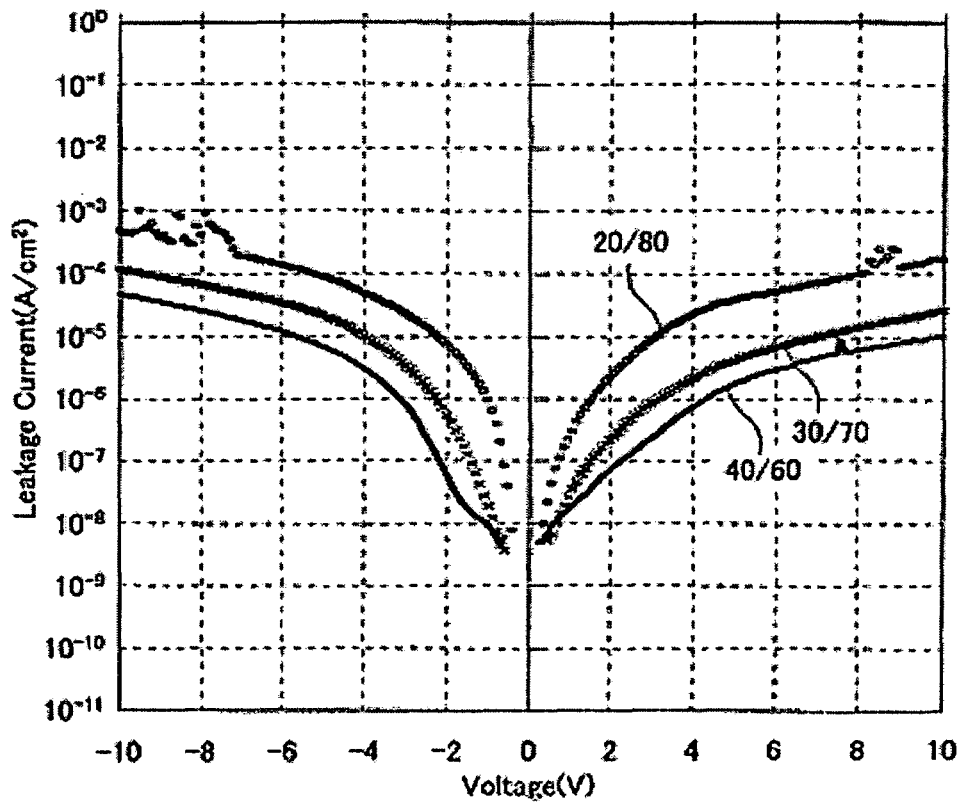
FIG. 26 is a graph showing leakage current characteristics of conventional PZT films, considered in Embodiment Example 3 in accordance with the present embodiment.
Figure 27:
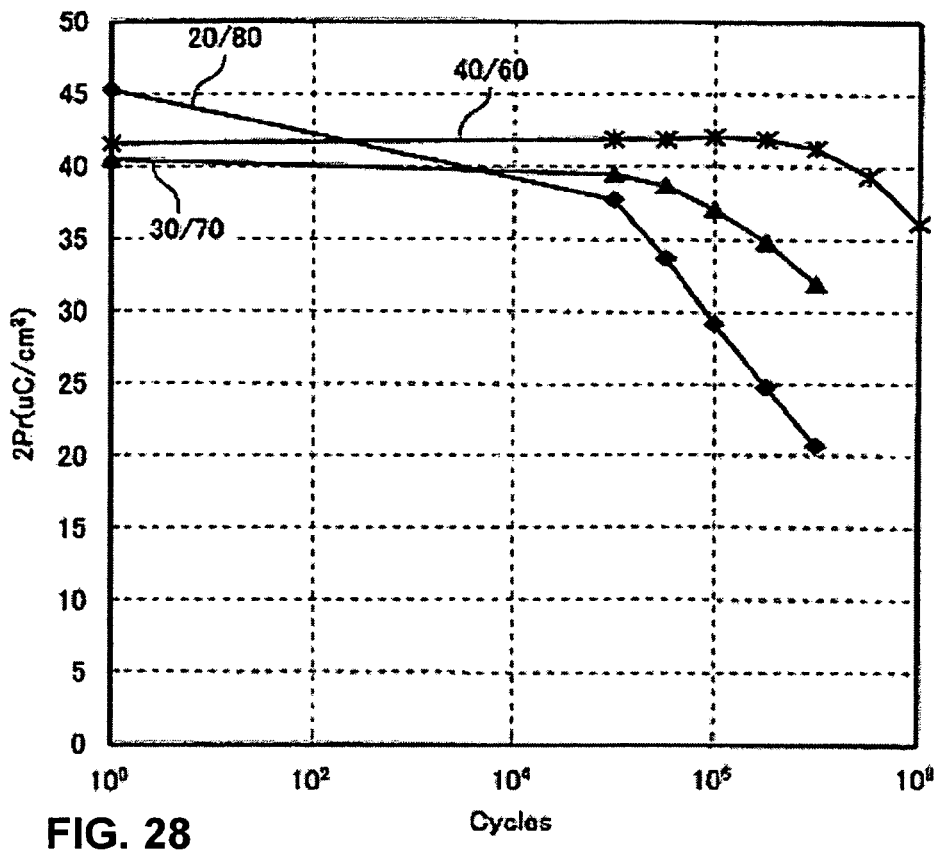
FIG. 27 is a graph showing fatigue characteristics of conventional PZT capacitors, considered in Embodiment Example 3 in accordance with the present embodiment.
Figure 28:
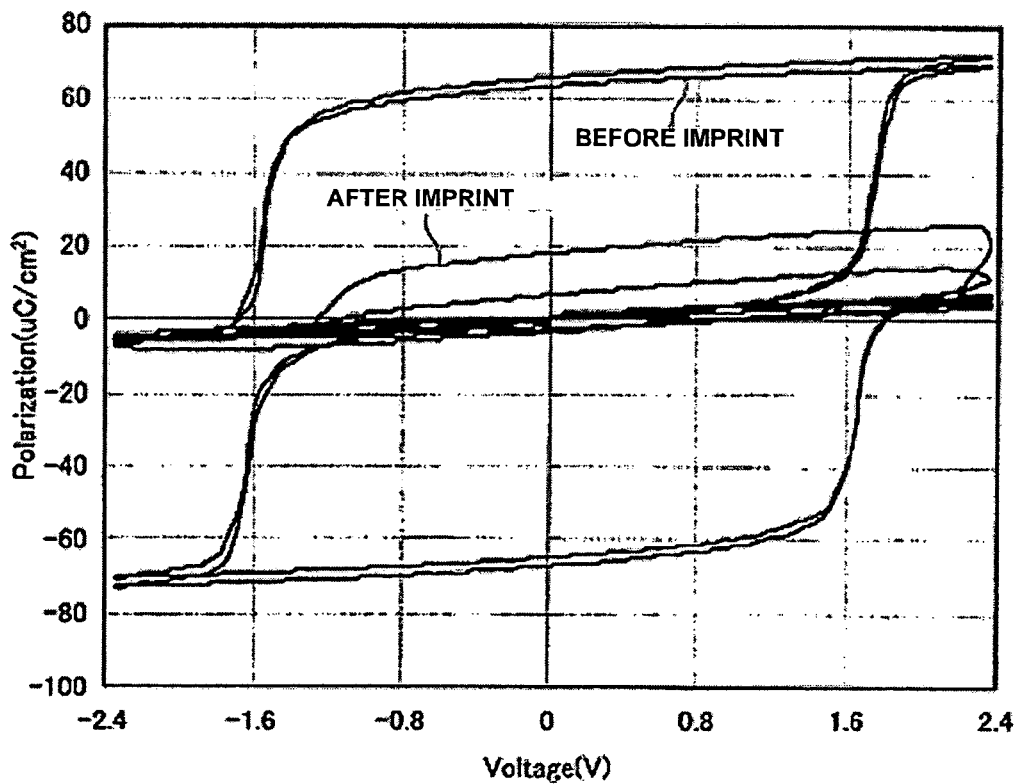
FIG. 28 is a graph showing static imprint characteristics of conventional PZT capacitors, considered in Embodiment Example 3 in accordance with the present embodiment.

Evaluation of conventional PZT ferroelectric films was conducted for comparison. The conventional PZT samples were set to Pb:Zr:Ti ratios of 1:0.2:0.8, 1:0.3:0.7, and 1:0.6: 0.4. As to the leakage characteristics thereof, it was found that the leakage characteristics deteriorated with increasing Ti content, as shown in FIG. 26, and became to be $10^{-5}$ A/cm$^2$ when Ti content was 80% and 2V was applied, making it unsuitable for memory applications. Similarly, the fatigue characteristics deteriorated with increasing Ti content, as shown in FIG. 27. After imprinting, it was found that the data could hardly be read out, as indicated in FIG. 28.

As is clear from the above-described embodiment examples, the PZTN ferroelectric films formed by using the solution (precursor composition) in accordance with the present embodiment examples not only solved the problems of increase in leakage current and deterioration in imprint characteristics, which were thought to be intrinsic to PZT in the conventional art, but also made it possible to use tetragonal PZT, which had not been used for the reasons described above, in memory usages regardless of the memory type or configuration. In addition, the material of the present embodiment can also be applied to piezoelectric element usages in which tetragonal PZT was not used before for the same reasons.

(4) Embodiment Example 4

The present embodiment example compares the ferroelectric characteristics obtained when the amount of Nb added to the PZTN ferroelectric film was varied from 0, 5, 10, 20, 30 to 40 mol %. PbSiO$_3$ silicate was added by 5 mol % to all of the test pieces. In addition, the solution (precursor composition) was prepared in a manner similar to Embodiment Example 2, and dimethyl succinate and n-buthanol as an organic solvent were used.

Measured hysteresis characteristics of PZTN ferroelectric films in accordance with the present embodiment example are shown in FIG. 29-FIG. 31.

Figure 29A:
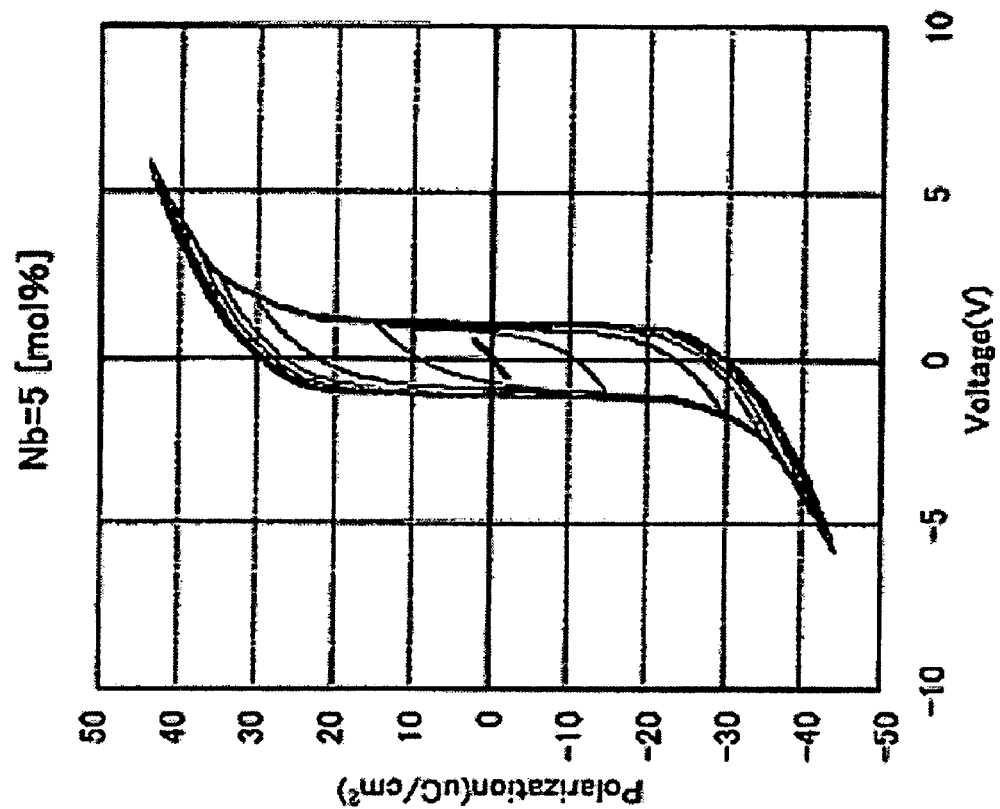
FIGS. 29A and 29B are graphs showing hysteresis characteristics of PZTN films according to Embodiment Example 4 in accordance with the present embodiment.
Figure 29B:
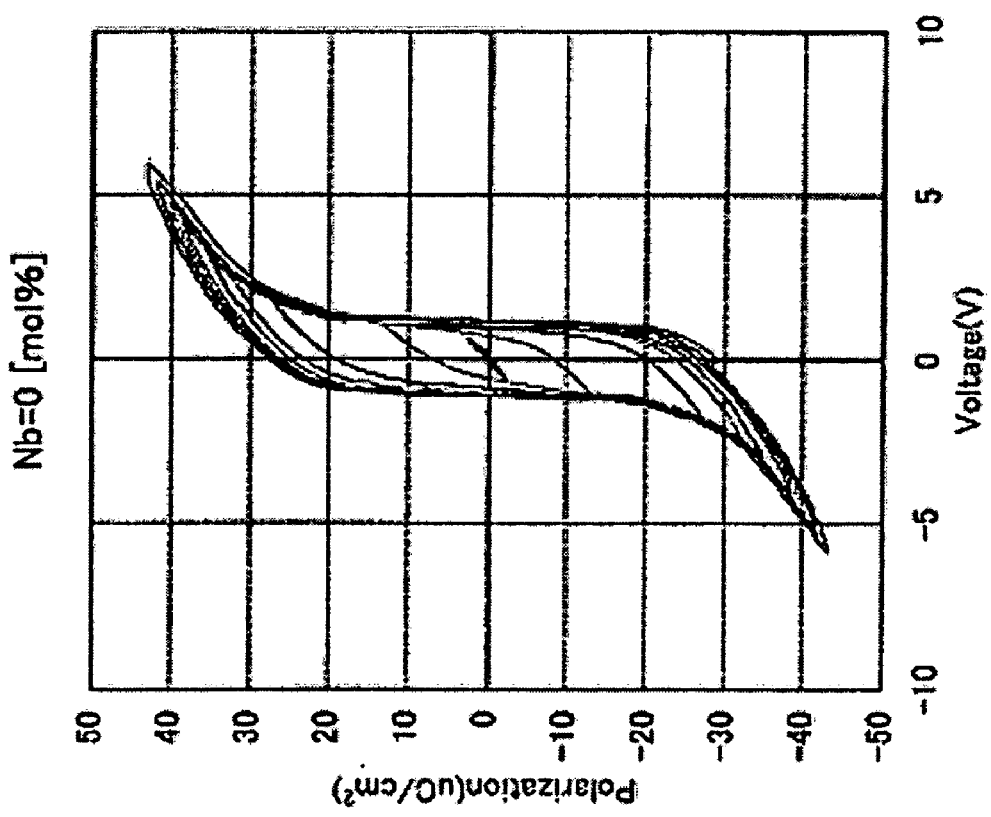

As indicated in FIG. 29(A), when the amount of Nb added was 0, a leaky hysteresis was obtained, whereas, as indicated in FIG. 29(B), a good hysteresis characteristic with a high level of insulation was obtained when the amount of Nb added was 5 mol %.

Figure 30B:
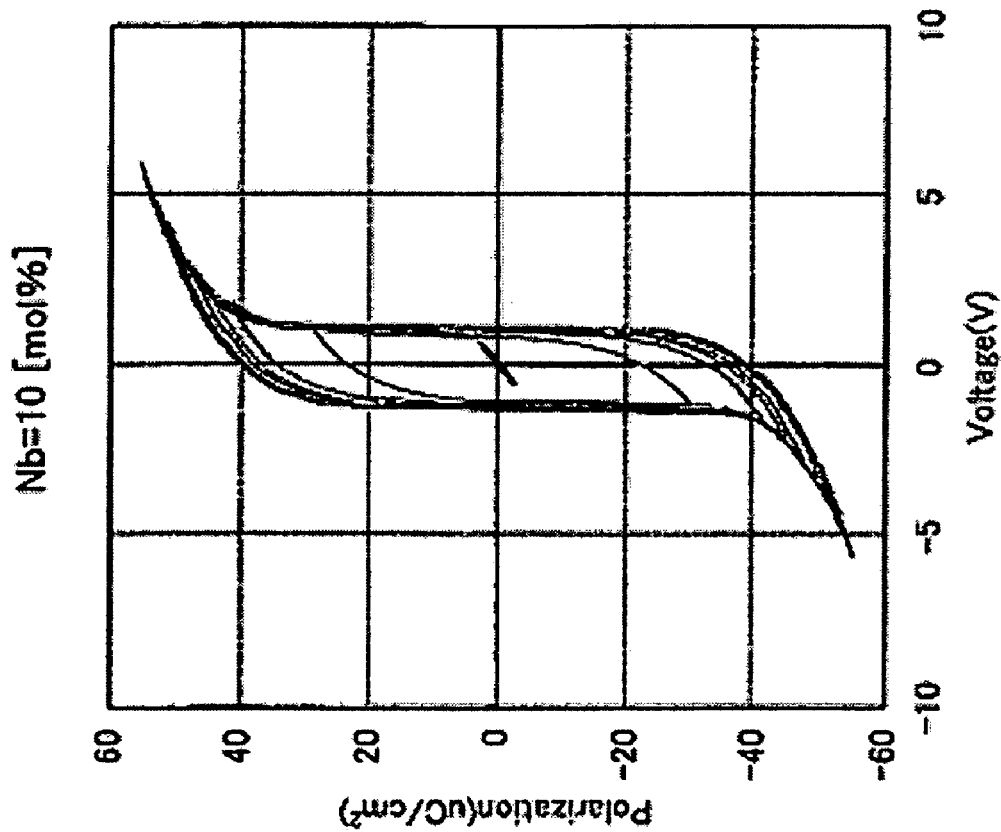
FIGS. 30A and 30B are graphs showing hysteresis characteristics of PZTN films according to Embodiment Example 4 in accordance with the present embodiment.
Figure 30A:
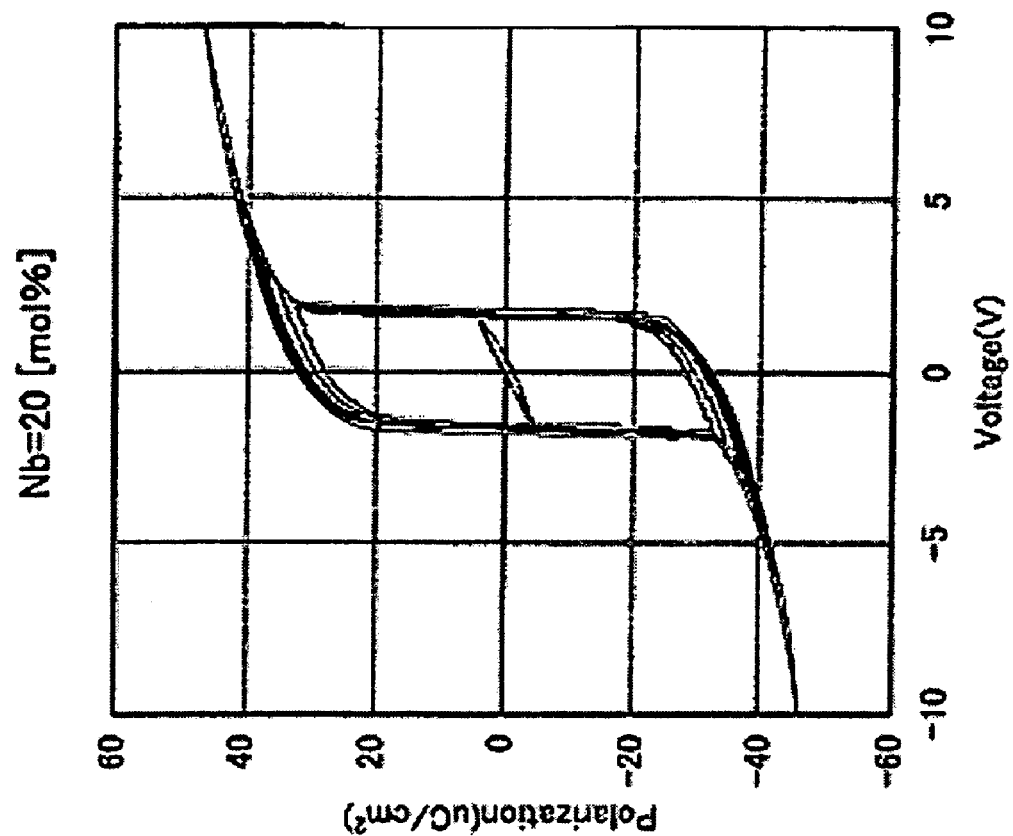

Also, as indicated in FIG. 30(A), substantially no change was observed in the ferroelectric characteristic until the amount of Nb added reached 10 mol %. Even when the amount of Nb added was 0, no change was observed in the ferroelectric characteristic, thought it was leaky. When the amount of Nb added was 20 mol %, a hysteresis characteristic with an excellent squareness was obtained, as indicated in FIG. 30(B).

Figures 31A, 31B:
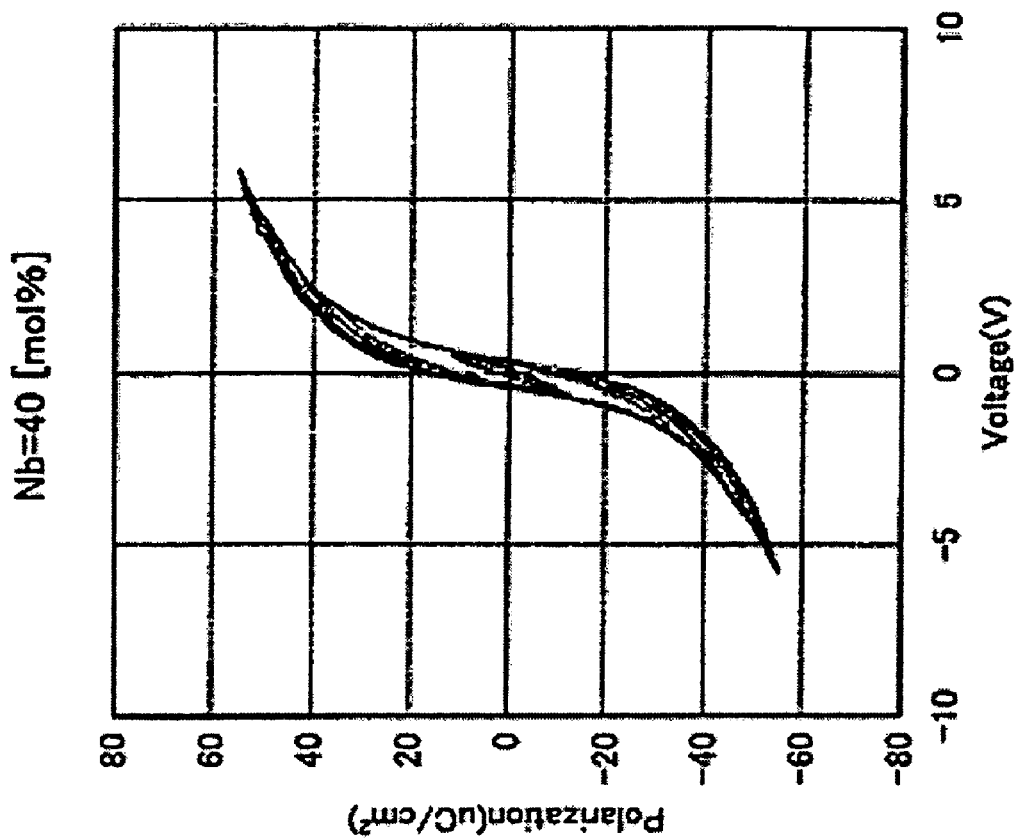
FIGS. 31A and 31B are graphs showing hysteresis characteristics of PZTN films according to Embodiment Example 4 in accordance with the present embodiment.

However, it was confirmed that when the amount of Nb added exceeded 20 mol %, the hysteresis characteristic greatly changed and became deteriorated, as indicated in FIG. 31(A) and FIG. 31(B).

Figure 32:
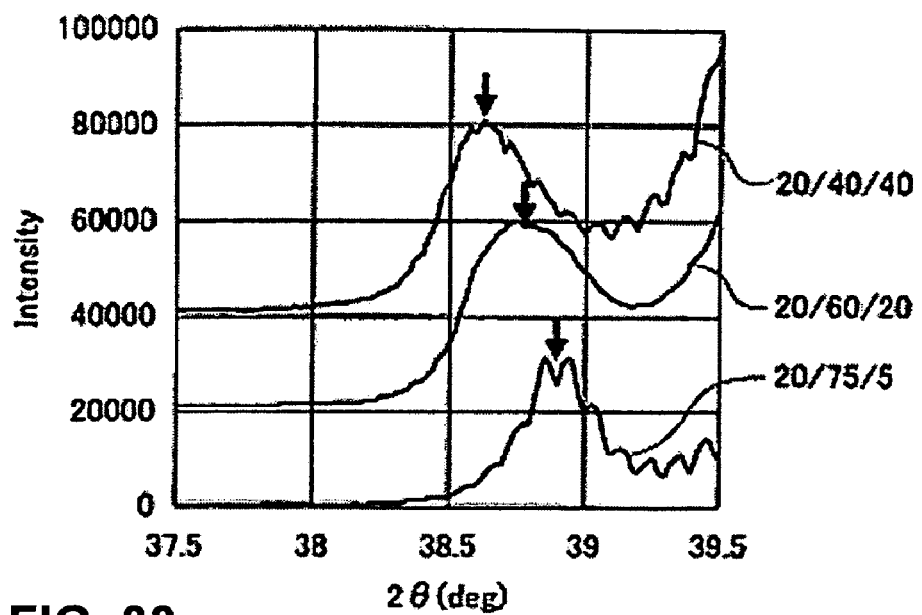
FIG. 32 is a graph showing X-ray diffraction patterns of PZTN films according to Embodiment Example 4 in accordance with the present embodiment.

Then, X-ray diffraction patterns were compared, as shown in FIG. 32. When the amount of Nb added was 5 mol % (Zr/Ti/Nb=20/75/5), the (111) peak position did not change from that of a PZT film of the conventional art in which no Nb is added, but the (111) peak shifted towards a lower angle side as the amount of Nb added was increased to 20 mol % (Zr/Ti/Nb=20/60/20) and to 40 mol % (Zr/Ti/Nb=20/40/40). In other words, it was found that the actual crystal was rhombohedral, although the PZT composition was Ti-rich and in a tetragonal region. It was also observed that the ferroelectric characteristics changed as the crystal system changed.

In addition, when Nb was added by 45 mol %, a hysteresis did not open and ferroelectric characteristics could not be confirmed (not shown).

Figure 33:
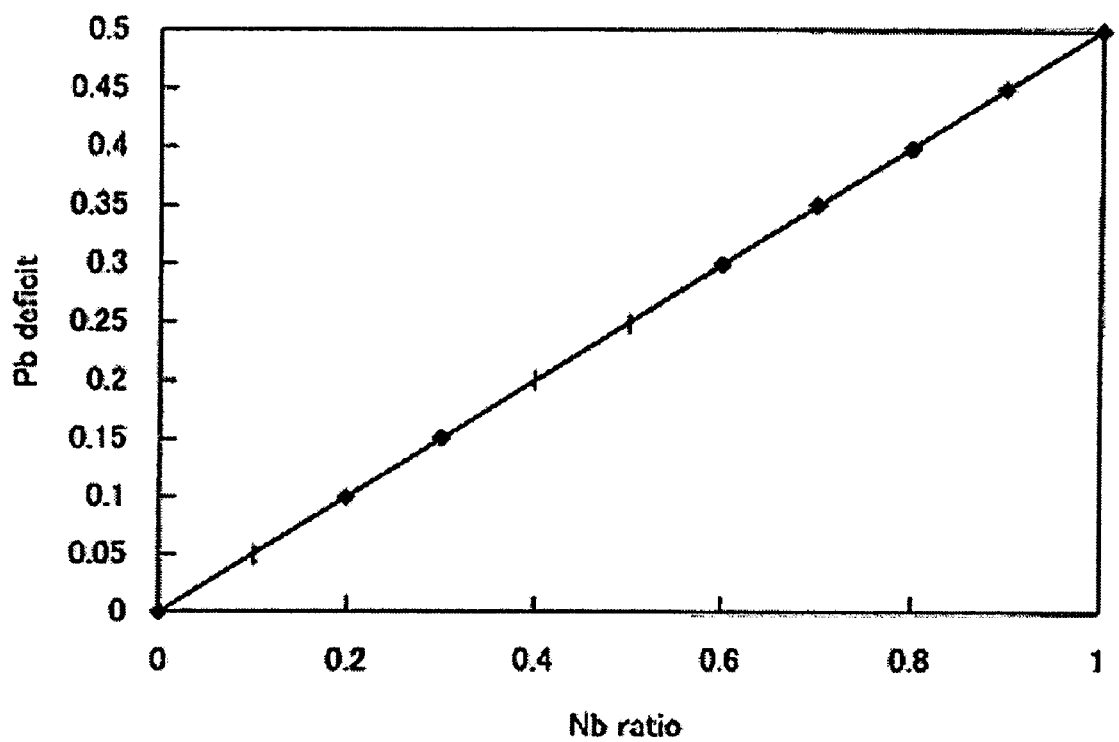
FIG. 33 is a graph showing the relation between Pb vacancy amount and Nb composition ratio in PZTN films according to Embodiment Example 4 in accordance with the present embodiment.

PZTN films of the present invention have a very high level of dielectric property, as already mentioned above. In this respect, conditions for PZTN to be dielectric were obtained, and the results shown FIG. 33 were obtained.

Figure 34:
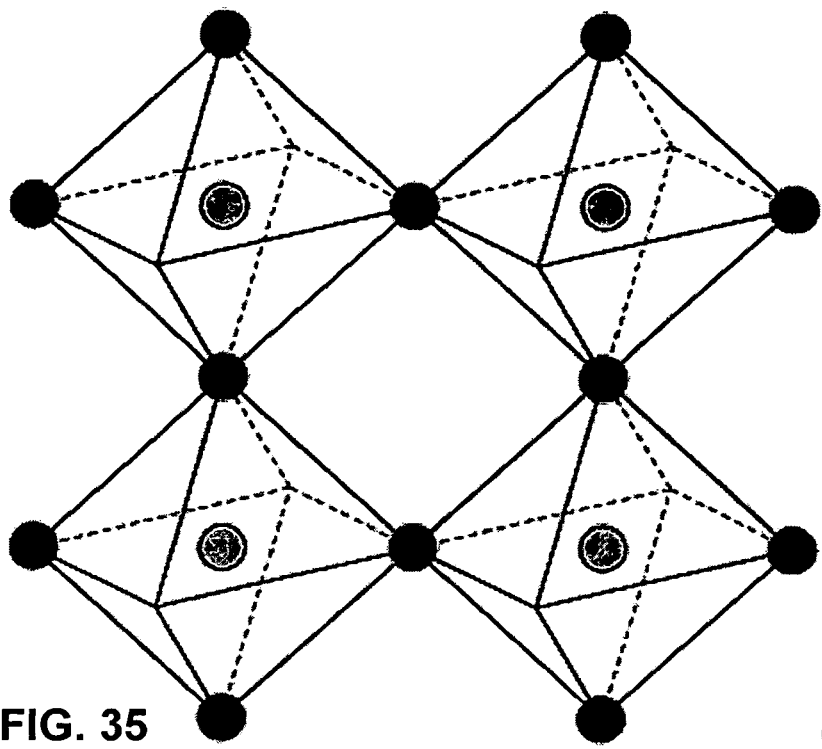
FIG. 34 is a diagram for describing the crystal structure of $WO_3$ that is a perovskite crystal.

That is, the PZTN films of the present invention have a very high level of dielectric property, which means that Nb is added to the Ti site in a composition ratio equivalent to twice the amount of vacancies of Pb. Also, a perovskite crystal can be established even when 100% of A site ions are vacated, as understood from the crystal structure of WO$_3$ shown in FIG. 34, and it is known that the crystal system of WO$_3$ would readily change.

Accordingly, in the case of PZTN, the addition of Nb enables active control of Pb vacancy, and also controls the crystal system.

This indicates that the PZTN film of the present embodiment would also be very useful when applied to piezoelectric elements, for example, actuators, ink jet heads and the like. In general, when PZT is applied to piezoelectric elements, a rhombohedral crystal region with a Zr-rich composition is used. In this case, Zr-rich PZT is called soft PZT. This literally means that the crystal is soft. For example, when soft PZT is used in a nozzle that ejects ink in an inkjet printer, ink having a high viscosity cannot be pushed out because soft PZT is too soft and gives way to pressure of the ink.

Ti-rich tetragonal PZT, on the other hand, is called hard PZT, which means to be hard and brittle. However, while the PZTN film of the present invention is hard, the crystal system can be artificially changed into rhombohedral. In addition, the crystal system can be arbitrarily changed by the amount of Nb to be added and a Ti-rich PZT-system ferroelectric film has a small relative dielectric constant, such that devices can be driven at a low voltage.

This makes it possible to use hard PZT in applications where it could not be used previously, such as, in ink ejection nozzles of an inkjet printer. In addition, since Nb makes PZT softer, it is possible to provide PZT that is adequately hard, but not brittle.

As described above, in the precursor composition in accordance with the present embodiment example, it is confirmed that the crystallization temperature can be reduced by adding not only Nb, but also adding silicate at the same time with the addition of Nb.

(5) Comparison Example 1

For comparison, monocarboxylic acid ester was used instead of dimethyl succinate used in Embodiment Example 2.

Concretely, in Embodiment Example 2, a solution with methyl acetate added, instead of dimethyl succinate, by 0.35 mol % was formed, then it was spin-coated on a Pt electrode substrate, and it was sintered in an oxygen atmosphere at 650°

C. for 5 minutes, whereby a ceramic thin film for comparison having a thickness of 150 nm was formed.

Figure 35:
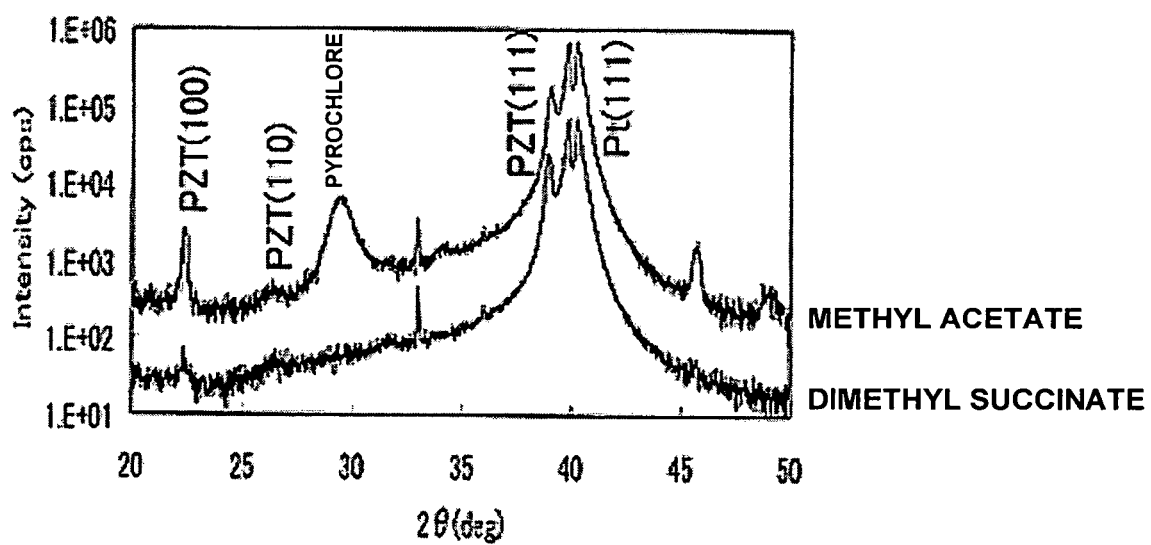
FIG. 35 is a graph showing X-ray diffraction patterns of samples of comparison example in accordance with the present embodiment.

Crystallinity of the comparison sample was examined by X-ray diffraction. As a result, as shown in FIG. 35, when methyl acetate was used, many pyrochlore phases were observed. A pyrochlore phase is known as a low temperature phase of PZT. In other words, it is indicated that, when methyl acetate is used, the crystallization temperature becomes higher than when dimethyl succinate is used.

Methyl acetate is carboxylic acid ester with a valence of 1, and becomes acetate when it dissociates. However, even when it forms ester-bonds with alkoxide or MOD raw material, second and further esterification that forms the next network does not take place as it is not polycarboxylic acid, and therefore a network does not grow long. As a result, it is believed that the crystallization temperature in the present comparison example elevated.

(6) Embodiment Example 5

In the present embodiment example, raw material solutions were prepared by using dimethyl succinate, dimethyl maleate, and dimethyl malonate as polycarboxylic acid ester, and samples were formed using the respective raw material solutions in a manner similar to Embodiment Example 2.

Concretely, a sol-gel raw material in which the forth raw material liquid for forming $PbSiO_3$ crystal was added by 5 mol % to the first—third raw material liquids corresponding to $PbZr_{0.17}Ti_{0.66}Nb_{0.17}O_3$ (PZTN) similar to Embodiment Example 1 was used. This sol-gel raw material and dimethyl succinate were dissolved at a rate of 1:1 in n-buthanol, and then the solution was heated at 80° C. for 60 minutes to thereby obtain a solution (precursor composition).

Sample 1 was obtained by the following method. First, the solution (precursor composition) was coated by a spin coat method on a platinum substrate, and a drying treatment was conducted at 150° C. using a hot plate to thereby remove alcohol. Then, a cleaning thermal treatment was conducted using a hot-plate at 300° C. Then, the aforementioned coating step, the drying treatment step, and the cleaning thermal treatment were conducted three times to obtain a coated film having a desired film thickness. Further, a ferroelectric film having a film thickness of 150 nm was obtained by conducting crystallization annealing (sintering). The sintering for crystallization was conducted by using rapid thermal annealing (RTA) in an oxygen atmosphere at 700° C. In this manner, Sample 1 of a ferroelectric film was obtained.

Figure 38:
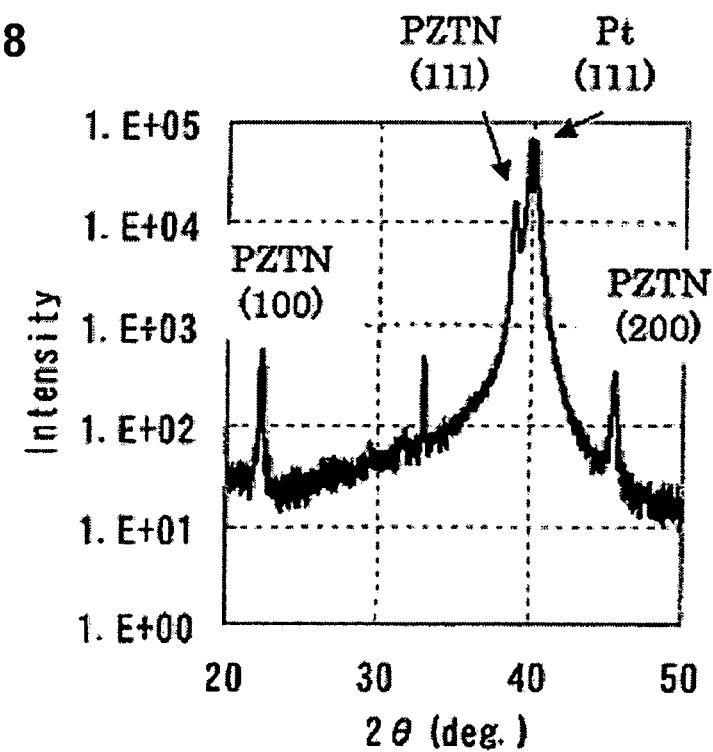
FIG. 38 is a graph showing an X-ray diffraction pattern of a PZTN film according to Embodiment Example 5 in accordance with the present embodiment.
Figure 39:
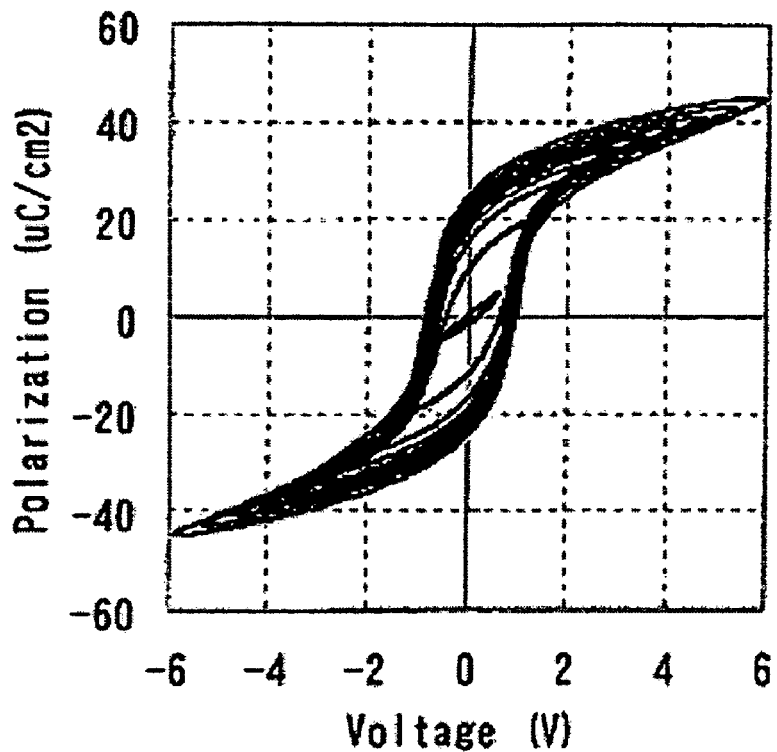
FIG. 39 is a graph showing hysteresis characteristics of the PZTN film according to Embodiment Example 5 in accordance with the present embodiment.

Crystallinity and hysteresis of Sample 1 were examined by X-ray diffraction in a manner similar to Embodiment Example 1. FIG. 38 shows the X-ray diffraction result, and FIG. 39 shows the hysteresis result. It was also confirmed from these results that excellent PZTN can be obtained when dimethyl succinate was used.

Figure 40:
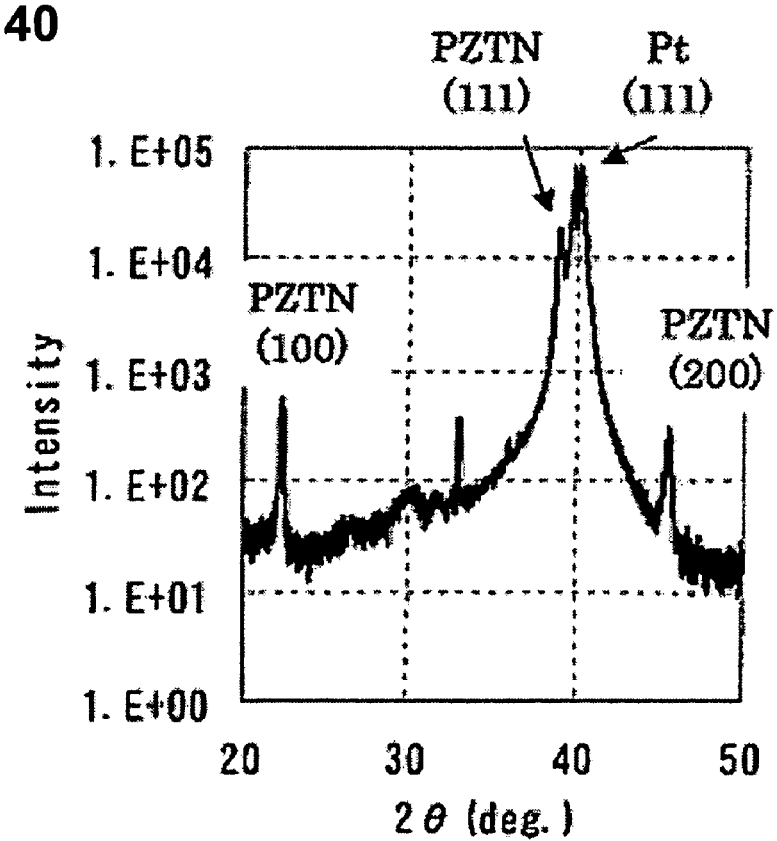
FIG. 40 is a graph showing an X-ray diffraction pattern of a PZTN film according to Embodiment Example 5 in accordance with the present embodiment.
Figure 41:
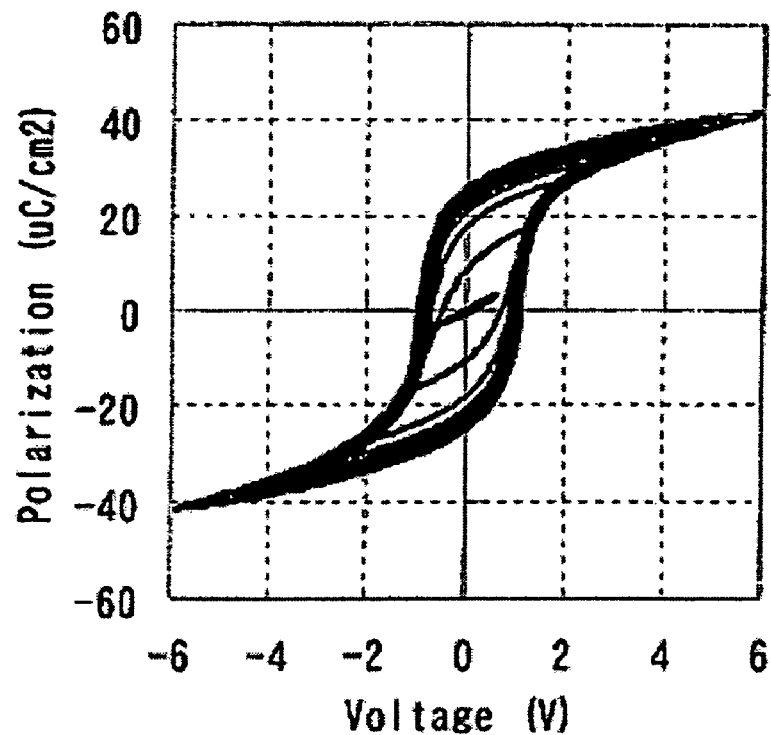
FIG. 41 is a graph showing hysteresis characteristics of the PZTN film according to Embodiment Example 5 in accordance with the present embodiment.

Sample 2 of a ferroelectric film was obtained in a manner similar to the case of Sample 1 except that dimethyl maleate was used instead of dimethyl succinate. Crystallinity and hysteresis of Sample 2 were examined by X-ray diffraction in a manner similar to Embodiment Example 1. FIG. 40 shows the X-ray diffraction result, and FIG. 41 shows the hysteresis result. It was also confirmed from these results that excellent PZTN can be obtained when dimethyl maleate was used.

Figure 42:
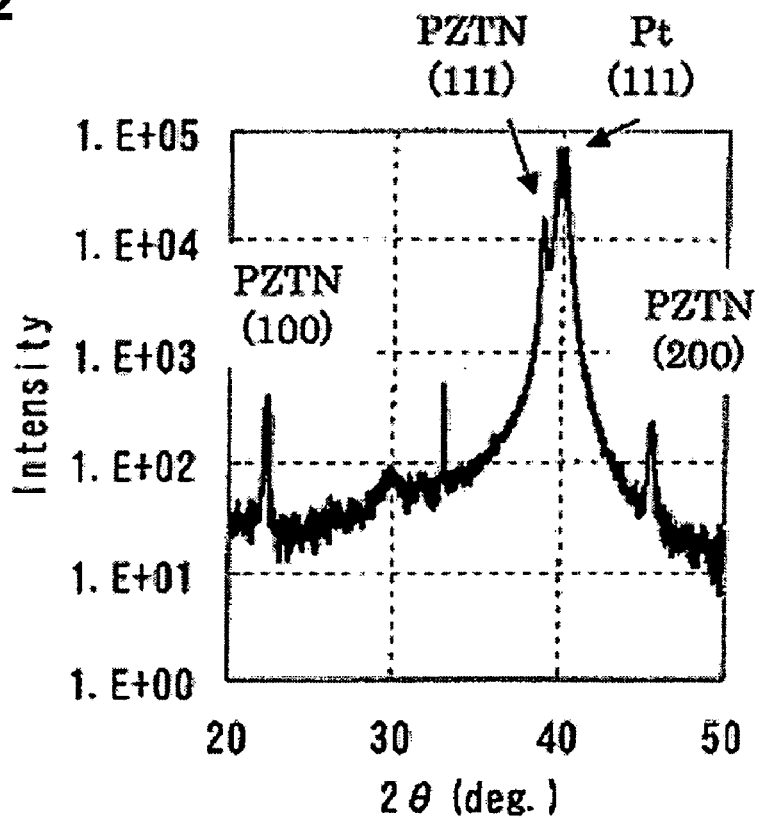
FIG. 42 is a graph showing an X-ray diffraction pattern of a PZTN film according to Embodiment Example 5 in accordance with the present embodiment.
Figure 43:
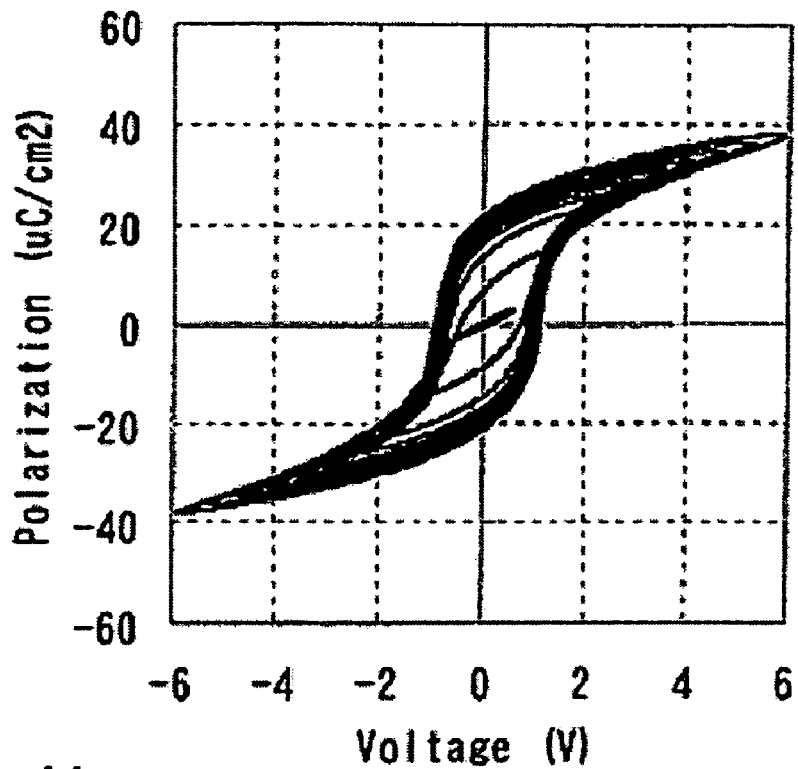
FIG. 43 is a graph showing hysteresis characteristics of the PZTN film according to Embodiment Example 5 in accordance with the present embodiment.

Moreover, Sample 3 of a ferroelectric film was obtained in a manner similar to the case of Sample 1 except that dimethyl malonate was used instead of dimethyl succinate. Crystallinity and hysteresis of Sample 3 were examined by X-ray diffraction in a manner similar to Embodiment Example 1. FIG. 42 shows the X-ray diffraction result, and FIG. 43 shows the hysteresis result. It was also confirmed from these results that excellent PZTN can be obtained when dimethyl malonate was used.

(7) Embodiment Example 6

In the present embodiment example, oxide including Ta instead of Nb was used to prepare a raw material solution, and a sample was formed in a manner similar to Embodiment Example 2.

Concretely, a sol-gel raw material in which the forth raw material liquid for forming $PbSiO_3$ crystal was added by 5 mol % to the first—third raw material liquids corresponding to $PbZr_{0.17}Ti_{0.66}Ta_{0.17}O_3$ (PZTT) was used. The first raw material liquid including Pb and Zr, and the second raw material liquid including Pb and Ti were the same as those in Embodiment Example 1. As the third raw material liquid including Pb and Ta, a solution in which a condensate for forming $PbTaO_3$ perovskite crystal was dissolved in a solvent of n-buthanol in an anhydrous state was used.

Figure 44:
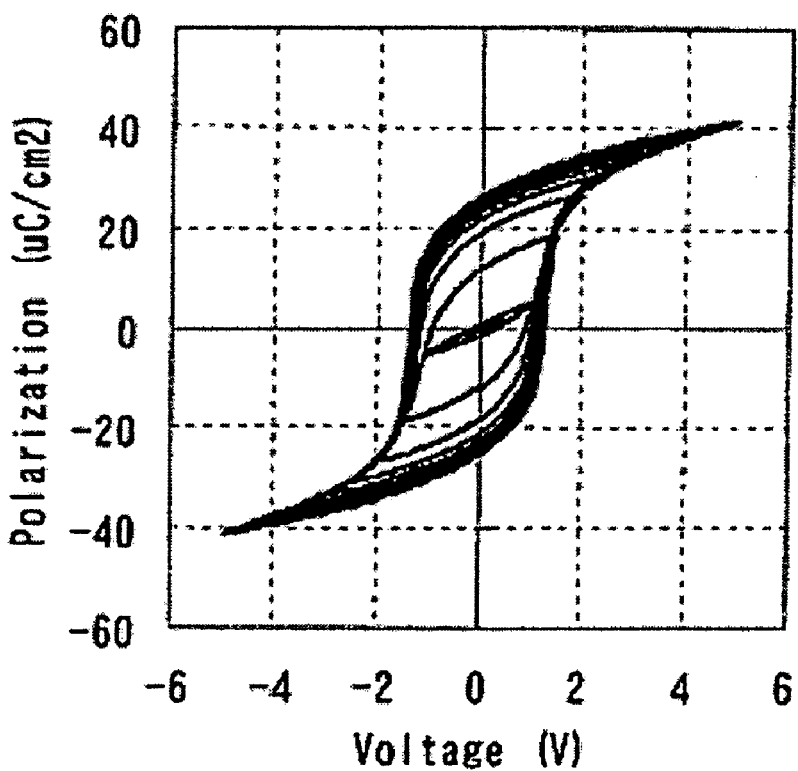
FIG. 44 is a graph showing hysteresis characteristics of a PZTT film according to Embodiment Example 6 in accordance with the present embodiment.

By using this solution, a sample of a ferroelectric film was obtained in a manner similar to Embodiment Example 1. Hysteresis of this sample was examined in a manner similar to Embodiment Example 1. FIG. 44 shows the hysteresis result. It was confirmed from this result that excellent hysteresis could be obtained when Ta was used instead of Nb.

(8) Embodiment Example 7

In the present embodiment example, a sample was formed in a manner similar to Embodiment Example 1 except that the crystallization temperature was changed.

Concretely, a sol-gel raw material in which the forth raw material liquid for forming $PbSiO_3$ crystal was added by 5 mol % to the first—third raw material liquids corresponding to $PbZr_{0.2}Ti_{0.6}Nb_{0.2}O_3$ (PZTN) was used. This sol-gel raw material and dimethyl succinate were dissolved at a rate of 1:1 in n-buthanol, and then the solution was heated at 80° C. for 60 minutes to thereby obtain a solution (precursor composition).

A sample was obtained by the following method. First, the solution (precursor composition) was coated by a spin coat method on a platinum substrate (that is a substrate having a silicon oxide layer, a titanium oxide layer and a platinum layer formed on a silicon substrate), and a drying treatment was conducted at 150° C. using a hot plate to thereby remove alcohol. Then, a cleaning thermal treatment was conducted at 300° C. using a hot-plate. Then, the aforementioned coating step, the drying treatment step, and the cleaning thermal treatment were conducted three times to obtain a coated film having a desired film thickness. Further, a ferroelectric film having a film thickness of 150 nm was obtained by conducting crystallization annealing (sintering). The sintering for crystallization was conducted by using rapid thermal annealing (RTA) in an oxygen atmosphere at 600° C. for 10 minutes. In this manner, a ferroelectric film sample was obtained.

Figure 45:
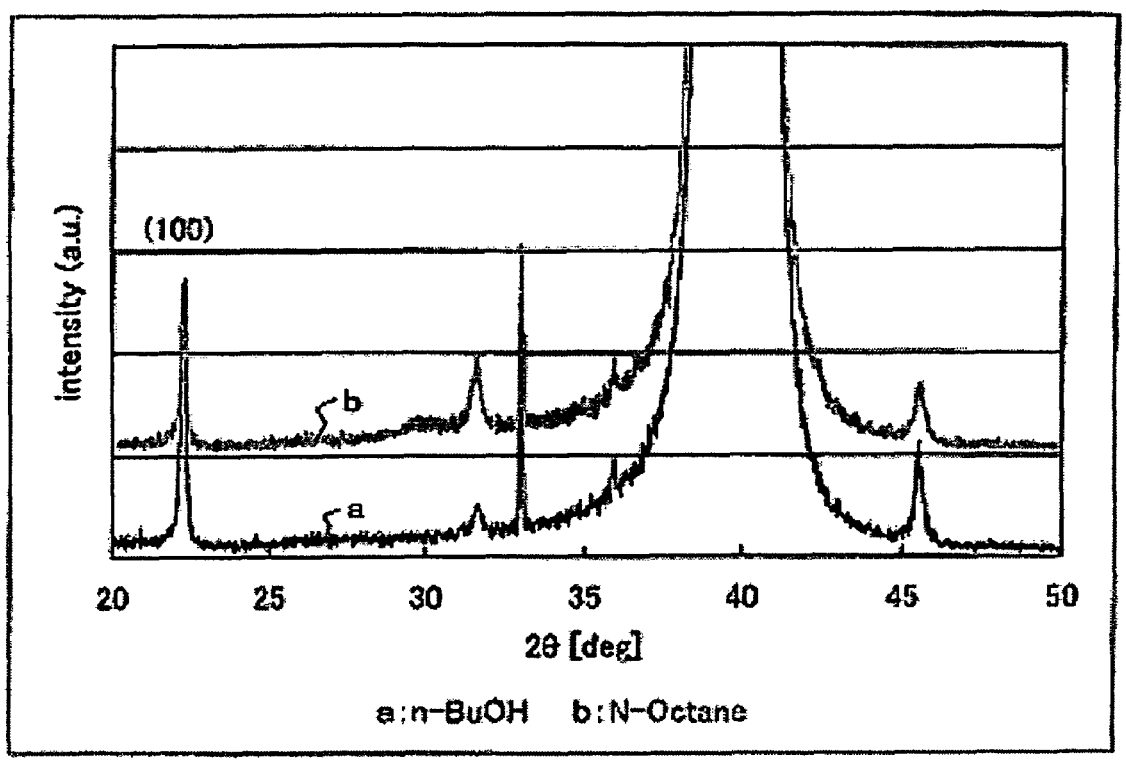
FIG. 45 is a graph showing X-ray diffraction patterns of PZTN film according to Embodiment Example 7 in accordance with the present embodiment and a reference example.
Figure 46:
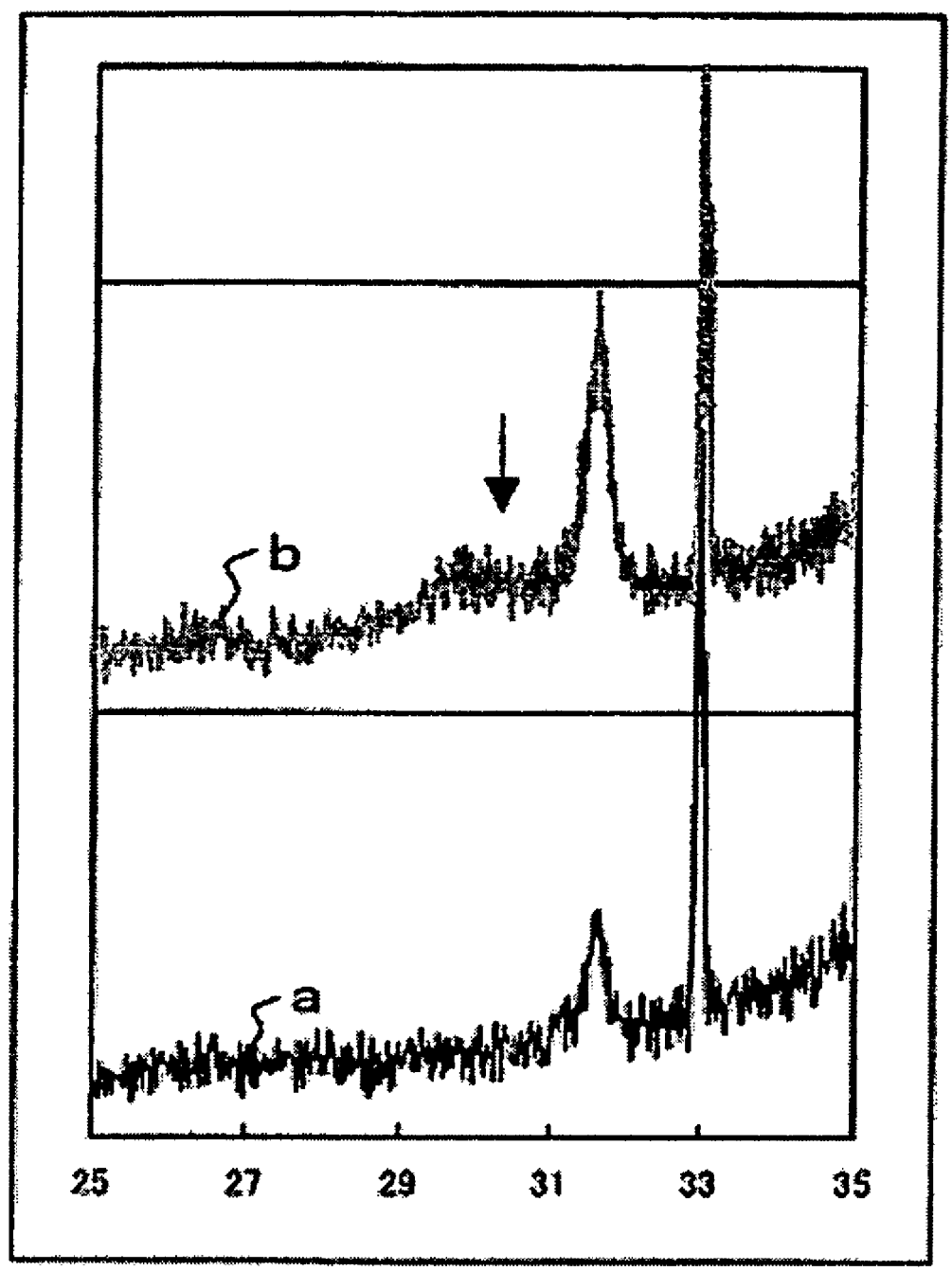
FIG. 46 is an enlarged view of a portion of FIG. 45.

Crystallinity of the sample was examined by X-ray diffraction in a manner similar to Embodiment Example 1. FIG. 45 shows the X-ray diffraction result. In FIG. 45, a graph indicated by the sign "a" indicates the result of the present embodiment example, and a graph indicated by the sign "b" indicates the result of a reference example 1 to be described below. FIG. 46 is an enlarged view of a portion in FIG. 45. It was confirmed from these results that excellent PZTN could also be obtained in the present embodiment example.

(9) Reference Example 1

A sample was obtained in a manner similar to Embodiment Example 7 except that n-octane that is alkane was used as an organic solvent instead of n-buthanol used in Embodiment Example 7.

Crystallinity of the sample was examined by X-ray diffraction in a manner similar to Embodiment Example 1. FIG. 45 and FIG. 46 show the X-ray diffraction results. As a result, in the present reference example, a peak of pyrochlore was confirmed at a portion indicated by an arrow in FIG. 46. Accordingly, it was confirmed that PZTN having better crystallinity could be obtained by using a solvent having a polarity such as alcohol as an organic solvent, rather than those of non-polarity such as alkane.

(10) Embodiment Example 8

The present embodiment is different from Embodiment Example 1 in that ethylene glycol was used as an organic solvent instead of n-buthanol. In other words, in accordance with the present embodiment example, a PZTN ferroelectric film was obtained by mixing first through third raw material liquids including at least one of Pb, Zr, Ti and Nb, dimethyl succinate as polycarboxylic acid, and ethylene glycol ($C_2H_6O_2$: dihydric alcohol), and crystallizing oxides included in the mixed solution by heat treatment or the like. The mixed solution was formed by dissolving the sol-gel raw material and dimethyl succinate at a rate of 1:1 in ethylene glycol.

As the first raw material liquid, a solution in which a condensation polymer for forming $PbZrO_3$ perovskite crystal with Pb and Zr among the constituent metal elements of the PZTN ferroelectric phase was dissolved in ethylene glycol in an anhydrous state was used.

As the second raw material liquid, a solution in which a condensation polymer for forming $PbTiO_3$ perovskite crystal with Pb and Ti among the constituent metal elements of the PZTN ferroelectric phase was dissolved in ethylene glycol in an anhydrous state was used.

As the third raw material liquid, a solution in which a condensation polymer for forming $PbNbO_3$ perovskite crystal with Pb and Nb among the constituent metal elements of the PZTN ferroelectric phase was dissolved in ethylene glycol in an anhydrous state was used.

When a ferroelectric film composed of $PbZr_{0.2}Ti_{0.6}Nb_{0.2}O_3$ (PZTN) is to be obtained by using the first, second and third raw material liquids, they are mixed in a mixing ratio ((the first raw material liquid): (the second raw material liquid): (the third raw material liquid)) of 2:6:2. Moreover, for the purpose of lowering the crystallization temperature of the ferroelectric film, a solution in which a condensation polymer for forming $PbSiO_3$ crystal was dissolved in ethylene glycol in an anhydrous state was added by 1.5 mol % as a fourth raw material liquid to the above mixed solution. In other words, by using the mixed solution of the first, second, third and fourth raw material liquids as the sol-gel raw materials, PZTN can be crystallized at a crystallization temperature of 650° C.

A sample was obtained by the following method.

First, at room temperature, a solution was prepared by dissolving the aforementioned first to fourth raw material liquids and dimethyl succinate in ethylene glycol. Then, the solution was sealed up, then heated at 90° C. for 30 minutes, and further cooled to room temperature, whereby a precursor composition was obtained.

Then, the precursor composition was coated by a spin coat method on a platinum substrate, and a drying treatment was conducted at 150° C. using a hot plate to thereby remove alcohol. Then, a cleaning thermal treatment was conducted at 300° C. using a hot-plate. Then, the coating step, the drying treatment step, and the cleaning thermal treatment described above were conducted three times, and then crystallization annealing (sintering) was conducted in oxygen at 650° C. for 5 minutes, whereby a ferroelectric film sample having a film thickness of 120 nm was obtained. The sintering for crystallization was conducted by using rapid thermal annealing (RTA) in an oxygen atmosphere at a temperature elevation rate of 120° C./sec. Further, an upper electrode composed of platinum was formed by a sputter method, whereby a ferroelectric capacitor sample was obtained.

The following characteristics were examined with these samples.

Figure 55:
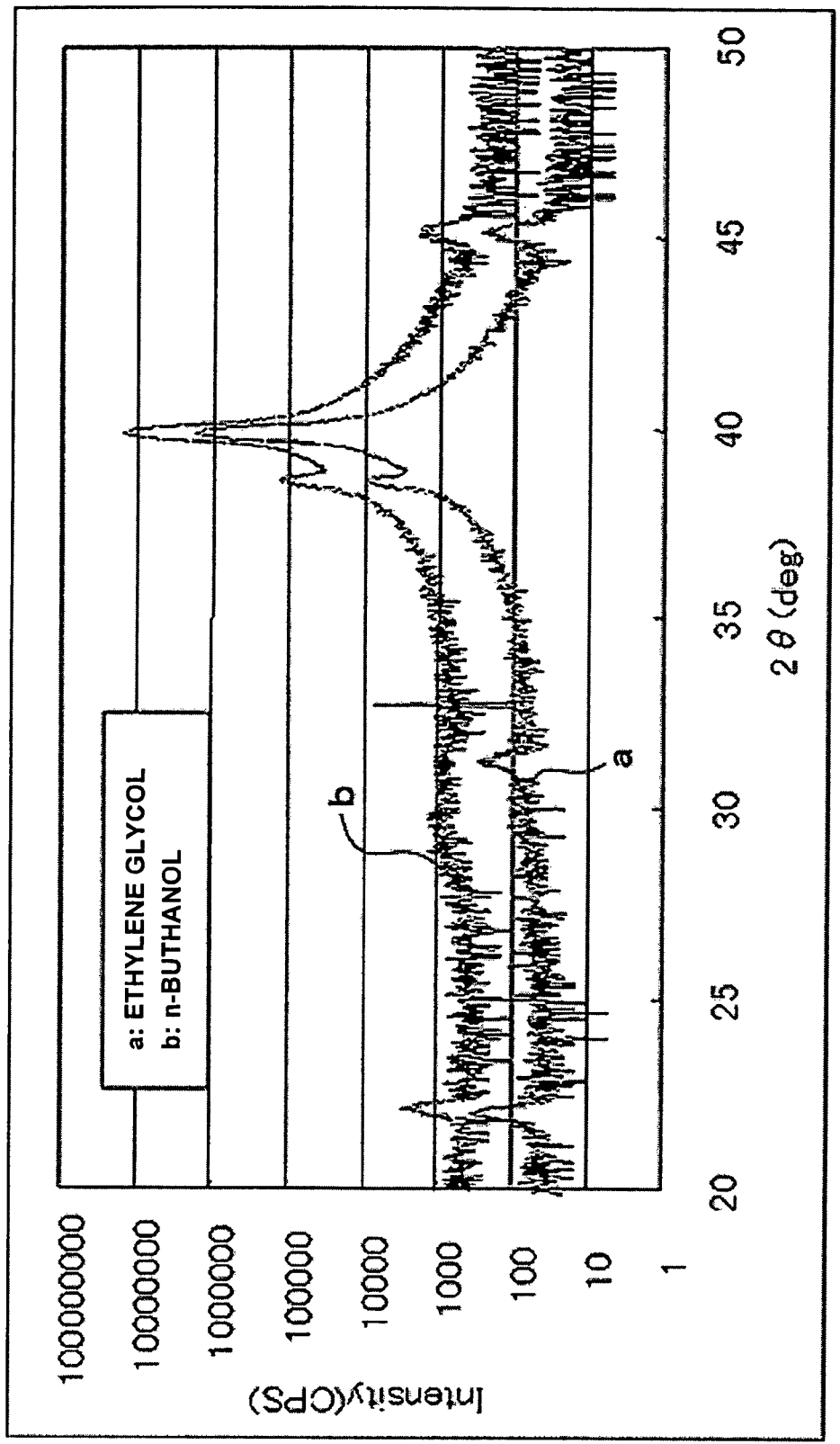
FIG. 55 is a graph showing X-ray diffraction patterns of PZTN films according to Embodiment Example 8 in accordance with the present embodiment.

Crystallinity of the capacitor sample was examined by X-ray diffraction. FIG. 55 shows the results. In FIG. 55, an XRD pattern indicated by the sign "a" belongs to the present embodiment example that uses ethylene glycol, and an XRD pattern indicated by the sign "b" belongs to Embodiment Example 2 that uses n-buthanol. It was found from FIG. 55 that PZTN of the present embodiment example was composed of perovskite single phase like Embodiment Example 2.

Figure 56A:
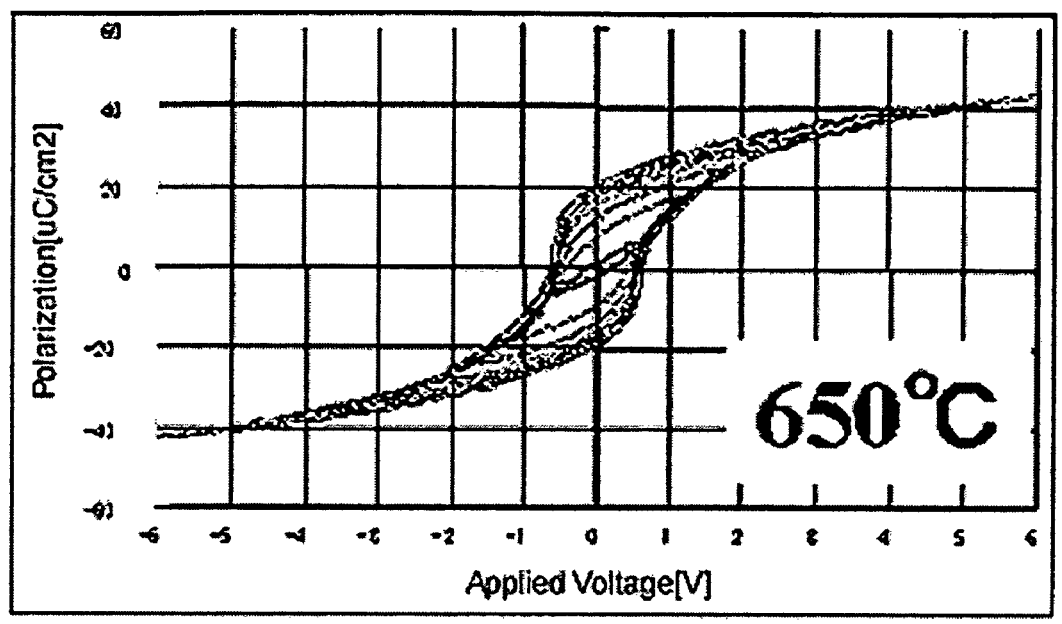
FIGS. 56A and 56B are graphs showing hysteresis characteristics of the PZTN films according to Embodiment Example 8 in accordance with the present embodiment.

Also, hysteresis characteristics of the capacitor sample of the present embodiment example were evaluated, and excellent hysteresis characteristics were obtained as shown in FIG. 56(A).

Figure 56B:
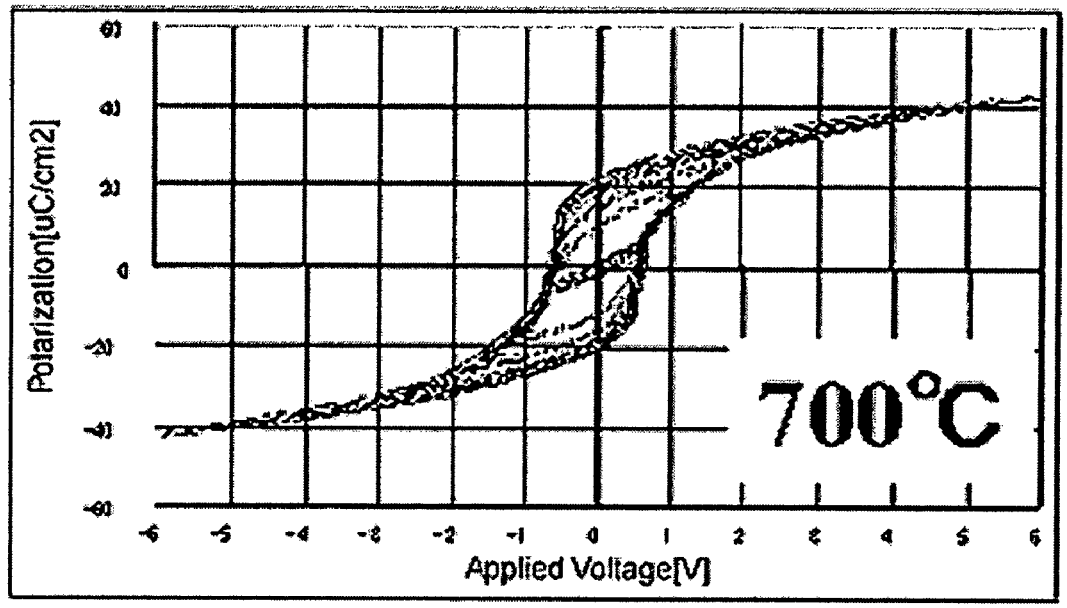

FIG. 56(B) shows hysteresis characteristics of a capacitor sample obtained in a manner similar to the present embodiment example except that the sintering temperature was set to 700° C. Excellent hysteresis characteristics were also obtained in this case.

Figure 57:
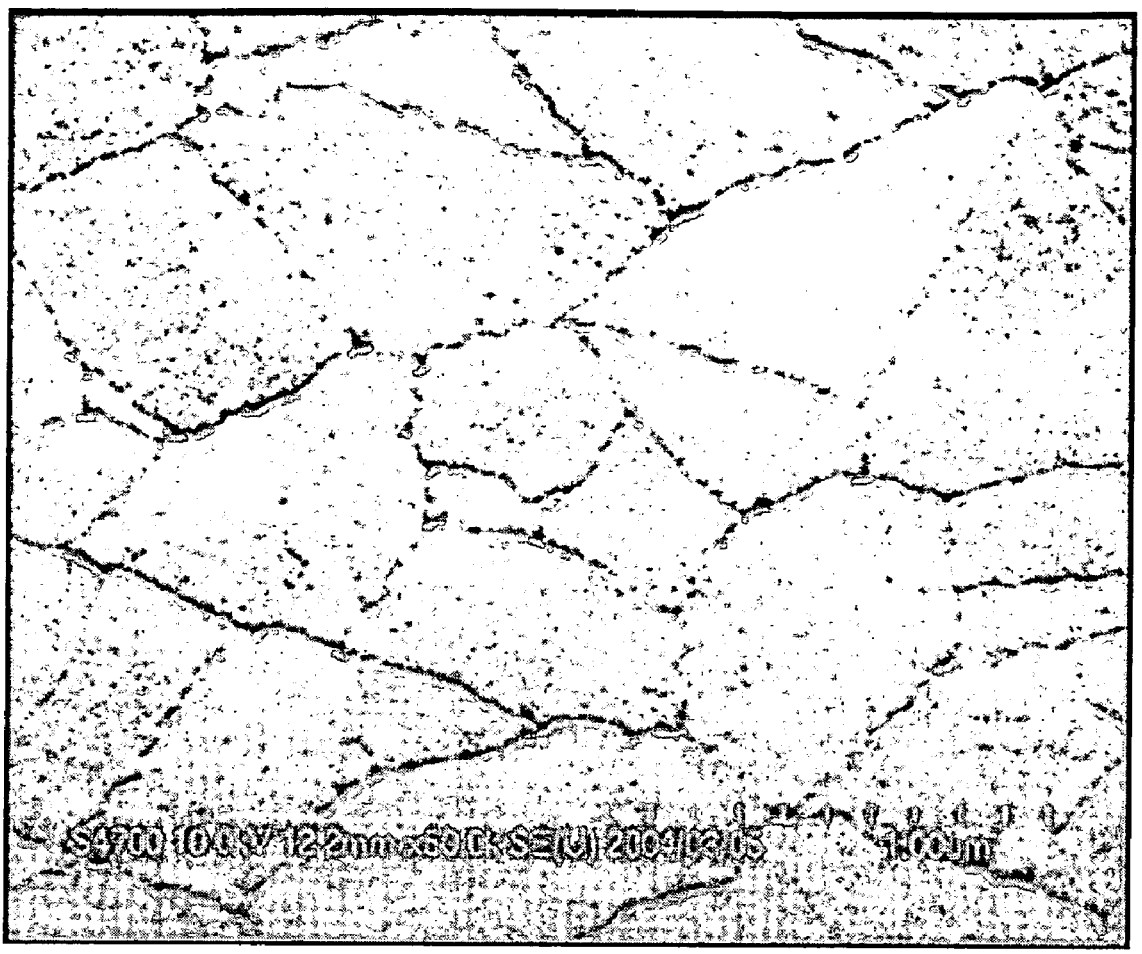
FIG. 57 is a picture showing a surface morphology of the PZTN film according to Embodiment Example 8 in accordance with the present embodiment.

Further, the surface morphology of the capacitor sample of the present embodiment example was examined by SEM, and an excellent result was obtained as shown in FIG. 57.

(11) Embodiment Example 9

In the present embodiment example, PZTN ferroelectric films were obtained through mixing first to third raw material liquids including at least one of Pb, Zr, Ti and Nb, one of dimethyl succinate, dimethyl maleate, dimethyl malonate and tributyl citrate as polycarboxylic acid, and n-buthanol as an organic solvent, and crystallizing oxides contained in the mixed solution by heat treatment or the like. The mixed solutions were formed by dissolving the sol-gel raw material and one of dimethyl succinate, dimethyl maleate, dimethyl malonate and tributyl citrate at a rate of 1:1 in n-buthanol.

As the first raw material liquid, a solution in which a condensation polymer for forming $PbZrO_3$ perovskite crystal with Pb and Zr among the constituent metal elements of the PZTN ferroelectric phase was dissolved in a solvent of n-buthanol in an anhydrous state was used.

As the second raw material liquid, a solution in which a condensation polymer for forming $PbTiO_3$ perovskite crystal with Pb and Ti among the constituent metal elements of the PZTN ferroelectric phase was dissolved in a solvent of n-buthanol in an anhydrous state was used.

As the third raw material liquid, a solution in which a condensation polymer for forming $PbNbO_3$ perovskite crystal with Pb and Nb among the constituent metal elements of the PZTN ferroelectric phase was dissolved in a solvent of n-buthanol in an anhydrous state was used.

When a ferroelectric film composed of PbZr$_{0.2}$Ti$_{0.6}$Nb$_{0.2}$O$_3$ (PZTN) is to be obtained by using the first, second and third raw material liquids, they are mixed in a mixing ratio ((the first raw material liquid): (the second raw material liquid): (the third raw material liquid)) of 2:6:2. Moreover, for the purpose of lowering the crystallization temperature of the ferroelectric film, a solution in which a condensation polymer for forming PbSiO$_3$ crystal was dissolved in a solvent of n-buthanol in an anhydrous state was added by 1.5 mol % as a fourth raw material liquid to the above mixed solution. Sol-gel solutions for forming PZTN were manufactured in this manner. The solutions that were manufactured by using dimethyl succinate, dimethyl maleate, dimethyl malonate and tributyl citrate are referred to as sol-gel solutions for forming PZTN a, b, c and d, respectively.

Next, capacitor samples were obtained by the following method.

First, at room temperature, each of the sol-gel solutions for forming PZTN a, b, c and d was coated by a spin coat method on a platinum substrate, and a drying treatment was conducted at 150° C., using a hot plate to thereby remove alcohol. Then, a cleaning thermal treatment was conducted using a hot-plate at 300° C. Then, the aforementioned coating step, the drying treatment step, and the cleaning thermal treatment were conducted three times, and then ferroelectric film samples a, b, c and d, each having a film thickness of 120 nm, were obtained by conducting crystallization annealing (sintering) in oxygen at 650° C. for 5 minutes. The sintering for crystallization was conducted by using rapid thermal annealing (RTA) in an oxygen atmosphere at a temperature elevation rate of 120° C./sec. Further, an upper electrode composed of platinum was formed by a sputter method, whereby ferroelectric capacitor samples a, b, c and d were obtained.

The following characteristics were examined with these samples.

Figure 58:
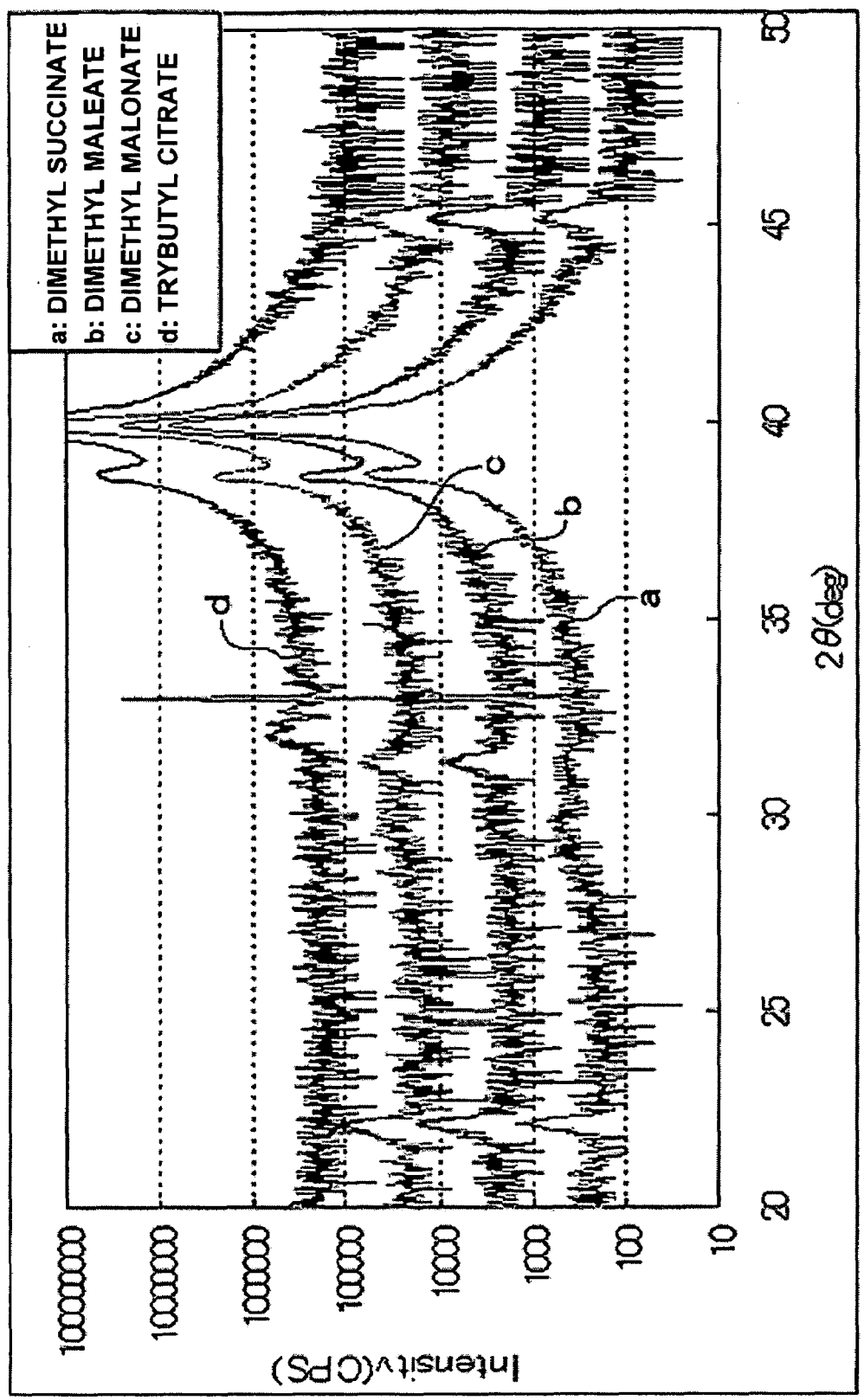
FIG. 58 is a graph showing X-ray diffraction patterns of PZTN films according to Embodiment Example 9 in accordance with the present embodiment.
Figure 59A:
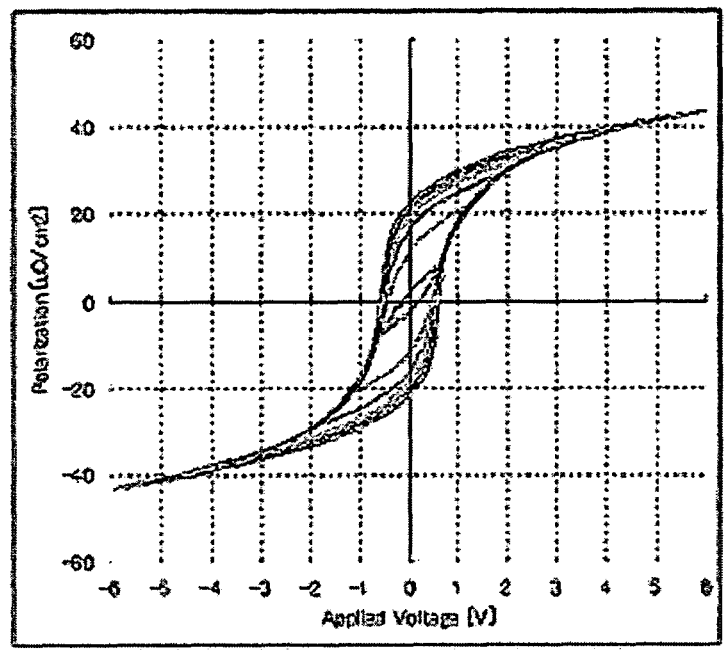
FIG. 59A is a graph showing hysteresis characteristics of the PZTN film according to Embodiment Example 9 in accordance with the present embodiment.
Figure 59B:
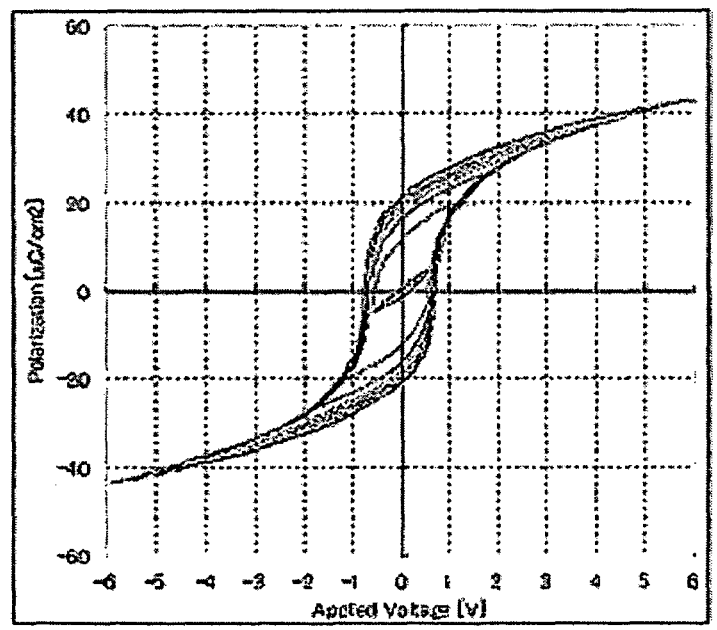
FIG. 59B is a graph showing hysteresis characteristics of the PZTN film according to Embodiment Example 9 in accordance with the present embodiment.
Figure 59C:
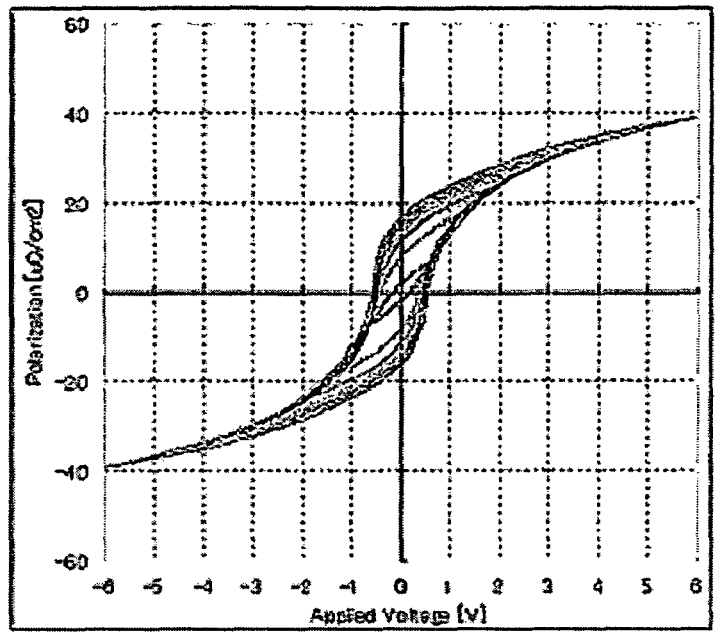
FIG. 59C is a graph showing hysteresis characteristics of the PZTN film according to Embodiment Example 9 in accordance with the present embodiment.
Figure 59D:
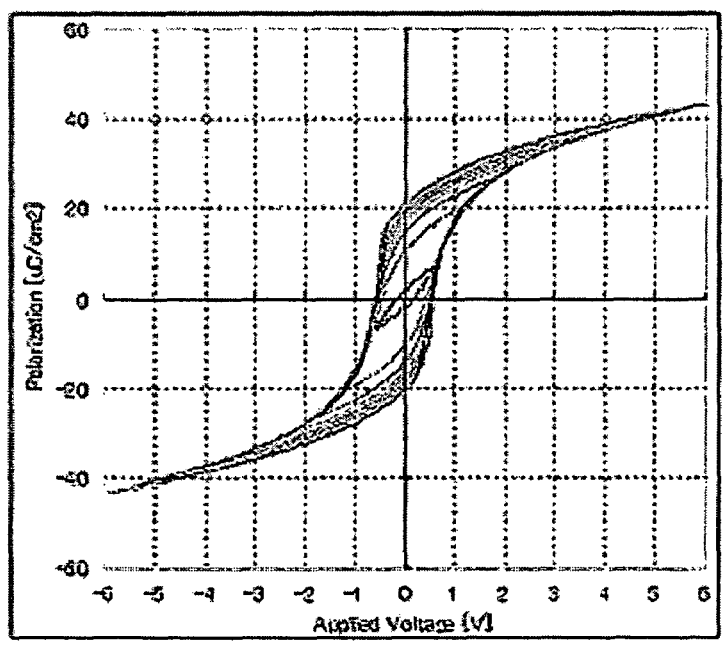
FIG. 59D is a graph showing hysteresis characteristics of the PZTN film according to Embodiment Example 9 in accordance with the present embodiment.
Figure 60A:
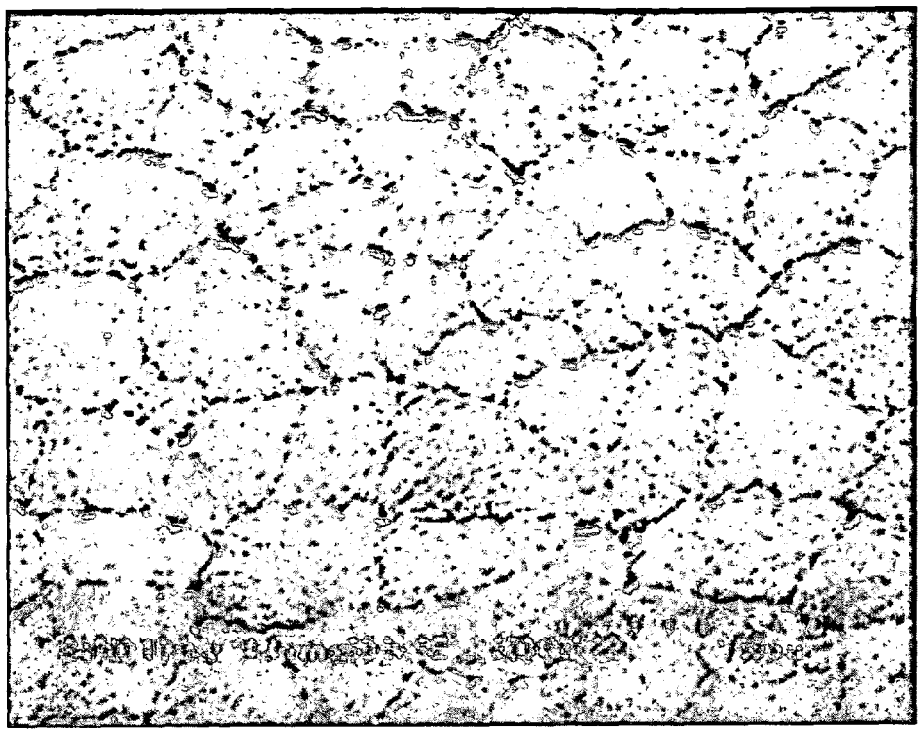
FIG. 60A is a picture showing a surface morphology of the PZTN film according to Embodiment Example 9 in accordance with the present embodiment.
Figure 60B:
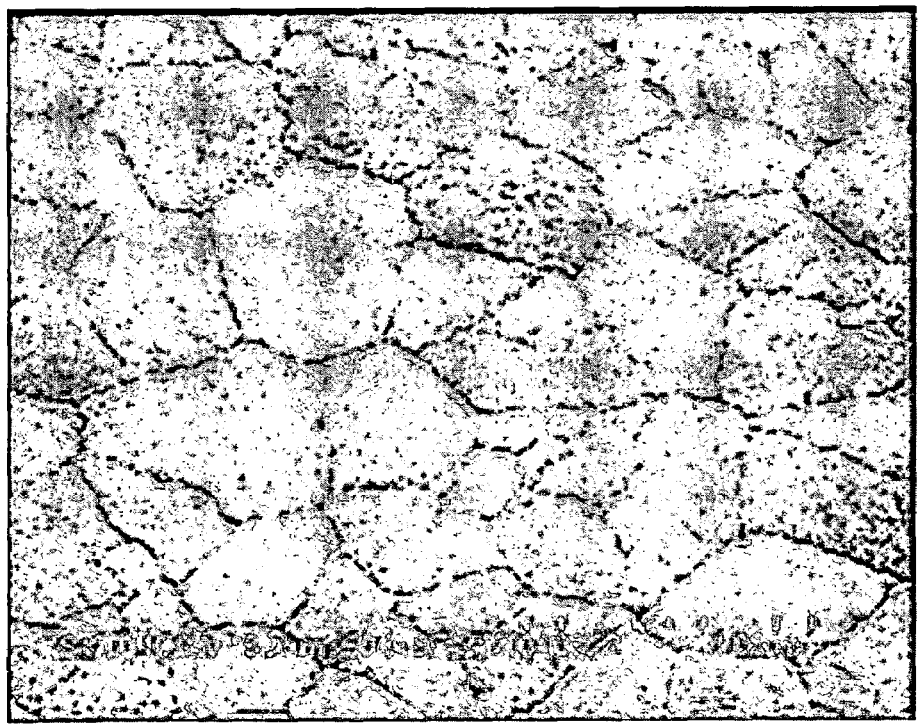
FIG. 60B is a picture showing a surface morphology of the PZTN film according to Embodiment Example 9 in accordance with the present embodiment.
Figure 60C:
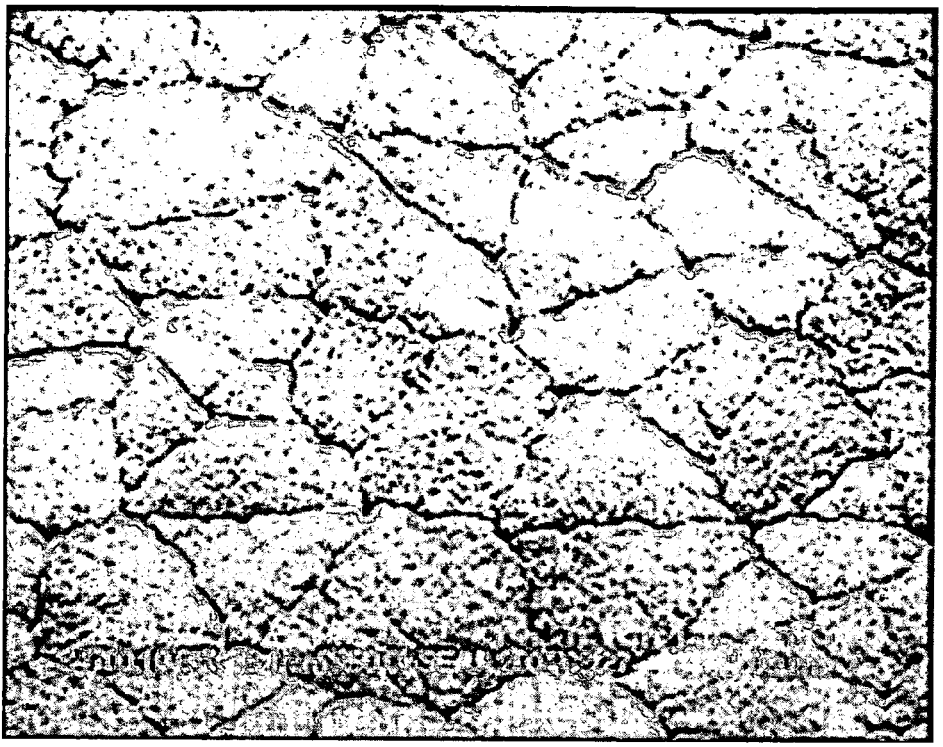
FIG. 60C is a picture showing a surface morphology of the PZTN film according to Embodiment Example 9 in accordance with the present embodiment.
Figure 60D:
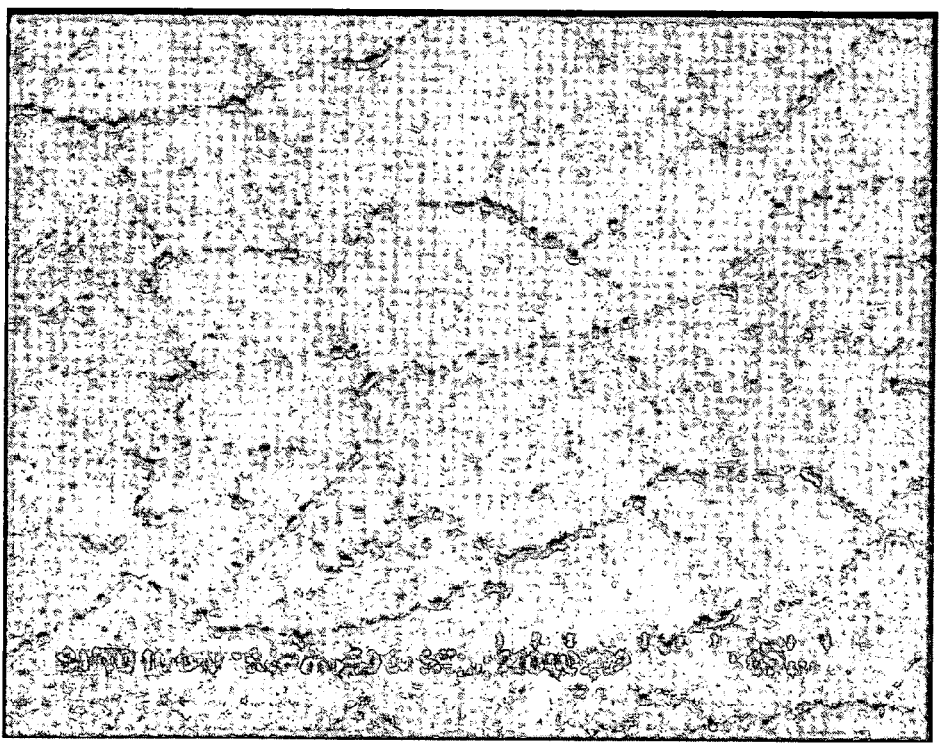
FIG. 60D is a picture showing a surface morphology of the PZTN film according to Embodiment Example 9 in accordance with the present embodiment.

Crystallinity of each of the capacitor samples a, b, c and d was examined by X-ray diffraction. FIG. 58 shows the results. It was found from FIG. 58 that all of the capacitor samples were composed of perovskite single phase.

Next, hysteresis characteristics of each of the capacitor samples a, b, c and d were evaluated, and excellent hysteresis characteristics were obtained as shown in FIGS. 59(A)-(D).

Further, the surface morphology of each of the ferroelectric (PZTN) film samples a, b, c and d was examined by SEM, and it was confirmed that all of the samples had dense and smooth surface morphology, as shown in FIGS. 60(A)-(D).

5. Semiconductor Element

Next, semiconductor elements including ferroelectric films formed by using the raw material solutions in accordance with the present embodiments are described. In the present embodiment, a ferroelectric memory device including a ferroelectric capacitor that is an example of a semiconductor element is described as an example.

Figure 47A:
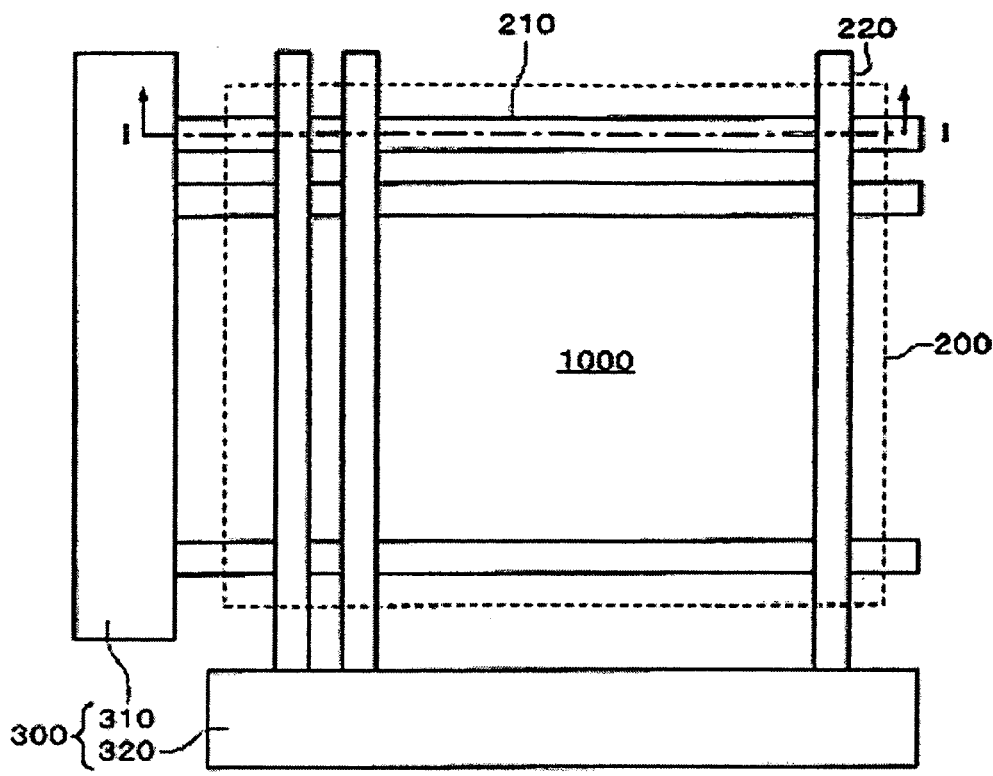
FIGS. 47A and 47B are views showing a semiconductor device in accordance with the present embodiment.
Figure 47B:
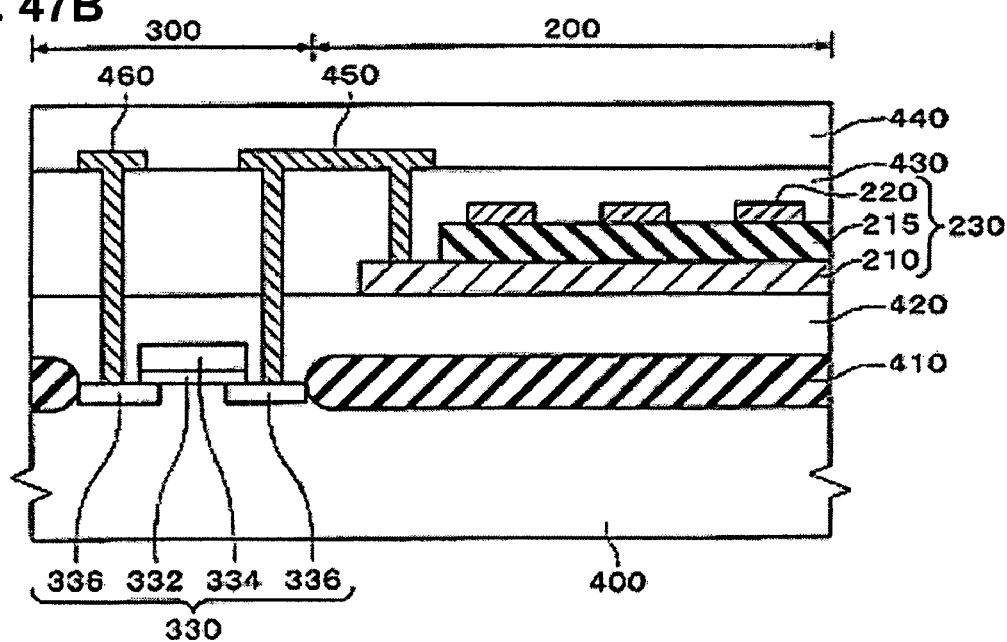

FIG. 47(A) and FIG. 47(B) are views schematically showing a ferroelectric memory device 1000 that uses a ferroelectric capacitor obtained by the manufacturing method in accordance with the present embodiment described above. It is noted that FIG. 47(A) shows a plane configuration of the ferroelectric memory device 1000, and FIG. 47(B) shows a I-I cross section in FIG. 47(A).

The ferroelectric memory device 1000 has a memory cell array 200 and a peripheral circuit section 300, as shown in FIG. 47(A). Further, the memory cell array 200 and the peripheral circuit section 300 are formed in different layers, respectively. The peripheral circuit section 300 is formed on a semiconductor substrate 400 in an area that is different from the memory cell array 200. As a concrete example of the peripheral circuit section 300, a Y-gate, a sense amplifier, an I/O buffer, an X-address decoder, a Y-address decoder, or an address buffer can be enumerated.

The memory cell array 200 includes lower electrodes (word lines) 210 for selection of rows, and upper electrodes (bit lines) 220 for selection of columns, which are disposed orthogonal to one another. Also, the lower electrodes 210 and the upper electrodes 220 are arranged in stripes composed of a plurality of line shaped signal electrodes. It is noted that the signal electrodes can be formed such that the lower electrodes 210 may define bit lines, and the upper electrodes 220 may define word lines.

Then, as shown in FIG. 47(B), a ferroelectric film 215 is disposed between the lower electrodes 210 and the upper electrodes 220. In the memory cell array 200, memory cells that function as ferroelectric capacitors 230 are formed in areas where the lower electrodes 210 and the upper electrodes 220 intersect one another. The ferroelectric film 215 is a film formed by using the raw material solution in accordance with the present embodiment described above. It is noted that the ferroelectric film 215 only has to be arranged at least in an area where the lower electrode 210 and the upper electrode 220 intersect each other.

Further, the ferroelectric memory device 1000 includes a second interlayer insulation film 430 formed to cover the lower electrodes 210, the ferroelectric film 215, and the upper electrodes 220. In addition, an insulating protection layer 440 is formed on the second interlayer insulation film 430 to cover wring layers 450 and 460.

The peripheral circuit section 300 includes various circuits that selectively write or read information in and from the above-described memory cell array 200 shown in FIG. 47(A) and, for example, is formed from a first driving circuit 310 to control the lower electrodes 210 selectively, a second driving circuit 320 to control the upper electrodes 220 selectively, and a signal detection circuit such as a sense amplifier (omitted in the figure) and the like.

Also, the peripheral circuit section 300 includes MOS transistors 330 formed on the semiconductor substrate 400, as shown in FIG. 47(B). The MOS transistor 330 has a gate insulation layer 332, a gate electrode 334, and source/drain regions 336. The MOS transistors 330 are isolated from one another by an element isolation area 410. The first interlayer insulation layer 420 is formed on the semiconductor substrate 400 on which the MOS transistor 330 is formed. Further, the peripheral circuit section 300 and the memory cell array 200 are electrically connected to one another by a wiring layer 51.

Next, an example of writing and reading operations in the ferroelectric memory device 1000 is described.

First, in the reading operation, a read voltage is impressed to a capacitor of a selected memory cell. This serves as a writing operation to write '0' at the same time. At this moment, a current that flows on a selected bit line or a potential on the bit line when it is brought to high impedance is read by a sense amplifier. At this moment, a predetermined voltage is impressed to capacitors of non-selected memory cells to prevent cross-talk at the time of reading.

In the writing operation, when writing '1,' a write voltage that inverts the polarization is impressed to a capacitor of a selected memory cell. When writing '0,' a write voltage that does not invert the polarization is impressed to a capacitor of a selected memory cell, to retain the "0" state written at the time of reading operation. At this moment, a predetermined voltage is impressed to capacitors of non-selected memory cells to prevent cross-talk at the time of writing.

In the ferroelectric memory device 1000, the ferroelectric capacitor 230 has the ferroelectric film 215 that can be crystallized at low temperatures. Therefore, there is an advantage in that the ferroelectric memory device 1000 can be manufactured without deteriorating the MOS transistors 330 and the like that compose the peripheral circuit 300. Moreover, because the ferroelectric capacitor 230 has excellent hysteresis characteristics, a highly reliable ferroelectric memory device 1000 can be provided.

Figure 48:
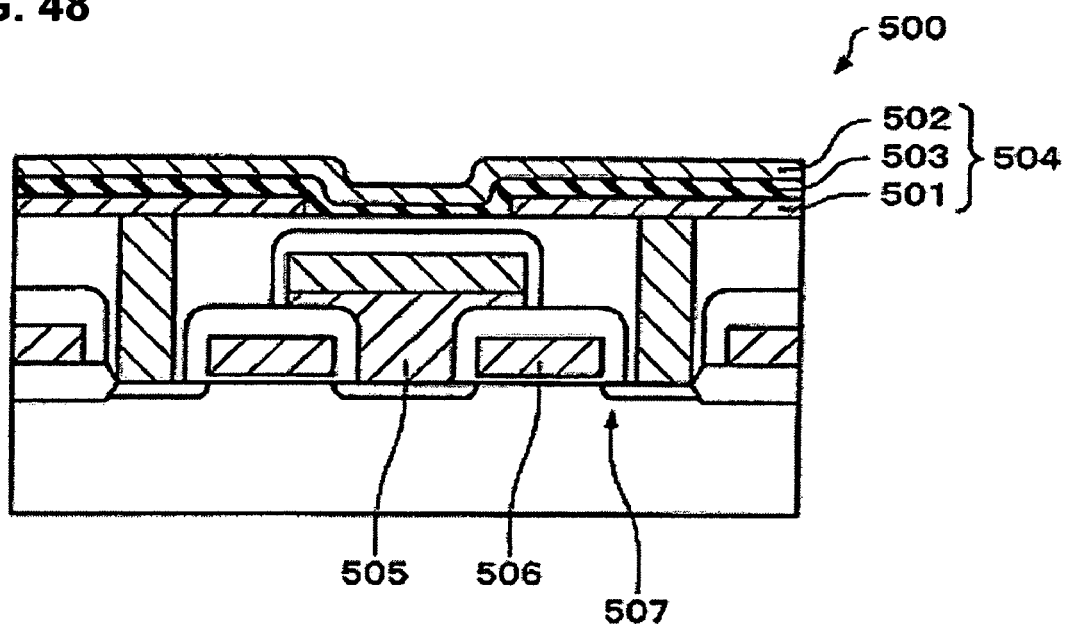
FIG. 48 is a cross-sectional view schematically showing a 1T1C type ferroelectric memory in accordance with the present embodiment.
Figure 49:
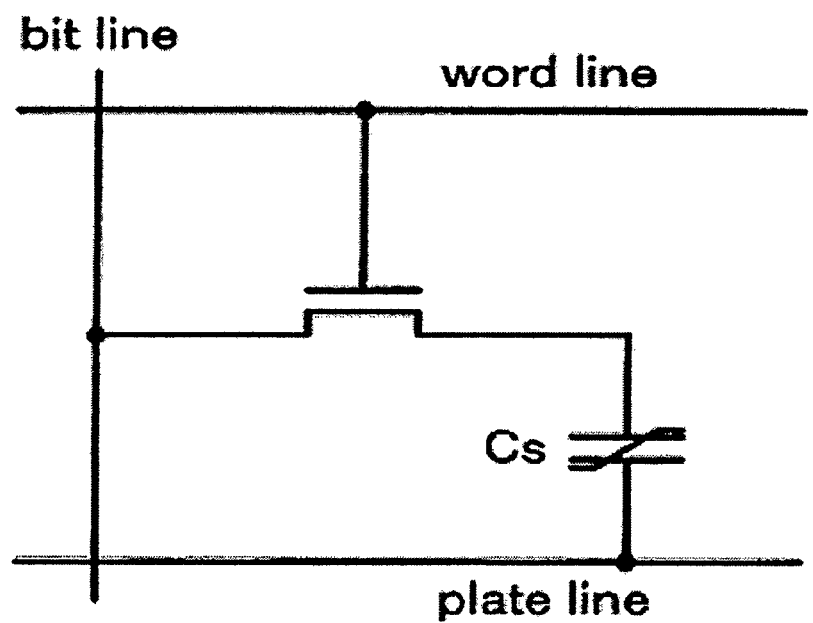
FIG. 49 is a view showing an equivalent circuit of the ferroelectric memory shown in FIG. 48.

FIG. 48 shows a structural drawing of a 1T1C type ferroelectric memory device 500 as another example of a semiconductor device. FIG. 49 shows an equivalent circuit diagram of the ferroelectric memory device 500.

As shown in FIGS. 48, the ferroelectric memory device 500 is a memory element having a structure similar to that of a DRAM, which is composed of a capacitor 504 (1C) composed of a lower electrode 501, an upper electrode 502 that is connected to a plate line, and a ferroelectric film 503 in accordance with the present embodiment described above, and a switching transistor element 507 (1T), having source/drain electrodes, one of them being connected to a data line 505, and a gate electrode 506 that is connected to a word line. The 1T1C type memory can perform writing and reading at high-speeds at 100 ns or less, and because written data is nonvolatile, it is promising in the replacement of SRAM.

Because the semiconductor device in accordance with the present embodiment is formed by using the raw material solution in accordance with the present embodiment described above, the semiconductor film can be crystallized at low temperatures, and mix-mounting with semiconductor elements such as MOS transistors can be realized. The semiconductor device in accordance with the present embodiment can be applied to 2T2C type ferroelectric memory devices without being limited to the above.

6. Piezoelectric Element

Next, an example in which a ferroelectric film formed by using the raw material solution in accordance with the present embodiment is applied to a piezoelectric element is described.

Figure 50:
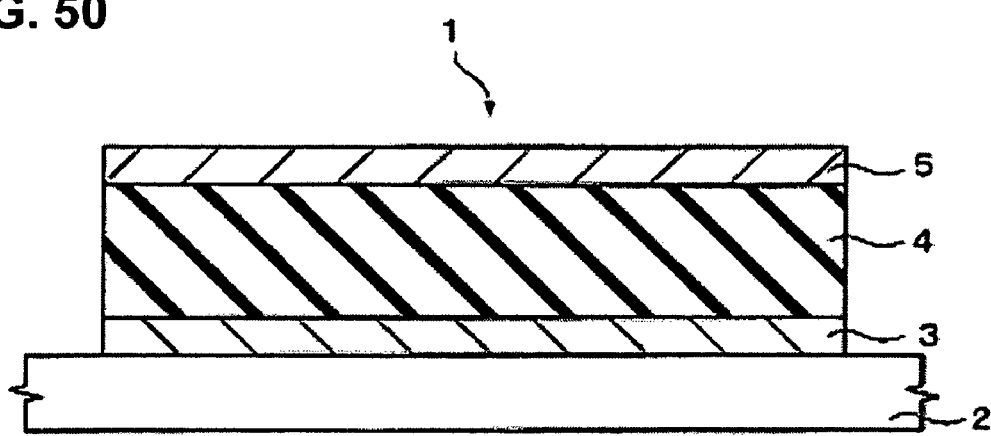
FIG. 50 is a cross-sectional view schematically showing a piezoelectric element in accordance with the present embodiment.

FIG. 50 is a cross-sectional view showing a piezoelectric element 1 that has a ferroelectric film formed by using the raw material solution of the present invention. The piezoelectric element 1 includes a substrate 2, a lower electrode 3 formed on the substrate 2, a piezoelectric film 4 formed on the lower electrode 3, and an upper electrode 5 formed on the piezoelectric film 4.

As the substrate 2, for example, a silicon substrate can be used. In the present embodiment, a single-crystal silicon substrate with a (110) orientation is used for the substrate 2. Also, as the substrate 2, a single-crystal silicon substrate with a (100) orientation, or a single-crystal silicon substrate with a (111) orientation can be used. Also, as the substrate 2, a substrate in which an amorphous silicon oxide film such as a thermal oxidation film or a natural oxidation film is formed on the surface of a silicon substrate can be used. By processing the substrate 2, it can have ink cavities 521 in an ink jet recording head 50 as described below (see FIG. 51).

The lower electrode 3 is one of electrodes for applying a voltage to the piezoelectric film 4. The lower electrode 3 can be formed, for example, in the same plane configuration as that of the piezoelectric film 4. It is noted that, when multiple piezoelectric elements 1 are formed on an ink jet recording head 50 to be described below (see FIG. 51), the lower electrode 3 can be formed to function as a common electrode for each of the piezoelectric elements 1. The lower electrode 3 may be formed to a film thickness, for example, of the about 100 nm-200 nm.

The piezoelectric film 4 is a layer formed by using the raw material solution in accordance with the present embodiment described above, and has a perovskite type structure.

The lower electrode 3 and the upper electrode 5 can be formed by, for example, a sputter method, a vacuum deposition method, or the like. The lower electrode 3 and the upper electrode 5 consist of, for example, Pt (platinum). It is noted that the material of the lower electrode 3 and the upper electrode 5 is not limited to Pt, but, for example, Ir (iridium), $IrO_x$ (iridium oxide), Ti (titanium), $SrRuO_3$ or the like can also be used.

Because the piezoelectric element of the present embodiment is formed by using the raw material solution in accordance with the present embodiment described above, the piezoelectric film can be crystallized at low temperatures, and mixed mounting with other semiconductor elements can be realized.

7. Inkjet Recording Head and Inkjet Printer

Next, an inkjet recording head in which the above-described piezoelectric element functions as a piezoelectric actuator, and an inkjet printer having the inkjet recording head are described. In the following description, the inkjet recording head is first described, and then the inkjet printer is described.

Figure 51:
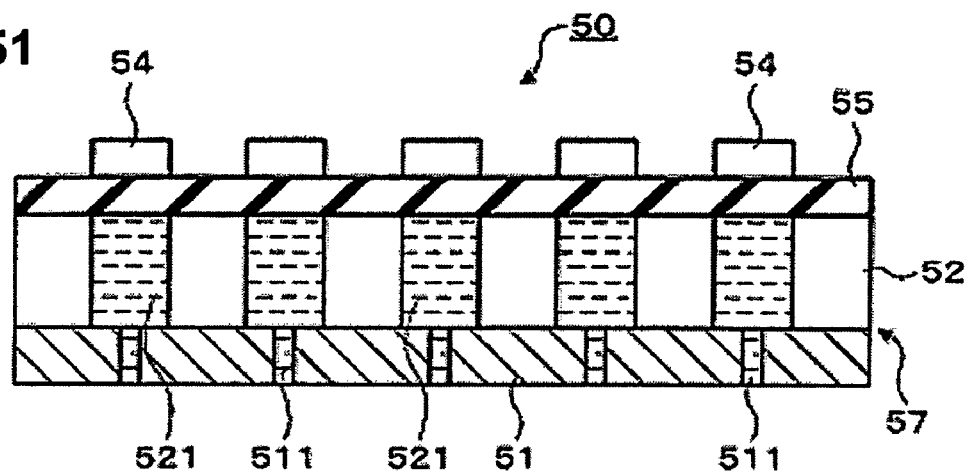
FIG. 51 is a schematic structural view of an ink jet recording head in accordance with the present embodiment.
Figure 52:
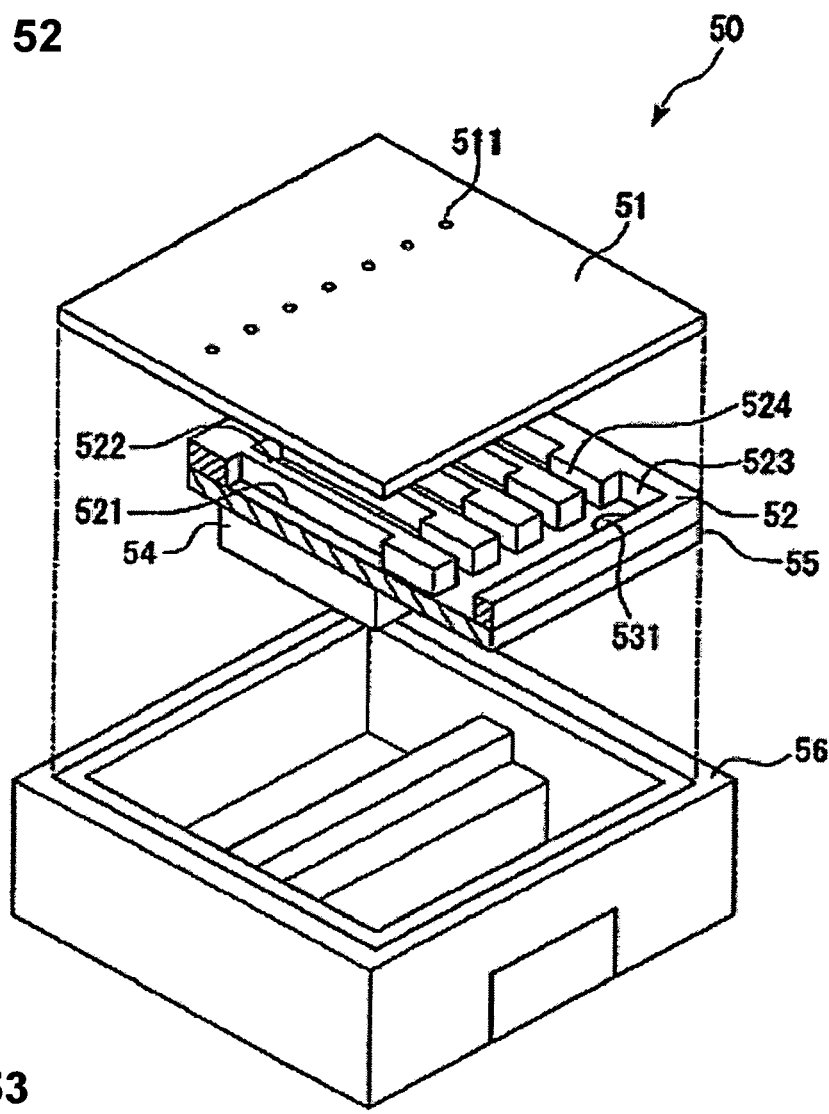
FIG. 52 is an exploded perspective view of the ink jet recording head in accordance with the present embodiment.
Figure 53:
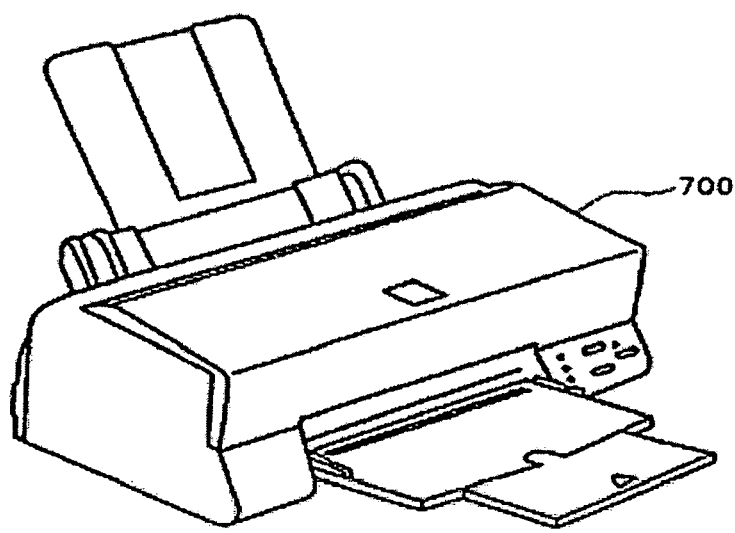
FIG. 53 is a schematic structural view of an ink jet printer in accordance with the present embodiment.

FIG. 51 is a side cross-sectional view schematically showing a structure of the inkjet recording head in accordance with the present embodiment, and FIG. 52 is an exploded perspective view of the inkjet recording head, which is shown upside down with respect to a state in which it is normally used. FIG. 53 shows an ink jet printer 700 that has the inkjet recording head in accordance with the present embodiment.

7.1 Ink Jet Recording Head

As shown in FIG. 51, the inkjet recording head 50 is equipped with a head main body (base body) 57 and piezoelectric sections 54 formed on the head main body 57. The piezoelectric section 54 is provided with a piezoelectric element 1 shown in FIG. 50, and the piezoelectric element 1 is composed of a lower electrode 3, a piezoelectric film (ferroelectric film) 4 and an upper electrode 5 successively stacked in layers. The piezoelectric film 4 is a film that is formed by using the raw material solution described in Section 1 above. The piezoelectric section 54 functions as a piezoelectric actuator in the inkjet recording head.

The inkjet recording head 50 includes a nozzle plate 51, an ink chamber substrate 52, an elastic film 55, and piezoelectric sections 54 that are bonded to the elastic film 55, which are housed in a housing 56. It is noted that the inkjet recording head 50 forms an on-demand type piezoelectric head.

The nozzle plate 51 is formed from, for example, a rolled plate of stainless steel or the like, and includes multiple nozzles 511 formed in a row for jetting ink droplets. The pitch of the nozzles 511 may be appropriately set according to the printing resolution.

The ink chamber substrate 52 is fixedly bonded (affixed) to the nozzle plate 51. The ink chamber substrate 52 has a plurality of cavities (ink cavities) 521, a reservoir 523 and supply ports 524, which are defined by the nozzle plate 51, side walls (partition walls) 522 and the elastic film 55. The reservoir 523 temporarily reserves ink that is supplied from an ink cartridge (not shown). The supply ports 524 supply the ink from the reservoir 523 to the respective cavities 521.

Each of the cavities 521 is disposed for each of the corresponding nozzles 511 as shown in FIG. 51 and FIG. 52. Each of the cavities 521 has a volume that is variable by vibrations of the elastic film 55. The cavities 521 are formed to eject ink by the volume change.

As a base material for obtaining the ink chamber substrate 52, a silicon single-crystal substrate with a (110) orientation is used. Because the silicon single-crystal substrate with a (110) orientation is suitable for anisotropic etching, the ink chamber substrate 52 can be readily and securely formed. It is noted that this silicon single-crystal substrate is used with its surface where the elastic film 55 is formed being a (110) surface.

The elastic film 55 is disposed on the ink chamber substrate 52 on the opposite side of the nozzle plate 51. Further, a plurality of piezoelectric sections 54 are provided on the elastic film 55 on the opposite side of the ink chamber substrate 52. A communication hole 531 that penetrates the elastic film 55 in its thickness direction is formed in the elastic film 55 at a predetermined position. Ink can be supplied from an ink cartridge to the reservoir 523 through the communication hole 531.

Each of the piezoelectric sections is electrically connected to a piezoelectric element driving circuit (not shown), and is structured to operate (vibrate, deform) based on signals of the piezoelectric element driving circuit. In other words, each of the piezoelectric sections 54 functions as a vibration source (head actuator). The elastic film 55 vibrates (deforms) by vibrations (deformation) of the piezoelectric section 54, and functions to instantaneously increase the inner pressure of the cavity 521.

Although an ink jet recording head that jets ink is described above as one example, the present embodiment is intended to be generally applied to all liquid jet heads and liquid jet devices that use piezoelectric elements. As the liquid jet head, for example, a recording head used for an image recording device such as a printer, a color material jet head used to manufacture color filters of liquid crystal displays, etc., an electrode raw material jet head used for forming electrodes of organic EL displays, FED (plane emission display), etc., a bio-organic material jet head used for manufacturing bio-chips, and the like can be enumerated.

Also, the piezoelectric element in accordance with the present embodiment can be applied, without being particularly limited to the application examples described above, to a variety of modes such as piezoelectric pumps, surface acoustic wave elements, thin film piezoelectric resonators, frequency filters, oscillators (for example, voltage control SAW oscillators) and the like.

Though preferred embodiments of the present invention are described above, the present invention is not limited to those described above, and can be implemented according to a variety of modified embodiments within the scope of the subject matter of the invention.

What is claimed is:

1. A method for manufacturing a precursor composition including a precursor for forming a ferroelectric, wherein the ferroelectric is expressed by a general formula of $AB_{1-x}C_xO_3$, where an element A is composed of at least Pb, an element B is composed of at least one of Zr, Ti, V, W and Hf, and an element C is composed of at least one of Nb and Ta, the method comprising:

mixing a sol-gel raw material including at least the element B and the element C, which is a sol-gel raw material including a hydrolysis-condensation product of a metal alkoxide, polycarboxylic acid or polycarboxylic acid ester, and an organic solvent; and forming the precursor having an ester-bond through esterification of the polycarboxylic acid or polycarboxylic acid derived from the polycarboxylic acid ester and the metal alkoxide.

2. A method for manufacturing a precursor composition according to claim 1, wherein
the element B is Zr and Ti, and
the element C is Nb.

3. A method for manufacturing a precursor composition according to claim 1, wherein the organic solvent is alcohol.

4. A method for manufacturing a precursor composition according to claim 1, wherein the polycarboxylic acid or the polycarboxylic acid ester is carboxylic acid or carboxylic acid ester with a valence of 2.

5. A method for manufacturing a precursor composition according to claim 4, wherein the carboxylic acid ester with a valence of 2 is at least one kind selected from ester succinate, ester maleate, and ester malonate.

6. A method for manufacturing a precursor composition according to claim 1, wherein the molecular weight of the polycarboxylic acid ester is 150 or less.

7. A method for manufacturing a precursor composition according to claim 1, wherein the polycarboxylic acid ester is a liquid in room temperature.

8. A method for manufacturing a precursor composition according to claim 1, wherein a sol-gel raw material using metal carboxylate is further included when mixing the sol-gel raw material, the polycarboxylic acid or the polycarboxylic acid ester and the organic solvent.

9. A method for manufacturing a precursor composition according to claim 8, wherein the metal carboxylate is carboxylate of lead.

10. A method for manufacturing a precursor composition according to claim 1, wherein an organic metal compound is further included when mixing the sol-gel raw material, the polycarboxylic acid or the polycarboxylic acid ester and the organic solvent.

11. A method for manufacturing a precursor composition according to claim 1, wherein a sol-gel raw material including Si or Si and Ge is further included when mixing the sol-gel raw material, the polycarboxylic acid or the polycarboxylic acid ester and the organic solvent.

12. A method for manufacturing a precursor composition according to claim 1, wherein a mixture of at least a sol-gel solution for $PbZrO_3$, a sol-gel solution for $PbTiO_3$ and a sol-gel solution for $PbNbO_3$ is used as the sol-gel solution.

13. A method for manufacturing a precursor composition according to claim 12, wherein the sol-gel solution that is further mixed with a sol-gel solution for $PbSiO_3$ is used.

14. A method for manufacturing a precursor composition according to claim 1, wherein a mixture of at least a sol-gel solution for $PbZrO_3$, a sol-gel solution for $PbTiO_3$ and a sol-gel solution for $PbTaO_3$ is used as the sol-gel solution.

* * * * *